(12) United States Patent
Tamaki et al.

(10) Patent No.: US 12,349,495 B2
(45) Date of Patent: Jul. 1, 2025

(54) SEMICONDUCTOR DEVICE AND METHOD FOR MANUFACTURING SEMICONDUCTOR DEVICE

(71) Applicant: CANON KABUSHIKI KAISHA, Tokyo (JP)

(72) Inventors: Junya Tamaki, Tokyo (JP); Takafumi Miki, Kanagawa (JP); Ryo Yoshida, Tokyo (JP); Atsushi Kanome, Kanagawa (JP); Kosuke Asano, Kanagawa (JP); Takehiro Toyoda, Tokyo (JP); Masaki Kurihara, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 316 days.

(21) Appl. No.: 17/176,959

(22) Filed: Feb. 16, 2021

(65) Prior Publication Data
US 2021/0265411 A1    Aug. 26, 2021

(30) Foreign Application Priority Data

Feb. 21, 2020   (JP) ................................ 2020-028143
Mar. 30, 2020  (JP) ................................ 2020-060985
Dec. 23, 2020  (JP) ................................ 2020-214010

(51) Int. Cl.
  *H01L 27/146* (2006.01)
  *H10F 39/00* (2025.01)
(52) U.S. Cl.
  CPC .......... *H10F 39/811* (2025.01); *H10F 39/011* (2025.01)

(58) Field of Classification Search
  CPC ................................................ H01L 27/14636
  See application file for complete search history.

(56) References Cited

U.S. PATENT DOCUMENTS

| | | | | |
|---|---|---|---|---|
| 8,852,830 B2* | 10/2014 | Hirayama | ................. | G03F 7/20 |
| | | | | 430/394 |
| 9,571,767 B2* | 2/2017 | Tsunai | ................... | H04N 25/71 |
| 2001/0054764 A1* | 12/2001 | Nitta | .................... | H01L 23/5329 |
| | | | | 257/E21.309 |
| 2003/0020176 A1* | 1/2003 | Nambu | ............. | H01L 21/76801 |
| | | | | 257/774 |
| 2003/0116852 A1* | 6/2003 | Watanabe | ......... | H01L 21/76813 |
| | | | | 257/E23.152 |

(Continued)

FOREIGN PATENT DOCUMENTS

| | | |
|---|---|---|
| CN | 1335617 A | 2/2002 |
| CN | 101895696 A | 11/2010 |

(Continued)

*Primary Examiner* — Mounir S Amer
*Assistant Examiner* — Alexander Belousov
(74) *Attorney, Agent, or Firm* — Canon U.S.A., Inc. I.P. Division

(57) ABSTRACT

A semiconductor device includes a plurality of wirings each having a damascene structure on a semiconductor layer, wherein the plurality of wirings includes a first wiring and a second wiring adjacent to each other, wherein the first wiring includes, along a direction in which the first wiring extends, a first portion, a second portion, and a third portion located between the first portion and the second portion, and wherein a width of the third portion is larger than each of a width of the first portion and a width of the second portion.

26 Claims, 31 Drawing Sheets

(56) References Cited

U.S. PATENT DOCUMENTS

| | | | |
|---|---|---|---|
| 2007/0164443 A1 | 7/2007 | Florian | |
| 2013/0224637 A1* | 8/2013 | Hirayama | ................. G03F 7/20 |
| | | | 430/5 |
| 2018/0308747 A1* | 10/2018 | Kakinuma | ........ H01L 21/76816 |

FOREIGN PATENT DOCUMENTS

| | | |
|---|---|---|
| CN | 102136447 A | 7/2011 |
| JP | 2008225224 A | 9/2008 |
| JP | 2010098095 A | 4/2010 |
| JP | 2013174728 A | 9/2013 |
| JP | 2014229749 A | 12/2014 |
| JP | 2018180416 A | 11/2018 |
| TW | 200304667 A | 10/2003 |

* cited by examiner

FIG.3A1
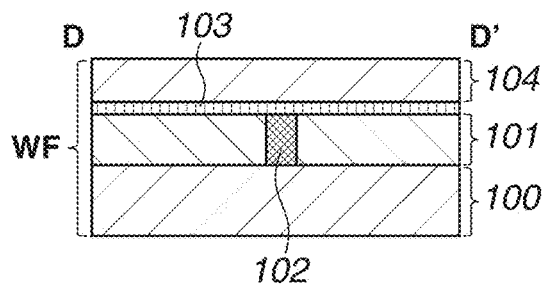
FIG.3A2
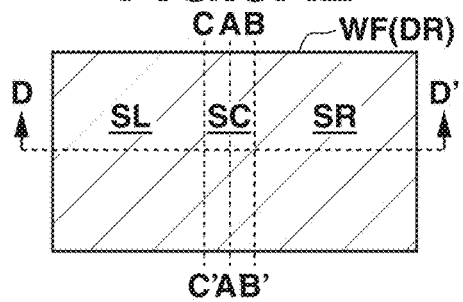
FIG.3B1
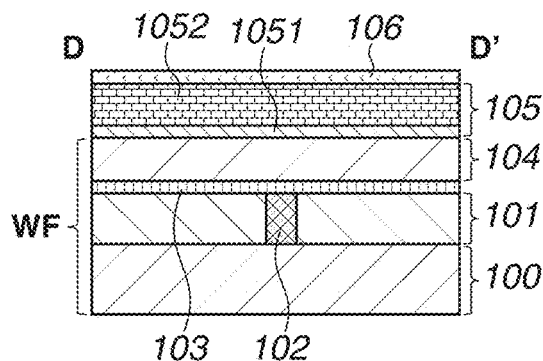
FIG.3B2
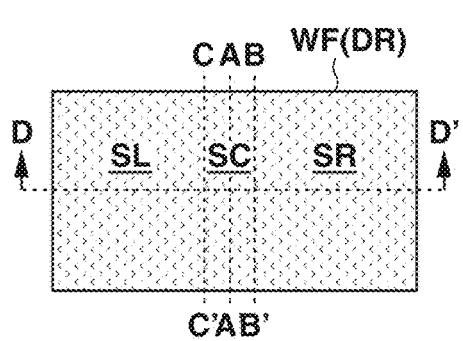
FIG.3C1
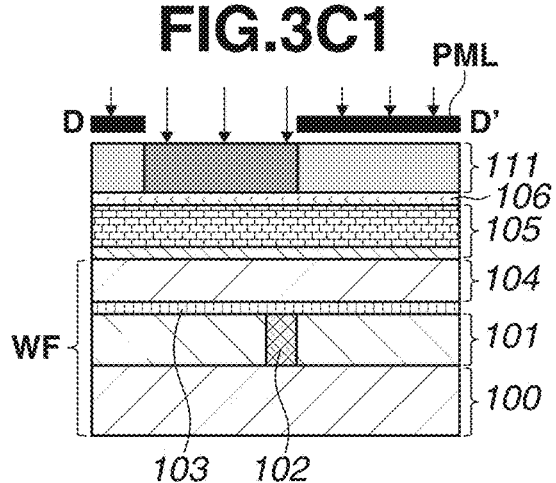
FIG.3C2
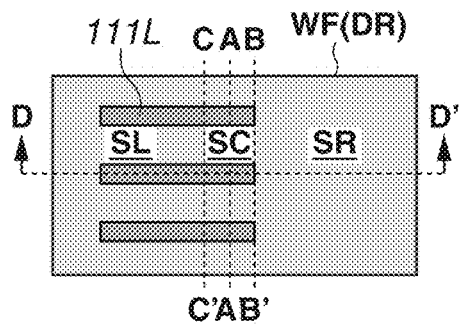
FIG.3D1
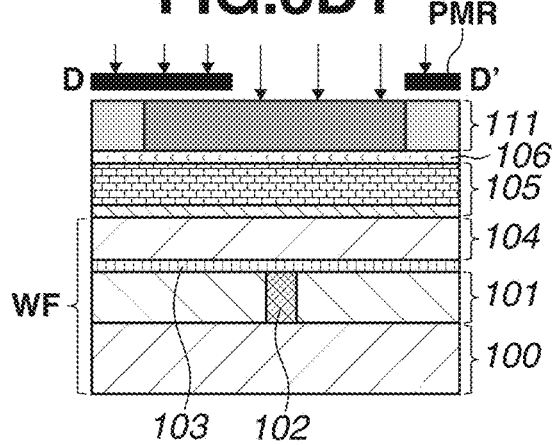
FIG.3D2
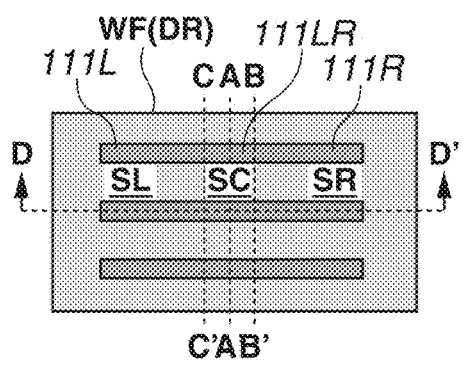

FIG.4A1
FIG.4A2
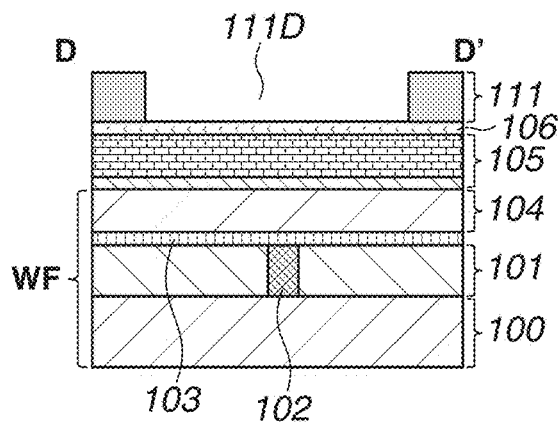
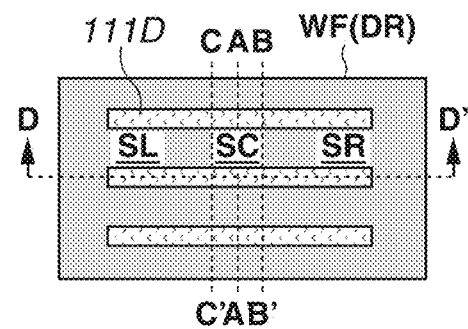
FIG.4B1
FIG.4B2
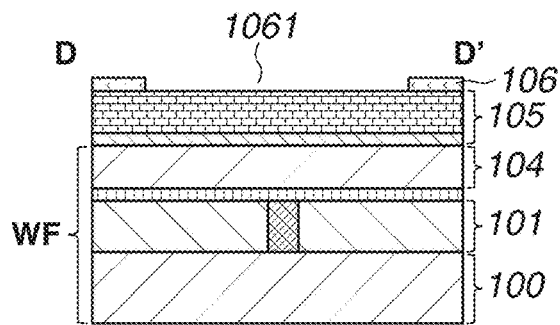
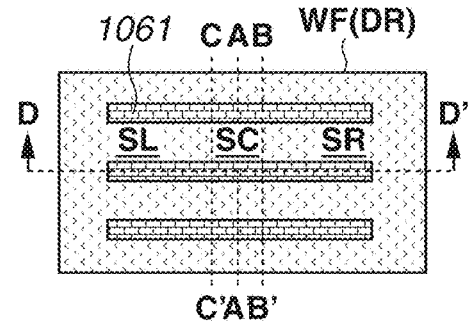
FIG.4C1
FIG.4C2
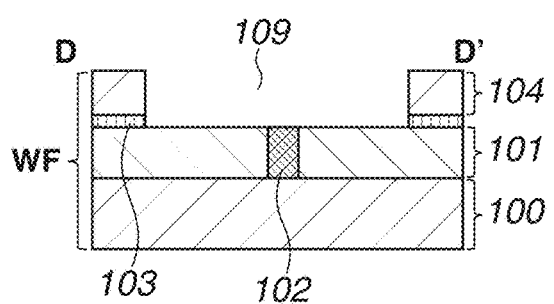
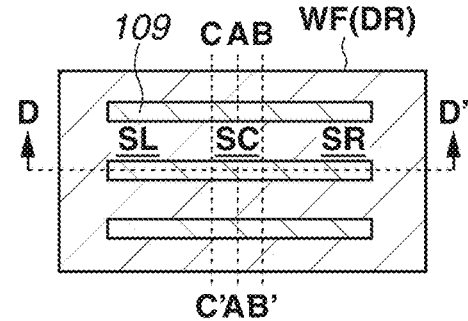
FIG.4D1
FIG.4D2
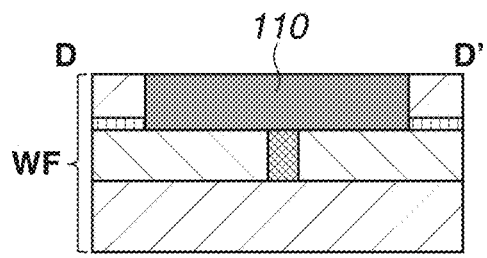
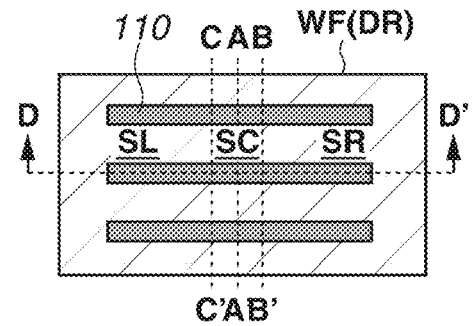

FIG.15A1
FIG.15A2
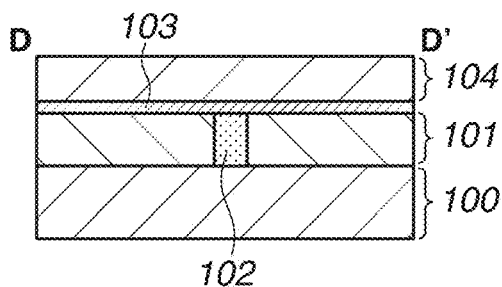
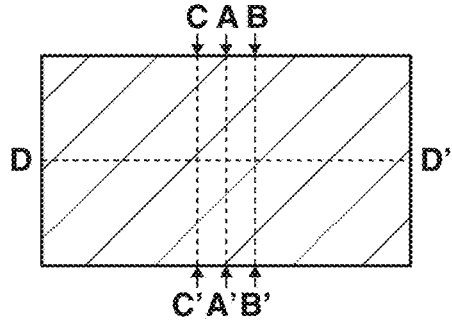
FIG.15B1
FIG.15B2
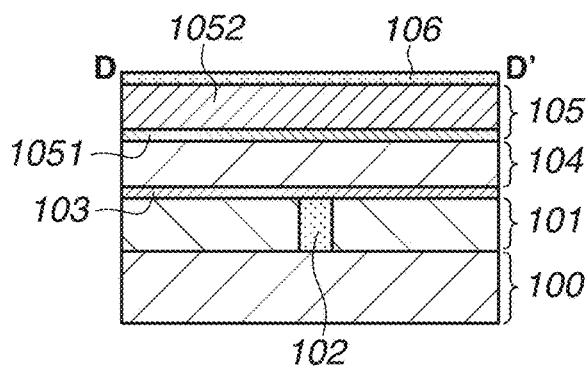
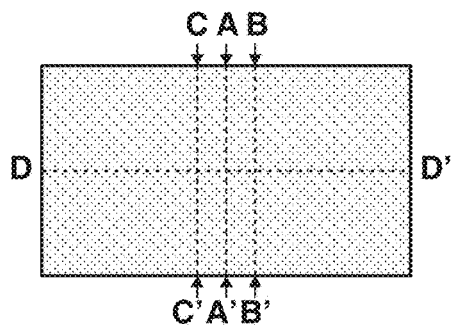
FIG.15C1
FIG.15C2
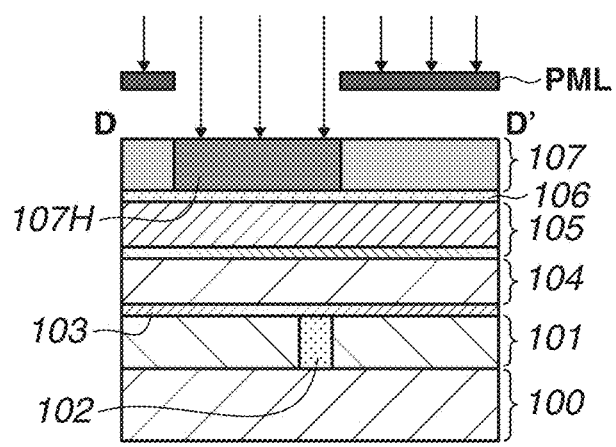
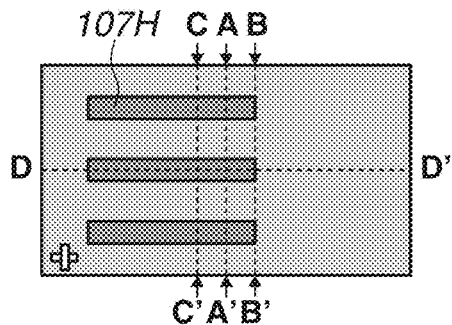
FIG.15D1
FIG.15D2
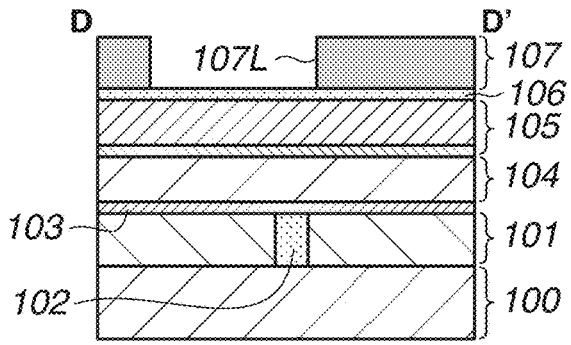
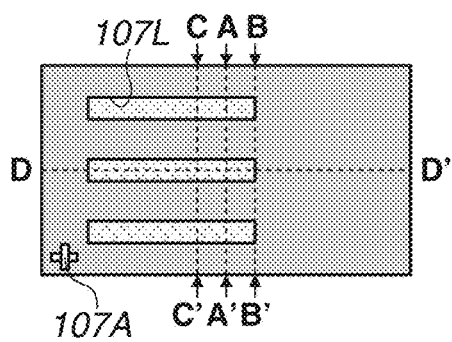

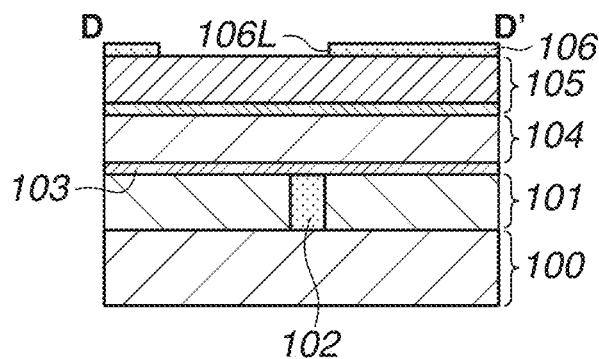
FIG.16A1
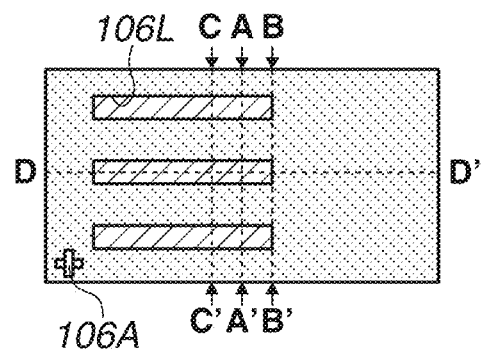
FIG.16A2
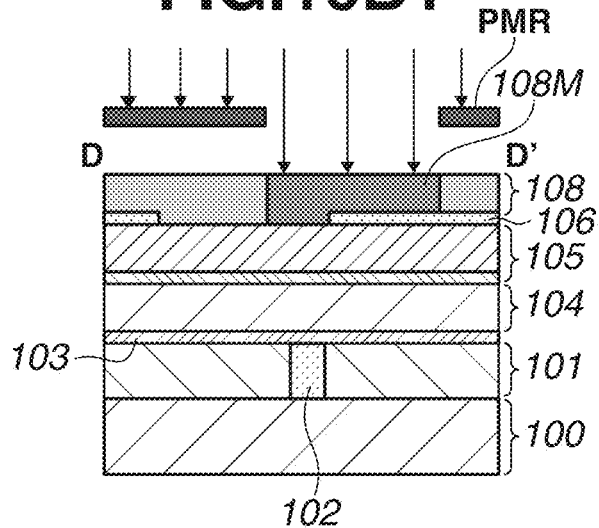
FIG.16B1
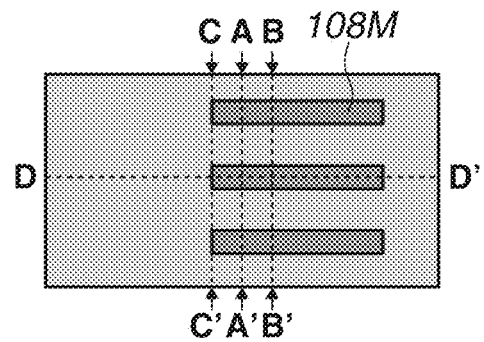
FIG.16B2
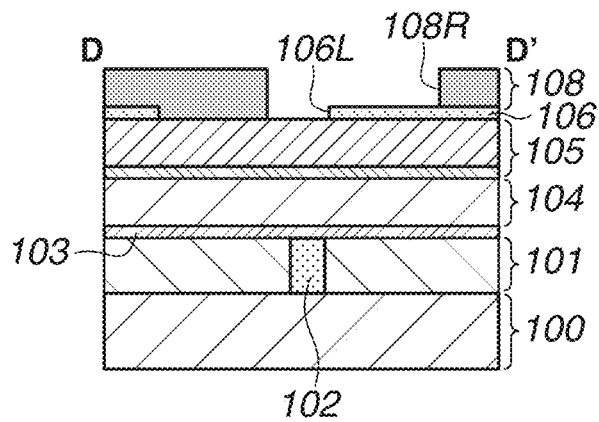
FIG.16C1
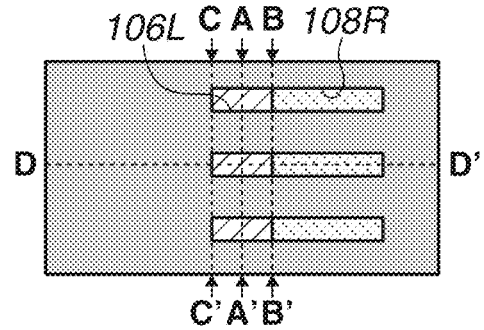
FIG.16C2

FIG.17A1
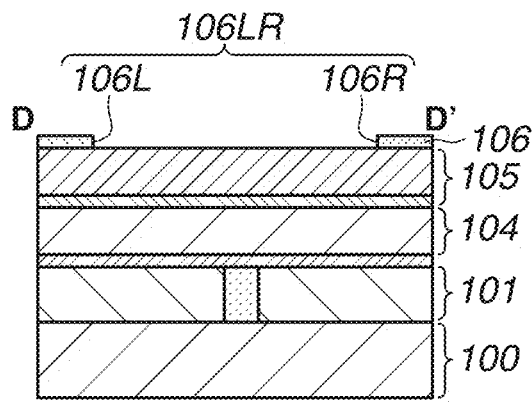
FIG.17A2
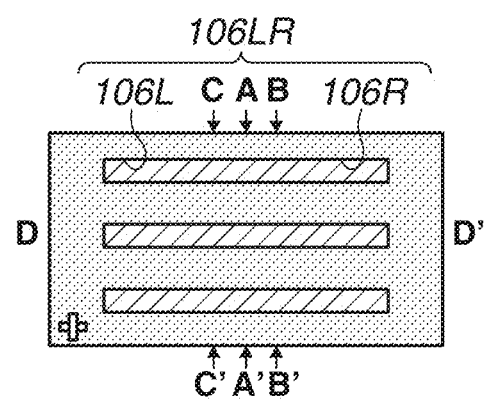
FIG.17B1
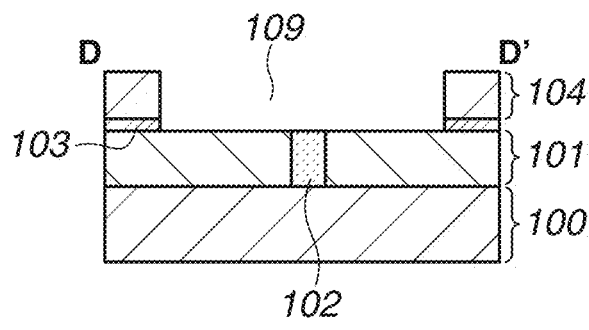
FIG.17B2
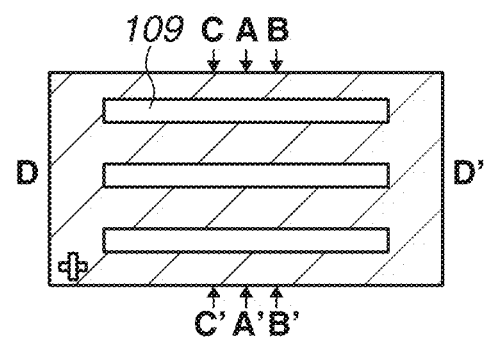
FIG.17C1
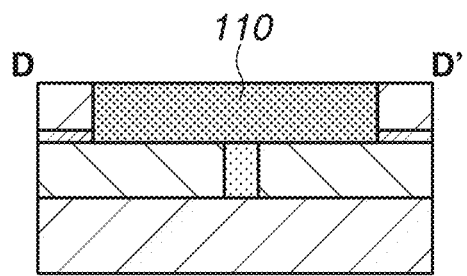
FIG.17C2
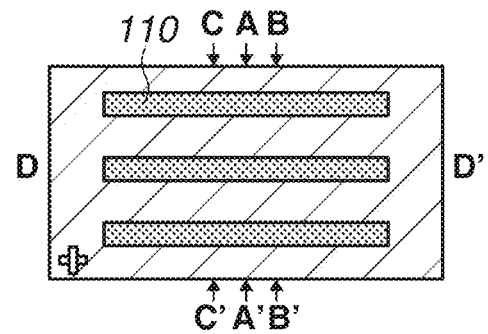

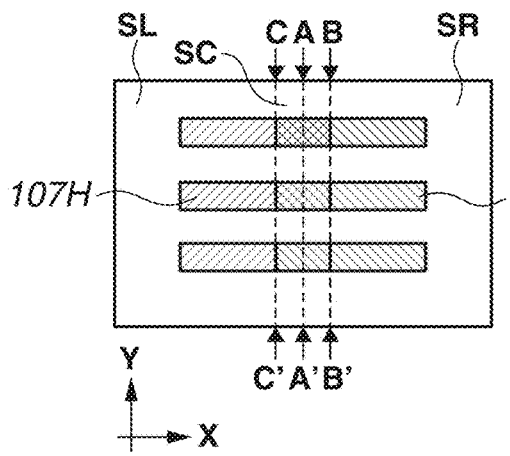
FIG.18A1
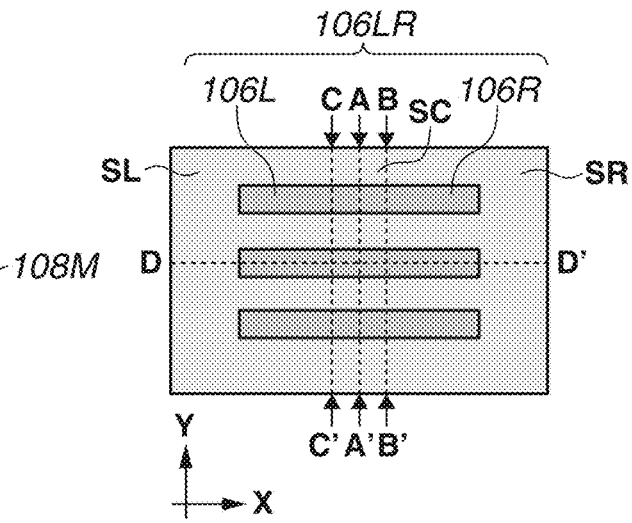
FIG.18A2
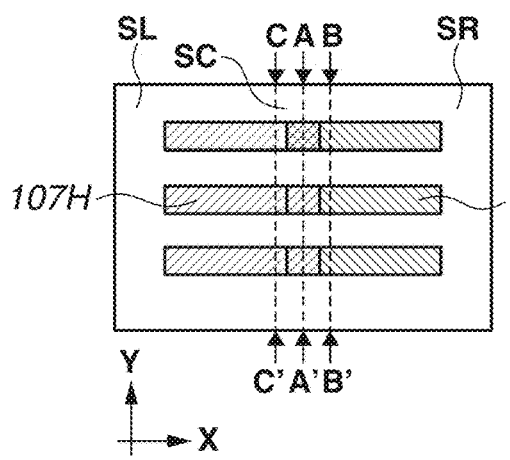
FIG.18B1
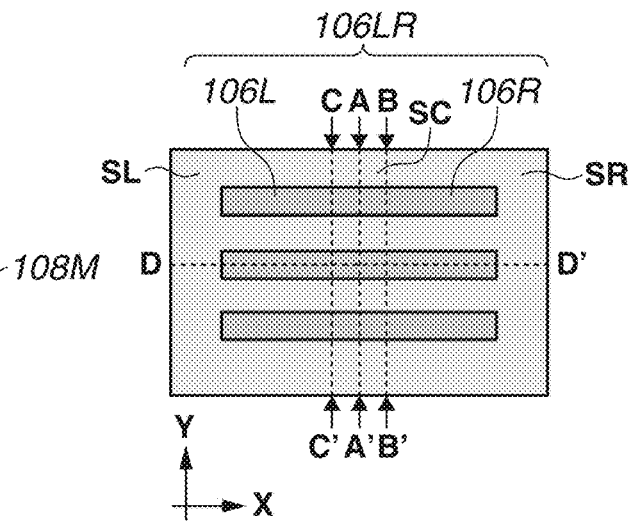
FIG.18B2
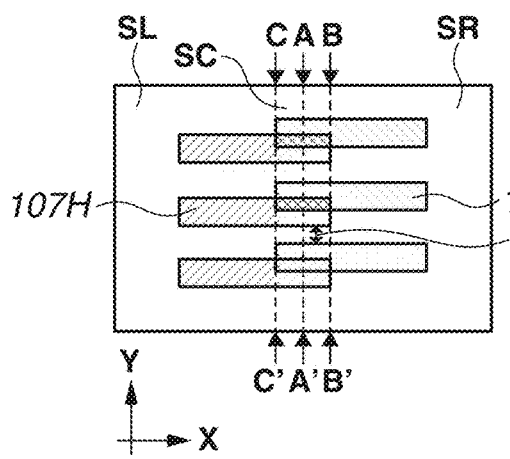
FIG.18C1
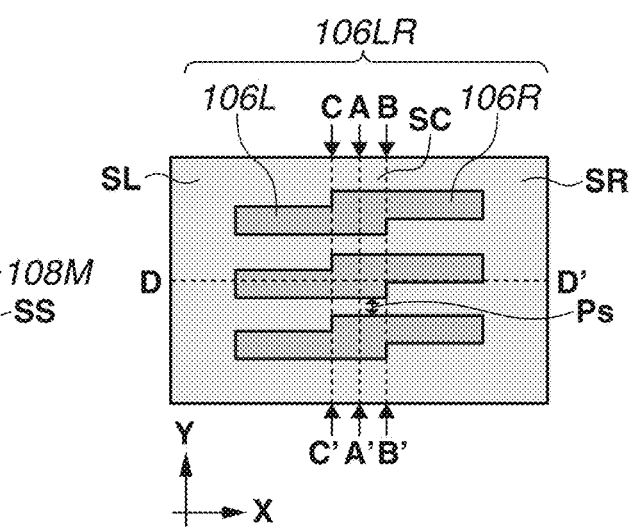
FIG.18C2

SEMICONDUCTOR DEVICE AND METHOD FOR MANUFACTURING SEMICONDUCTOR DEVICE

BACKGROUND OF THE INVENTION

Field of the Invention

Aspects of the present invention generally relate to a semiconductor device.

Description of the Related Art

In semiconductor devices, damascene wiring is used for the purpose of miniaturizing wiring. Japanese Patent Application Laid-Open No. 2014-229749 discusses a method of forming damascene wiring with use of connective exposure.

SUMMARY OF THE INVENTION

According to an aspect of the present invention, a semiconductor device includes a plurality of wirings each having a damascene structure on a semiconductor layer, wherein the plurality of wirings includes a first wiring and a second wiring adjacent to each other, wherein a distance between a first end and a second end of the first wiring is larger than 33 mm, wherein the first wiring includes, along a direction in which the first wiring extends, a first portion, a second portion, and a third portion located between the first portion and the second portion, wherein each of a width of the first portion and a width of the second portion is smaller than 180 nm, and wherein a width of the third portion is larger than each of the width of the first portion and the width of the second portion.

According to another aspect of the present invention, a semiconductor device includes a plurality of wirings each having a damascene structure on a semiconductor layer, wherein the plurality of wirings includes a first wiring and a second wiring adjacent to each other, wherein the first wiring includes, along a direction in which the first wiring extends, a first portion, a second portion, and a third portion located between the first portion and the second portion, wherein a distance between the first portion and the second portion of the first wiring is larger than 33 mm, and wherein a width of the third portion is a maximum width of the first wiring in a range from the first portion to the second portion and is smaller than 180 nm.

According to yet another aspect of the present invention, a method for manufacturing a semiconductor device includes preparing a wafer including a semiconductor layer and an insulator film provided on the semiconductor layer, exposing a photoresist film of positive type provided on the insulator film, developing the photoresist film to form a resist pattern from the photoresist film, processing the insulator film with use of the resist pattern to form a trench on the insulator film, and forming a wiring in the trench, wherein the wafer includes a first region, a second region, and a third region located between the first region and the second region, and the trench extends from the first region to the second region via the third region, wherein the exposing includes a first exposure shot for exposing the photoresist film on the first region and the third region and a second exposure shot for exposing the photoresist film on the second region and the third region after the first exposure shot, wherein the wiring includes, along a direction in which the wiring extends, a first portion located on the first region, a second portion located on the second region, and a third portion located on the third region, and wherein a width of the third portion is larger than each of a width of the first portion and a width of the second portion.

According to yet another aspect of the present invention, a semiconductor device includes a plurality of unit pixels that is arranged in a plurality of rows and a plurality of columns and each of which includes a photoelectric conversion portion and a plurality of output lines that is connected to the unit pixels in one column and transfers outputs of the unit pixels, wherein the plurality of output lines includes at least a first output line, a second output line having a portion adjacent to the first output line, and a third output line having a portion adjacent to the second output line, wherein each of the first output line, the second output line, and the third output line includes a portion which extends along a first direction, wherein the first output line, the second output line, and the third output line pass through a first position and a second position different from the first position, and wherein each of at least two of a distance between the first output line and the second output line, a distance between the second output line and the third output line, and a distance between the first output line and the third output line is longer in the second position than in the first position.

According to yet another aspect of the present invention, a method for manufacturing a semiconductor device includes preparing a wafer including a semiconductor layer and an insulator film provided on the semiconductor layer, exposing a photoresist film of positive type provided on the insulator film, developing the photoresist film to form a resist pattern from the photoresist film, processing the insulator film with use of the resist pattern to form a trench on the insulator film, and forming a wiring in the trench, wherein the wafer includes a first region, a second region, and a third region located between the first region and the second region, and the trench extends from the first region to the second region via the third region, wherein the exposing includes a first exposure shot for exposing the photoresist film on the first region and the third region and a second exposure shot for exposing the photoresist film on the second region and the third region after the first exposure shot, wherein the photoresist film obtained between the first exposure shot and the second exposure shot of the exposing includes a first exposed portion located on the first region and exposed with the first exposure shot, a second exposed portion located on the third region and exposed with the first exposure shot, and a third exposed portion located between the first exposed portion and the second exposed portion and exposed with the first exposure shot, wherein the photoresist film obtained after the second exposure shot of the exposing includes a fourth exposed portion located on the second region and exposed with the second exposure shot, a fifth exposed portion located on the third region and exposed with the second exposure shot, and a sixth exposed portion located between the fourth exposed portion and the fifth exposed portion and exposed with the second exposure shot, wherein at least a part of the fifth exposed portion includes the second exposed portion, wherein, in the developing, the first exposed portion, the second exposed portion, the third exposed portion, the fourth exposed portion, the fifth exposed portion, and the sixth exposed portion are removed, and wherein a width of the second exposed portion is smaller than a width of the third exposed portion.

Further features of the present invention will become apparent from the following description of exemplary embodiments with reference to the attached drawings.

BRIEF DESCRIPTION OF THE DRAWINGS

FIGS. 3A1, 3A2, 3B1, 3B2, 3C1, 3C2, 3D1, and 3D2 are schematic diagrams illustrating a method for manufacturing the semiconductor device.

FIGS. 4A1, 4A2, 4B1, 4B2, 4C1, 4C2, 4D1, and 4D2 are schematic diagrams illustrating the method for manufacturing the semiconductor device.

FIGS. 15A1, 15A2, 15B1, 15B2, 15C1, 15C2, 15D1, and 15D2 are schematic diagrams illustrating a method for manufacturing the semiconductor device.

FIGS. 16A1, 16A2, 16B1, 16B2, 16C1, and 16C2 are schematic diagrams illustrating the method for manufacturing the semiconductor device.

FIGS. 17A1, 17A2, 17B1, 17B2, 17C1, and 17C2 are schematic diagrams illustrating the method for manufacturing the semiconductor device.

FIGS. 18A1, 18A2, 18B1, 18B2, 18C1, and 18C2 are schematic diagrams illustrating the method for manufacturing the semiconductor device.

DESCRIPTION OF THE EMBODIMENTS

Figure 1A:
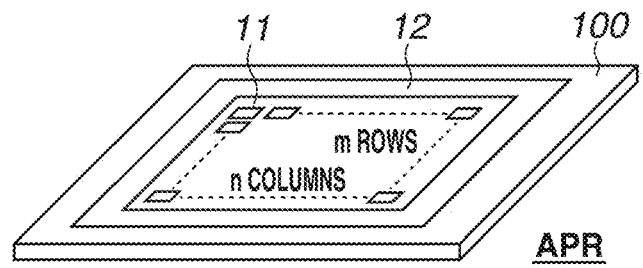
FIGS. 1A, 1B, and 1C are schematic diagrams illustrating a semiconductor device.

Various exemplary embodiments, features, and aspects of the invention will be described in detail below with reference to the drawings. Furthermore, in the following description and drawings, constituent elements which are in common with each other in a plurality of drawings are assigned the respective same reference characters. Thus, constituent elements which are in common with each other are described by mutually referring to a plurality of drawings, and the description of constituent elements with the respective same reference characters assigned thereto is not repeated as appropriate.

FIG. 1A illustrates a photoelectric conversion device as an example of a semiconductor device APR. The photoelectric conversion device is, for example, a complementary metal-oxide semiconductor (CMOS) image sensor, and can be used for, for example, an imaging apparatus, a distance measuring apparatus, or a light metering apparatus. The semiconductor device APR serving as a photoelectric conversion device is a semiconductor device in which a plurality of wirings 110 (FIG. 1C) each having a damascene structure is provided on a semiconductor layer 100. The semiconductor device APR includes a pixel portion 11, in which unit pixels each including a photoelectric conversion element are two-dimensionally arranged in m rows and n columns, and a signal processing circuit 12, which is formed around the pixel portion 11. The semiconductor device APR has a dimension greater than or equal to the maximum exposure region of an exposure apparatus (exposure machine), and cannot be manufactured by such an exposure apparatus using one-shot exposure. Thus, the semiconductor device APR is manufactured by a divisional exposure technique in which a device region is divided into a left side region and a right side region adjacent to each other and exposure is performed on the left side region and the right side region on an individual basis. For example, a wiring layer can be formed by divisional exposure. In the following description, a direction advancing toward a central portion of the semiconductor device APR on a plane thereof is referred to as an inner circumference side, and a direction opposite to the inner circumference side is referred to as an outer circumference side.

The semiconductor device APR is not limited to an obverse surface irradiation type photoelectric conversion device, and can be a reverse surface irradiation type photoelectric conversion device. Either type of photoelectric conversion device can implement an improvement in performance by miniaturization of wiring. However, the obverse surface irradiation type photoelectric conversion device can attain an improvement in sensitivity by miniaturization of wiring, and is, therefore, particularly favorable. Moreover, the semiconductor device APR can be a semiconductor device including a first semiconductor layer, which includes a photoelectric conversion portion, and a second semiconductor layer, which is stacked on the first semiconductor layer. The second semiconductor layer can be provided with a control circuit, which is used to control a pixel circuit including a photoelectric conversion portion, and a processing circuit, which is used to process a signal output from the pixel circuit. Moreover, the semiconductor device APR is not limited to a photoelectric conversion device, and can be a display device using organic electroluminescence (EL) elements or liquid crystal elements or can be a liquid ejection device, such as a piezoelectric type or thermal type inkjet head. The semiconductor device APR can be a storage device including a memory cell array in which a plurality of memory cells is arranged, or can be an arithmetic device, such as a central processing unit (CPU) or a graphics processing unit (GPU).

Figure 1B:
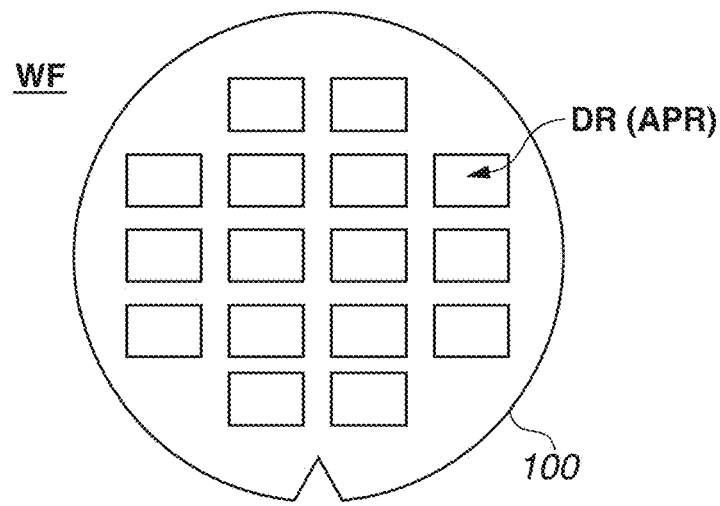

FIG. 1B is a plan view illustrating a plurality of device regions DR formed on a wafer WF. The dimension of each device region DR is larger than the maximum exposure region of an exposure apparatus. Each device region DR is divided into regions each having a dimension smaller than or equal to the maximum exposure region of the exposure apparatus and is formed by divisional exposure in which exposure is performed on the respective regions on an individual basis.

Figure 1C:
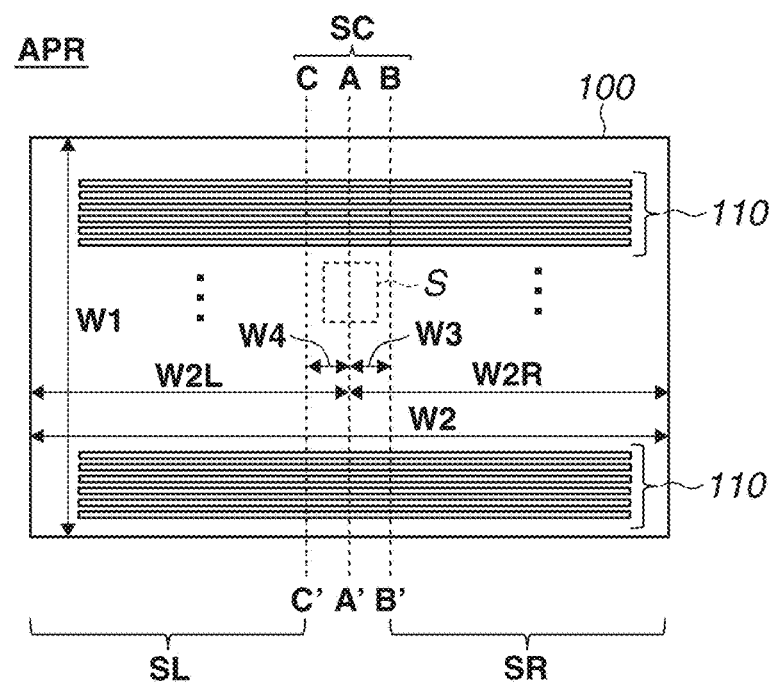

FIG. 1C is a conceptual diagram illustrating one device region DR. The device region DR is divided into at least a left side region SL and a right side region SR with respect to a line A-A' serving as a baseline, and the left side region SL and the right side region SR are exposed with use of the respective different photomasks. Hereinafter, the line A-A' is sometimes referred to as a "division center line". The left side region SL is defined by a region extending from the left end to a line C-C', and the right side region SR is defined by a region extending from the right end to a line B-B'. Hereinafter, the line C-C' is sometimes referred to as the "right end of the left side region", and the line B-B' is sometimes referred to as the "left end of the right side region". An intermediate region SC, which lies between the line B-B' and the line C-C', can be exposed at the time of exposing the left side region SL and can also be exposed at the time of exposing the right side region SR. In this way, since exposure is duplicated on the intermediate region SC, the intermediate region SC can also be referred to as a "duplication region". Furthermore, while, in the description of the present exemplary embodiment, the device region DR is divided into two regions, the division number can be three or more. Moreover, while, in the following example, the device region DR is divided into left and right side regions, the direction of division is optional and thus can be divided into upper and lower side regions.

The semiconductor device APR illustrated in FIG. 1A is formed in a state in which a plurality of device regions DR is two-dimensionally arranged on the wafer WF as illustrated in FIG. 1B, is subjected to an additional manufacturing process, and is then divided into individual semiconductor device portions (chips) by dicing (die cutting). The semiconductor device APR includes at least the thus-formed semiconductor device portion (chip). As described below, the semiconductor device APR can include, in addition to a semiconductor device portion, a package in which the semiconductor device portion is contained.

FIG. 1C illustrates dimensions of the device region DR of the semiconductor device APR, which is manufactured by a manufacturing method in the present exemplary embodiment. The length W1 in vertical direction of the semiconductor device APR is 33 millimeters (mm) or smaller, and the length W2 in horizontal direction thereof is larger than 33 mm. For example, the length W1 in vertical direction of the device region DR is 32 mm, and the length W2 in horizontal direction thereof is 42 mm. Accordingly, an exposure apparatus the maximum exposure region of which is 26 mm×33 mm cannot perform one-shot exposure on the device region DR.

A distance W2L between the reference line A-A', with respect to which to divide the device region DR into the left side region SL and the right side region SR, and the left side end portion of the device region DR is thus set to 26 mm or smaller, for example, to 21 mm. Moreover, a distance W2R between the reference line A-A' and the right side end portion of the device region DR is set to 26 mm or smaller, for example, to 21 mm. Moreover, a distance W3 between the line A-A' and the line B-B' is set to 10 nanometers (nm) to 1,000 nm, favorably, to 50 nm to 500 nm, for example, to 100 nm. Moreover, a distance W4 between the line A-A' and the line C-C' is set to 10 nm to 1,000 nm, favorably, to 50 nm to 500 nm, for example, to 100 nm.

Since the length W1 is 33 mm or smaller and the sum of the distance W2L and the distance W3 is 26 mm or smaller, the left side region SL and the intermediate region SC can be exposed by an exposure apparatus the maximum exposure region of which is 26 mm×33 mm.

Moreover, since the length W1 is 33 mm or smaller and the sum of the distance W2R and the distance W4 is 26 mm or smaller, the right side region SR and the intermediate region SC can be exposed by an exposure apparatus the maximum exposure region of which is 26 mm×33 mm.

Accordingly, a semiconductor device APR the length W1 of which is 33 mm or smaller and the length W2 of which is larger than 33 mm can be exposed with use of an exposure apparatus the maximum exposure region of which is 26 mm×33 mm and with the division number of the device region DR set to "2".

Furthermore, in this example, the distance W2L and the distance W2R are set equal to each other, but do not need to be equal to each other. Moreover, each of the line A-A', the line B-B', and the line C-C' is set to be a straight line, but can be set to be a meandering line as appropriate within a range in which the sum of the distance W2L and the distance W3 does not exceed the maximum exposure region depending on a pattern in the device region.

Furthermore, since, in an exposure apparatus the maximum exposure region of which is 26 mm×33 mm, the marginal portion of the maximum exposure region may be in some cases lower in resolution than the central portion thereof, there may be a case where even an exposure apparatus the maximum exposure region of which is 26 mm×33 mm performs exposure using substantially only a part of the maximum exposure region. In such a case, divisional exposure can be applied to even a semiconductor device APR having a size smaller than 26 mm×33 mm. In other words, the size of a semiconductor device APR to which divisional exposure in the present exemplary embodiment is applied is not particularly limited.

The dimension of the pixel portion 11 illustrated in FIG. 1A is 36 mm±1 mm×24 mm±1 mm in the case of an image sensor of what is called the 35 mm full-size standard. In FIG. 1C, row wirings of the pixel portion 11 out of a plurality of wirings 110 in the semiconductor device APR are illustrated. The row wiring is a global wiring connected in common to a pixel group included in one pixel row. The row wiring is, for example, a signal line via which to transfer input signals (control signals) to a pixel group included in one pixel row. Moreover, the row wiring is, for example, a power line via which to supply electric power (power source potential or grounding potential) to a pixel group included in one pixel row. Furthermore, the column wiring is a global wiring intersecting with the row wiring and connected in common to a pixel group included in one pixel column. The row wiring and the column wiring need to extend at least from one end of the pixel portion 11 to the other end thereof. Thus, a distance from one end of the row wiring to the other end thereof can need to be a length greater than or equal to the horizontal width (36 mm±1 mm) of the pixel portion 11, and a distance from one end of the column wiring to the other end thereof can need to be a length greater than or equal to the vertical width (24 mm±1 mm) of the pixel portion 11. The column wiring is, for example, a signal line via which to transfer output signals (pixel signals) from a pixel group included in one pixel column. Moreover, the column wiring is, for example, a power line via which to supply electric power (power source potential or grounding potential) to a pixel group included in one pixel column. These row wirings and column wirings can be allocated to any one of a first wiring layer, a second wiring layer, a third wiring layer, and a fourth wiring layer, which are arranged in the order of nearer to the semiconductor layer 100. The first wiring layer can have a single damascene structure, and the second wiring layer, the third wiring layer, and the fourth wiring layer can have a dual damascene structure. Power lines serving as global wirings (column wirings) can be arranged in, for example, the first wiring layer and/or the second wiring layer. Signal lines serving as global wirings (row wirings) can be arranged in, for example, one of the third wiring layer and the fourth wiring layer (typically, the third wiring layer). Signal lines serving as global wirings (column wirings) can be arranged in, for example, the other of the third wiring layer and the fourth wiring layer (typically, the fourth wiring layer). In addition, local wirings are arranged in each wiring layer, and, particularly, many local wirings can be arranged in the first wiring layer. While, here, an example in which there are four wiring layers has been described, the second wiring layer, for example, can be omitted and local wirings and power lines can be arranged in the first wiring layer. While allocation of global lines to wiring layers is not limited to the above-mentioned ones, in consideration of these relationships, a wiring having a length exceeding 33 mm can be a power line (row wiring) having a single damascene structure or a signal line (row wiring) having a dual damascene structure.

Figure 2A:
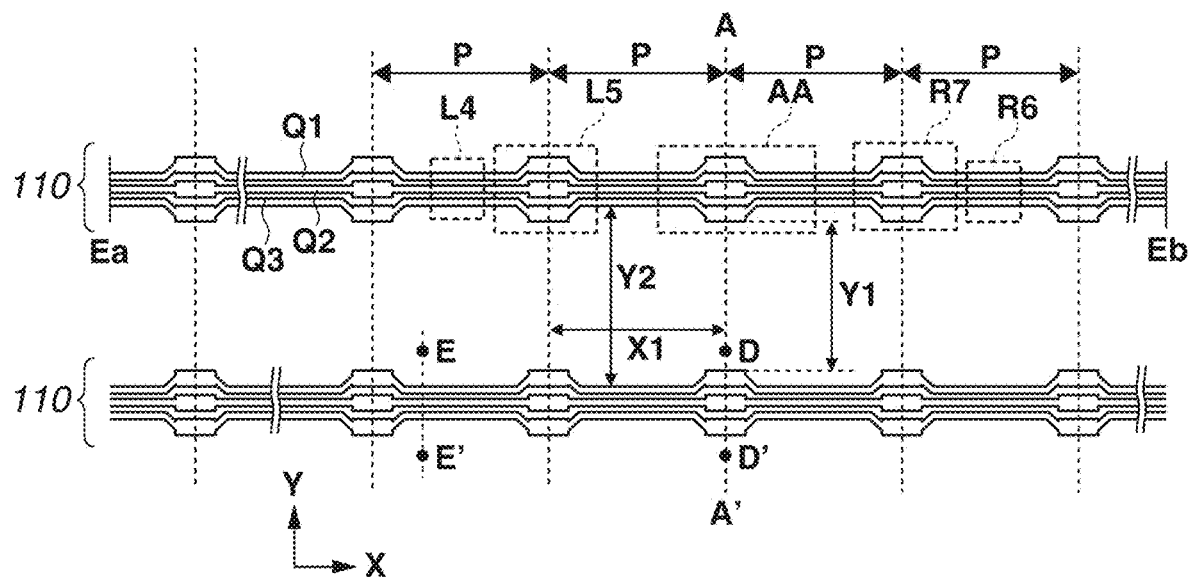
FIGS. 2A and 2B are schematic diagrams illustrating the semiconductor device.
Figure 2B:
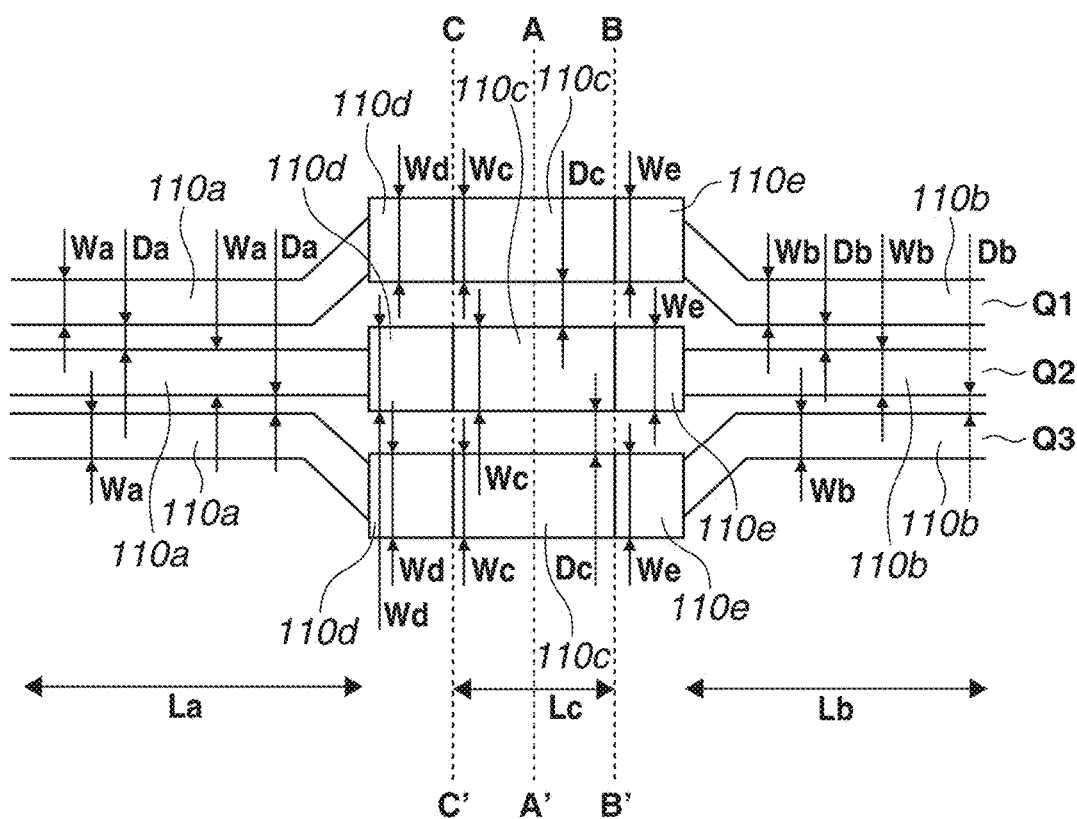

FIG. 2A is a plan view of a plurality of wirings 110 in the semiconductor device APR. Each of wirings Q1, Q2, and Q3 has a damascene structure. The wiring Q1 and the wiring Q2 are adjacent to each other, and the wiring Q2 and the wiring Q3 are adjacent to each other. A distance between one end Ea of the wiring Q2 and the other end Eb thereof is larger than 33 mm. As mentioned above, the distance between one end Ea of the wiring Q2 and the other end Eb thereof can be 36 mm±1 mm or larger. FIG. 2B is an enlarged view of a range AA illustrated in FIG. 2A. Each of the wirings Q1, Q2, and Q3 includes a left side portion 110a, a right side portion 110b, and an intermediate portion 110c, which lies between the left side portion 110a and the right side portion 110b, along a direction in which the wirings Q1, Q2, and Q3 extend. The left side portion 110a is located in the left side region SL, the right side portion 110b is located in the right side region SR, and the intermediate portion 110c is located in the intermediate region SC. In FIG. 2B, the width Wa of the left side portion 110a, the width Wb of the right side portion 110b, and the width We of the intermediate portion 110c are illustrated. It is characteristic that the width We of the intermediate portion 110c is larger than each of the width Wa of the left side portion 110a and the width Wb of the right side portion 110b (We>Wa, We>Wb). Each of the width Wa of the left side portion 110a and the width Wb of the right side portion 110b can be smaller than 230 nm. An advantageous effect in implementing a miniaturization obtained by making the width We larger than each of the width Wa and the width Wb can be conspicuously attained in a case where each of the width Wa of the left side portion 110a and the width Wb of the right side portion 110b is smaller than 230 nm. In a case where each of the width Wa of the left side portion 110a and the width Wb of the right side portion 110b is 230 nm or larger, the width We of the intermediate portion 110c can be the same as or different from each of the width Wa of the left side portion 110a and the width Wb of the right side portion 110b. Making the width We of the intermediate portion 110c larger than each of the width Wa and the width Wb in a case where each of the width Wa and the width Wb is 230 nm or larger can be disadvantageous in attaining miniaturization. Each of the width Wa of the left side portion 110a and the width Wb of the right side portion 110b can be smaller than 180 nm. An advantageous effect in implementing a miniaturization obtained by making the width We larger than each of the width Wa and the width Wb can be conspicuously attained in a case where each of the width Wa of the left side portion 110a and the width Wb of the right side portion 110b is smaller than 180 nm. It is favorable that a difference between the width We of the intermediate portion 110c and the width Wa of the left side portion 110a (We Wa) is larger than 50 nm, and this is favorable in making the width Wa of the left side portion 110a smaller than 180 nm. It is favorable that a difference between the width We of the intermediate portion 110c and the width Wb of the right side portion 110b (We −Wb) is larger than 50 nm, and this is favorable in making the width Wb of the right side portion 110b smaller than 180 nm. It is favorable that a difference between the width We of the intermediate portion 110c and the width Wa of the left side portion 110a (We−Wa) is smaller than the width Wa of the left side portion 110a (We−Wa<Wa). It is also favorable that a difference between the width We of the intermediate portion 110c and the width Wb of the right side portion 110b (We−Wb) is smaller than the width Wb of the right side portion 110b (We−Wb<Wb). It is also favorable that the width We of the intermediate portion 110c is larger than 110 nm. It is also favorable that the width We of the intermediate portion 110c is larger than 180 nm. The width We of the intermediate portion 110c can be smaller than 300 nm. While, in the present example, the width Wb is equal to the width Wa, the width Wb can be different from the width Wa.

In FIG. 2B, a distance Da between the left side portion 110a of the wiring Q2 and each of the wirings Q1 and Q3, a distance Db between the right side portion 110b of the wiring Q2 and each of the wirings Q1 and Q3, and a distance De between the intermediate portion 110c of the wiring Q2 and each of the wirings Q1 and Q3 are illustrated. It is favorable that the distance De between the intermediate portion 110c of the wiring Q2 and each of the wirings Q1 and Q3 is larger than the width Wa of the left side portion 110a (De>Wa). It is favorable that the distance De between the intermediate portion 110c of the wiring Q2 and each of the wirings Q1 and Q3 is larger than the width Wb of the right side portion 110b (De>Wb). It is favorable that the distance Da between the left side portion 110a of the wiring Q2 and each of the wirings Q1 and Q3 is smaller than the width We of the intermediate portion 110c (Da<We). It is favorable that the distance Db between the right side portion 110b of the wiring Q2 and each of the wirings Q1 and Q3 is smaller than the width We of the intermediate portion 110c (Db<We). While, in the present example, the distance Db is equal to the distance Da, the distance Db can be different from the distance Da.

In FIG. 2B, a length La of the left side portion 110a, a length Lb of the right side portion 110b, and a length Le of the intermediate portion 110c taken along a direction in which the wirings Q1, Q2, and Q3 extend are illustrated. The length Le of the intermediate portion 110c can be larger than the width Wa of the left side portion 110a. The length Lc of the intermediate portion 110c can be larger than the width Wb of the right side portion 110b. The length Lc of the intermediate portion 110c can be smaller than the length La of the left side portion 110a. The length Lc of the intermediate portion 110c can be smaller than the length Lb of the right side portion 110b.

Typically, each of the width Wa, the width Wb, the distance Da, and the distance Db is smaller than each of the width Wc and the distance Dc.

An example in which the semiconductor device APR is applied to a photoelectric conversion device is described. Each of the wirings Q1, Q2, and Q3 is, for example, a row wiring having a dual damascene structure. Each of the wirings Q1, Q2, and Q3 is a signal line used to transfer a control signal to a pixel circuit, which includes four transistors (a transfer transistor, a reset transistor, an amplification transistor, and a selection transistor) per one pixel P. For example, the wiring Q1 is a transfer signal line used to control the transfer transistor, the wiring Q2 is a reset signal line used to control the reset transistor, and the wiring Q3 is a selection signal line used to control the selection transistor. What functions the plurality of wirings 110 and the wirings Q1, Q2, and Q3 in the present exemplary embodiment have is not limited to the above-described example.

In FIG. 2A, the respective ranges of a plurality of pixels P are illustrated. A portion in which the width of a wiring is thick (a thick line portion) and a portion in which the width of a wiring is thin (a thin line portion) are repeatedly provided for each pixel P. The left side portion 110a is located between one end Ea and the intermediate portion 110c of the range AA along a direction in which the wirings Q1, Q2, and Q3 extend. The right side portion 110b is located between the other end Eb and the intermediate portion 110c of the range AA along a direction in which the wirings Q1, Q2, and Q3 extend. Each of the wirings Q1, Q2, and Q3 includes a thin line portion L4 located between one end Ea and the left side portion 110a and a thick line portion L5 located between the thin line portion L4 and the left side portion 110a along a direction in which the wirings Q1, Q2, and Q3 extend. Moreover, each of the wirings Q1, Q2, and Q3 includes a thin line portion R6 located between the other end Eb and the right side portion 110b and a thick line portion R7 located between the thin line portion R6 and the right side portion 110b along a direction in which the wirings Q1, Q2, and Q3 extend. The width of the thick line portion L5 is larger than each of the width Wa of the left side portion 110a, the width Wb of the right side portion 110b, the width of the thin line portion L4, and the width of the thin line portion R6. The width of the thick line portion R7 is larger than each of the width Wa of the left side portion 110a, the width Wb of the right side portion 110b, the width of the thin line portion L4, and the width of the thin line portion R6. While it is favorable that the width of the thick line portion L5 or the width of the thick line portion R7 is equal to the width Wc, the width of the thick line portion L5 or the width of the thick line portion R7 can be different from the width Wc. While it is favorable that the width of the thin line portion L4 or the width of the thin line portion R6 is equal to the width Wa or Wb, the width of the thin line portion L4 or the width of the thin line portion R6 can be different from the width Wa or Wb.

In this way, providing thick line portions (i.e., the thick line portions L5 and R7) at positions corresponding to the range AA in pixels away from the line A-A', which do not include the intermediate region SC, enables improving the uniformity of a wiring layout in each pixel and thus increasing the uniformity of characteristics of each pixel. In other words, providing such thick line portions enables decreasing a difference in signal output between a pixel near the line A-A' including the intermediate region SC and a pixel away from the line A-A' not including the intermediate region SC and preventing or reducing a line noise from occurring along the line A-A' in an image. Naturally, since the thick line portion L5 is present on the left side region SL and the thick line portion R7 is present on the right side region SR, the thick line portions L5 and R7 have almost no function of mitigating the influence of misregistration between a photomask for use at the time of exposure on the left side region SL and a photomask for use at the time of exposure on the right side region SR.

Each of the wirings Q1, Q2, and Q3 includes, along a direction in which the wirings Q1, Q2, and Q3 extend, a left side portion 110d, which is located between the left side portion 110a and the intermediate portion 110c, and a right side portion 110e, which is located between the right side portion 110b and the intermediate portion 110c. In FIG. 2B, the width Wd of the left side portion 110d and the width We of the right side portion 110e are illustrated. The width Wd of the left side portion 110d is larger than the width Wa of the left side portion 110a (Wd>Wa), and the width We of the right side portion 110e is larger than the width Wb of the right side portion 110b (We>Wb). In the present example, the width Wd of the left side portion 110d is equal to the width Wc of the intermediate portion 110c (Wd=Wc). In a case where the width Wd of the left side portion 110d is different from the width Wc of the intermediate portion 110c, while the width Wd of the left side portion 110d can be larger than the width Wc of the intermediate portion 110c (Wd>Wc), it is favorable that the width Wd of the left side portion 110d is smaller than the width Wc of the intermediate portion 110c (Wd<Wc). Similarly, the width We of the right side portion 110e is equal to the width Wc of the intermediate portion 110c (We=Wc). In a case where the width We of the right side portion 110e is different from the width Wc of the intermediate portion 110c, while the width We of the right side portion 110e can be larger than the width Wc of the intermediate portion 110c (We>Wc), it is favorable that the width We of the right side portion 110e is smaller than the width Wc of the intermediate portion 110c (We<Wc). It is favorable that a difference (|Wc−Wd|) between the width Wc of the intermediate portion 110c and the width Wd of the left side portion 110d is smaller than a difference (|Wd−Wa|) between the width Wa of the left side portion 110a and the width Wd of the left side portion 110d (|Wc−Wd|<|Wd−Wa|). Similarly, it is favorable that a difference (|Wc−We|) between the width Wc of the intermediate portion 110c and the width We of the right side portion 110e is smaller than a difference (|We−Wb|) between the width Wb of the right side portion 110b and the width We of the right side portion 110e (|We−We|<|We−Wb|). Since, as mentioned above, there can be a relationship of We=Wd=Wc, the relationship between the width Wc and the widths Wa and Wb can be applied to the relationship between the widths Wd and We and the widths Wa and Wb. Furthermore, the left side portion 110d and the right side portion 110e can be omitted, and this is equivalent to making the width Wd of the left side portion 110d equal to the width Wa and making the width We of the right side portion 110e equal to the width Wb.

As illustrated in FIG. 2B, the wiring Q1 and the wiring Q3 are located obliquely between the left side portion 110a and the left side portion 110d. This implements satisfying both of Wa<Wc and Da<Dc. Similarly, the wiring Q1 and the wiring Q3 are located obliquely between the right side portion 110b and the right side portion 110e. This implements satisfying both of Wb<We and Db<Dc.

Moreover, making the width We larger than each of the width Wa and the width Wb (We>Wa & Wb) enables preventing or reducing a pattern from being broken at the intermediate portion 110c even when misregistration occurs between photomasks for the left side region SL and the right side region SR. Then, this enables forming a more minute pattern at the left side portion 110a and the right side portion 110b. Moreover, making the distance Dc larger than each of the distance Da and the distance Db (Dc>Da & Db) enables preventing or reducing a pattern from being short-circuited in the intermediate portion 110c even when misregistration occurs between photomasks for the left side region SL and the right side region SR.

As illustrated in FIG. 2A, a wiring interval Y2 in the Y-direction can be made larger than a wiring interval Y1 in the Y-direction. This enables making a wiring opening in the Y-direction wider and thus improving the sensitivity of a photoelectric conversion device.

In the following description, a method for manufacturing a semiconductor device is described with reference to FIGS. 3A1, 3A2, 3B1, 3B2, 3C1, 3C2, 3D1, and 3D2 and FIGS. 4A1, 4A2, 4B1, 4B2, 4C1, 4C2, 4D1, and 4D2. In FIGS. 3A1 to 3D2 and FIGS. 4A1 to 4D2, figures having figure numbers with a suffix "1" appended thereto are sectional views and figures having figure numbers with a suffix "2" appended thereto are plan views. The sectional views, which have figure numbers with a suffix "1" appended thereto, represent cross sections taken along a line D-D' in the plan views, which have figure numbers with a suffix "2" appended thereto.

As illustrated in each of the plan views, which have figure numbers with a suffix "2" appended thereto, the wafer WF includes, in each of a plurality of device regions DR, a left side region SL to the left of a line C-C', a right side region SR to the right of a line B-B', and an intermediate region SC between the left side region SL and the right side region SR.

FIGS. 3A1 and 3A2 illustrate a process A for preparing the wafer WF, which includes a semiconductor layer 100 and a second insulator film 104 provided on the semiconductor layer 100. The wafer WF, which is used for manufacturing the semiconductor device APR in the present exemplary embodiment, includes the semiconductor layer 100, which serves as an element functional layer. The semiconductor layer 100 to be used includes a silicon layer or a compound semiconductor layer. In the element functional layer, for example, a plurality of photoelectric conversion portions (not illustrated), a plurality of transistors (not illustrated), and an isolation structure (not illustrated) for isolating the plurality of photoelectric conversion portions and the plurality of transistors at portions where those are to be electrically isolated from each other. The element functional layer can be formed by a known method using a known material.

On the semiconductor layer 100 serving as an element functional layer, there is formed an interlayer insulating film 101. The interlayer insulating film 101 is formed to establish electrical insulation between a structure included in the semiconductor layer 100 serving as an element functional layer and a layer above the interlayer insulating film 101. The interlayer insulating film 101 to be used can be made from, for example, a silicon oxide and can be formed by a known method.

In the interlayer insulating film 101, there is formed a contact plug 102 at a portion where an electrical conduction is intended to be secured between a structure included in the semiconductor layer 100 serving as an element functional layer and a wiring above the interlayer insulating film 101. On the contact plug 102, there are formed a first insulator film 103, which functions as an etching stop layer, and a second insulator film 104, which serves an interlayer insulating film. For example, the contact plug 102 can be made from tungsten, the first insulator film 103 can be a silicon carbide film or a silicon nitride film, and the second insulator film 104 can be a silicon oxide film. Furthermore, these configurations are not intended to limit the present exemplary embodiment, and are merely described as examples.

FIGS. 3B1 and 3B2 illustrate a process B for forming mask material films 105 and 106 on the wafer WF. The manufacturing method forms, on the second insulator film 104 serving as an interlayer insulating film, a first mask material film 105 and a second mask material film 106. The first mask material film 105 is configured with an inorganic material film 1051 and an organic material film 1052. For example, the inorganic material film 1051 can be a silicon nitride film, and the organic material film 1052 can be made from a novolak-type resin. In the present exemplary embodiment, the first mask material film 105 has the above-described configuration, but can have another configuration. The second mask material film 106 to be used includes, for example, a silicon oxide film.

FIGS. 3C1 and 3C2 illustrate an exposure process C for exposing a positive-type photoresist film 111, which is provided on the side of a layer above the insulator films 103 and 104, with a left side exposure shot L. The left side exposure shot L is used to expose the photoresist film 111 in above the left side region SL and the intermediate region SC. After forming the positive-type photoresist film 111 on the second mask material film 106, the manufacturing method exposes the photoresist film 111 with a left side exposure pattern 111L using a photomask PML in above the left side region SL and the intermediate region SC. As illustrated in FIG. 3C2, the left side exposure pattern 111L is used for exposure up to the line B-B' across the line A-A'.

FIGS. 3D1 and 3D2 illustrate an exposure process D for exposing the positive-type photoresist film 111, which is provided on the side of a layer above the insulator films 103 and 104, with a right side exposure shot R. The right side exposure shot R is used to expose the photoresist film 111 in above the right side region SR and the intermediate region SC after the left side exposure shot L. After exposing the left side region SL, the manufacturing method exposes the intermediate region SC and the right side region SR using a photomask PMR in above the right side region SR and the intermediate region SC, thus exposing the photoresist film 111 with a right side exposure pattern 111R. The right side exposure pattern 111R is used for exposure up to the line C-C' across the line A-A'.

In this way, an exposure process obtained by combining the exposure process C and the exposure process D includes the left side exposure shot L and the right side exposure shot R, which is performed after the left side exposure shot L. Furthermore, while, here, an example in which the right side exposure shot R is performed after the left side exposure shot L has been described, the left side exposure shot L can be performed after the right side exposure shot R. Details of the left side exposure pattern 111L and the right side exposure pattern 111R are described below. The wavelength of exposure light to be used favorably includes, for example, 175 nm to 275 nm, and such exposure light includes, for example, exposure light of wavelengths 225 nm to 275 nm (for example, KrF excimer laser of wavelength 248 nm) and exposure light of wavelengths 175 nm to 225 nm (for example, ArF excimer laser of wavelength 193 nm). Using ArF excimer laser as exposure light is more favorable in terms of miniaturization of wiring.

FIGS. 4A1 and 4A2 illustrate a development process E for developing the photoresist film 111 to form a resist pattern 111D from the photoresist film 111. The manufacturing method performs development processing on the photoresist film 111, on which a latent image pattern has been formed via the left side exposure shot L and the right side exposure shot R, thus forming the resist pattern 111D. Since the photoresist film 111 is of the positive type, a portion exposed by the exposure process in the photoresist film 111 is removed by the development process.

FIGS. 4B1 and 4B2 illustrate a working process F for performing working on the mask material film 106 using the resist pattern 111D as a mask to transfer the resist pattern 111D onto the mask material film 106. The manufacturing method forms a mask pattern 1061 by performing etching on the second mask material film 106 using the resist pattern 111D as a mask.

FIGS. 4C1 and 4C2 illustrate a working process G for performing working on the insulator films 104 and 103 using the mask pattern 1061 as a mask to form a trench 109 in the insulator films 104 and 103. The manufacturing method performs etching on the first mask material film 105, the second insulator film 104 serving as an interlayer insulating film, and the first insulator film 103 using the mask pattern 1061 as a mask, thus forming the trench 109. The trench 109 extends from the left side region SL to the right side region SR across the intermediate region SC.

Furthermore, a process obtained by combining the working process F and the working process G can be referred to as a working process for forming a trench in the insulator films 104 and 103 by performing working on the insulator films 104 and 103 using the resist pattern 111D. While, here, the working process F is included in the manufacturing method, involving the working process F or using the first mask material film 105 is not essential. A resist pattern itself formed from a photoresist film formed immediately above the insulator film 104 can be used as a mask to perform working on the insulator films 104 and 103 so as to form a trench in the insulator films 104 and 103.

FIGS. 4D1 and 4D2 illustrate a wiring process H for forming a wiring 110 in the trench. For example, the manufacturing method embeds an electrical conducting material into the trench 109 using a plating method. The electrical conducting material can be, for example, copper or an alloy containing copper. Then, after embedding the electrical conducting material, the manufacturing method removes an unnecessary electrical conducting material formed on the second insulator film 104 using, for example, a chemical mechanical polishing (CMP) method. With this processing, the manufacturing method forms the wiring 110 in the trench 109. The wiring 110 extends from the left side region SL to the right side region SR across the intermediate region SC. The wiring 110 includes, along a direction in which the wiring 110 extends, a left side portion 110L, which is located on the left side region SL, a right hand portion 110R, which is located on the right side region SR, and an intermediate portion 110C, which is located on the intermediate region SC. In this way, a wiring formed by embedding an electrical conducting material into an insulator film and then removing an unnecessary electrical conducting material is referred to as a "damascene wiring", and such a process is referred to as a "damascene process".

Then, the manufacturing method forms at least one upper-layer wiring layer (typically, a plurality of upper-layer wiring layers). Formation of the upper-layer wiring layer can be performed by applying a damascene process similar to the above-described one to an interlayer insulating film formed on the second insulator film 104 and the wiring 110. In a case where the semiconductor device APR is a photoelectric conversion device of the obverse surface irradiation type, after forming the upper-layer wiring layer, the manufacturing method can provide an opening to a plurality of interlayer insulating films including the second insulator film 104. This opening is used to form an optical path for light to a photoelectric conversion portion. A light-transmitting material different from the material of the first insulator film 103 and/or the second insulator film 104 can be embedded into this opening. For example, if the first insulator film 103 is made from silicon carbide or silicon nitride and the second insulator film 104 is made from silicon oxide, the light-transmitting material only needs to be silicon nitride, silicon oxide, or resin.

In the above description, a case where the method for manufacturing a semiconductor device is applied to formation of wiring has been described. The wiring layer includes wirings used to transfer electric power and signals which are in common with respective columns of a pixel portion, and these wirings are arranged while extending between the left side region SL and the right side region SR. Applying divisional exposure used in the present exemplary embodiment enables performing miniaturization working on wirings in the respective regions and also performing miniaturization on a portion extending between regions. A wiring obtained by connection using divisional exposure can be, for example, an electric power line used to supply electric power for causing a pixel portion or a column circuit to operate. Alternatively, a wiring obtained by connection using divisional exposure can be, for example, a signal line used to supply a control signal for controlling the operation of a pixel portion or a column circuit or a signal line used to transfer an output signal from a column circuit that is based on the amount of light received for each pixel. However, another type of wiring can be formed by connection using divisional exposure. While a wiring the manufacturing method for which has been described in the present exemplary embodiment is a single damascene wiring formed by a single damascene process, a similar method can be applied to a dual damascene wiring formed by a dual damascene process. While "trench first" can be employed for the dual damascene process, employing "via first" is more advantageous in terms of miniaturization.

Moreover, while a wiring layer the manufacturing method for which has been described is one layer, the above-described exemplary embodiment can be applied to two or more wiring layers. Moreover, an exposure apparatus used for exposure at the time of formation can differ between a wiring in the first layer and a wiring in the second layer. For example, when forming a wiring in the first layer, the manufacturing method can use an exposure apparatus with a wavelength of 193 nm using an ArF light source and a maximum exposure region of 26 mm×33 mm, and, when forming wirings in the second layer and subsequent layers, the manufacturing method can use an exposure apparatus with a wavelength of 248 nm using a KrF light source and a maximum exposure region of 26 mm×33 mm. The wiring in the first layer can be a single damascene wiring and the wiring in the second layer can be a dual damascene wiring. Then, the manufacturing method can apply connective exposure (divisional exposure) using an ArF light source to a single damascene wiring in the first layer and apply connective exposure (divisional exposure) using a KrF light source to a dual damascene wiring in the second layer.

In the following description, details of the left side exposure pattern 111L and the right side exposure pattern 111R in the exposure processes illustrated in FIGS. 3C1 and 3C2 and FIGS. 3D1 and 3D2 in the method for manufacturing the semiconductor device APR are described with reference to FIGS. 5A to 9F.

In FIGS. 5A to 9F, each of figures having figure numbers with a suffix "A" appended thereto illustrates a pattern on the photomask PML, which is used at the time of a left side exposure shot L for exposing the left side region SL. In FIGS. 5A to 9F, each of figures having figure numbers with a suffix "C" appended thereto illustrates a pattern on the photomask PMR, which is used at the time of a right side exposure shot R for exposing the right side region SR. Each of the photomasks PML and PMR includes a light-blocking region LS and a light-transmitting region LT. The photoresist film 111 is exposed with exposure light which has been transmitted through the light-transmitting region LT.

In FIGS. 5A to 9F, each of figures having figure numbers with a suffix "B" appended thereto illustrates the left side exposure pattern 111L of the photoresist film 111 in between the left side exposure shot L and the right side exposure shot R of the exposure process C. In the figures having figure numbers with a suffix "B" appended thereto, the left side exposure pattern 111L is indicated with hatching of oblique lines rising diagonally up and to the left. As illustrated in the figures having figure numbers with a suffix "B" appended thereto, the photoresist film 111 includes an exposed portion 111La, which is located on the left side region SL and has been exposed with the left side exposure shot L, and an exposed portion 111Lc, which is located on the intermediate region SC and has been exposed with the left side exposure shot L. Additionally, the photoresist film 111 includes an exposed portion 111Ld, which is located between the exposed portion 111La and the exposed portion 111Lc and has been exposed with the left side exposure shot L.

In FIGS. 5A to 9F, each of figures having figure numbers with a suffix "D" appended thereto illustrates the right side exposure pattern 111R of the photoresist film 111 obtained after the right side exposure shot R of the exposure process D. In the figures having figure numbers with a suffix "D" appended thereto, the right side exposure pattern 111R is indicated with hatching of oblique lines rising diagonally up and to the right. As illustrated in the figures having figure numbers with a suffix "D" appended thereto, the photoresist film 111 includes an exposed portion 111Rb, which is located on the right side region SR and has been exposed with the right side exposure shot R, and an exposed portion 111Rc, which is located on the intermediate region SC and has been exposed with the right side exposure shot R. Additionally, the photoresist film 111 includes an exposed portion 111Re, which is located between the exposed portion 111Rb and the exposed portion 111Rc and has been exposed with the right side exposure shot R.

In FIGS. 5A to 9F, each of figures having figure numbers with a suffix "E" appended thereto illustrates, by hatching, a latent image pattern formed with the left side exposure pattern 111L and the right side exposure pattern 111R of the photoresist film 111 obtained after the left side exposure shot L and the right side exposure shot R in the exposure process D. In the figures having figure numbers with a suffix "E" appended thereto, portions having no hatching are portions which are not removed by development. In the figures having figure numbers with a suffix "E" appended thereto, the left side exposure pattern 111L is indicated with hatching of oblique lines rising diagonally up and to the left. In the figures having figure numbers with a suffix "E" appended thereto, the right side exposure pattern 111R is indicated with hatching of oblique lines rising diagonally up and to the right.

In the figures having figure numbers with a suffix "E" appended thereto out of FIGS. 5A to 9F, in regions located on the left side region SL and the right side region SR, the left side exposure pattern 111L and the right side exposure pattern 111R illustrated in the figures having figure numbers with a suffix "B" appended thereto and the figures having figure numbers with a suffix "D" appended thereto out of FIGS. 5A to 9F become a latent image pattern. In the figures having figure numbers with a suffix "E" appended thereto out of FIGS. 5A to 9F, in a region located on the intermediate region SC, since double exposure is performed with the left side exposure shot L and the right side exposure shot R, a latent image pattern can vary with respect to the left side exposure pattern 111L and the right side exposure pattern 111R illustrated in the figures having figure numbers with a suffix "B" appended thereto and the figures having figure numbers with a suffix "D" appended thereto out of FIGS. 5A to 9F.

As illustrated in the figures having figure numbers with a suffix "E" appended thereto, the latent image pattern of the photoresist film 111 includes an exposed portion 111Rb, which is located on the right side region SR and has been exposed with the right side exposure shot R, and an exposed portion 111LR, which is located on the intermediate region SC and has been exposed with the right side exposure shot R. Additionally, the latent image pattern of the photoresist film 111 includes an exposed portion 111Re, which is located between the exposed portion 111Rb and the exposed portion 111LR and has been exposed with the right side exposure shot R.

Here, in the photoresist film 111, an exposed portion located on the intermediate region SC includes a double exposed portion 111LR which has been exposed with both the left side exposure shot L and the right side exposure shot R. In the figures having figure numbers with a suffix "E" appended thereto out of FIGS. 5A to 9F, the double exposed portion 111LR is indicated with hatching in which oblique lines rising diagonally up and to the left and oblique lines rising diagonally up and to the right intersect with each other. Thus, the exposed portion 111LR, which has been exposed with at least the right side exposure shot R, includes the exposed portion 111Lc. Furthermore, in FIGS. 8A to 8F and FIGS. 9A to 9F, an exposed portion located on the intermediate region SC includes an exposed portion 111Lc which has been exposed with the left side exposure shot L and has not been exposed with the right side exposure shot R and an exposed portion 111Rc which has not been exposed with the left side exposure shot L and has been exposed with the right side exposure shot R.

Since the photoresist film 111 is of the positive type, the exposed portion 111La, the exposed portion 111Lc, the exposed portion 111Ld, the exposed portion 111Rb, the exposed portion 111Rc, the exposed portion 111LR, and the exposed portion 111Re are removed.

Figure 5A:
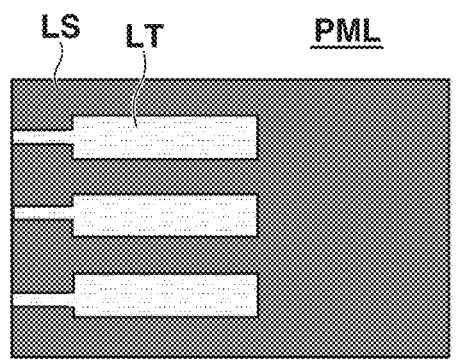
FIGS. 5A, 5B, 5C, 5D, 5E, and 5F are schematic diagrams illustrating a semiconductor device and a manufacturing method.
Figure 9A:
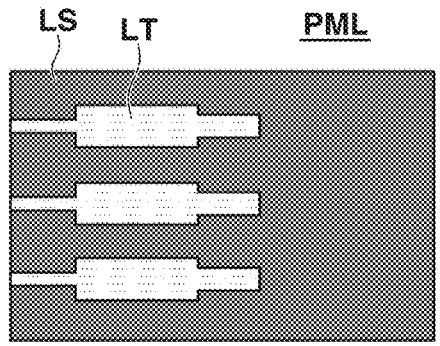
FIGS. 9A, 9B, 9C, 9D, 9E, and 9F are schematic diagrams illustrating a semiconductor device and a manufacturing method.
Figure 9C:
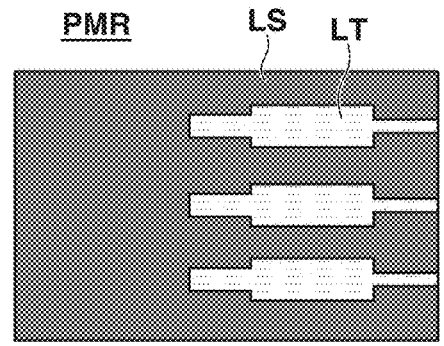
Figure 9B:
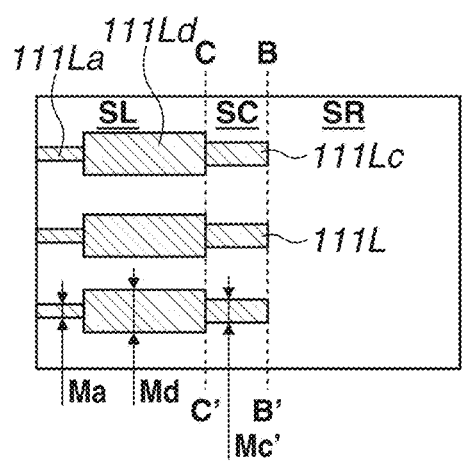
Figure 9D:
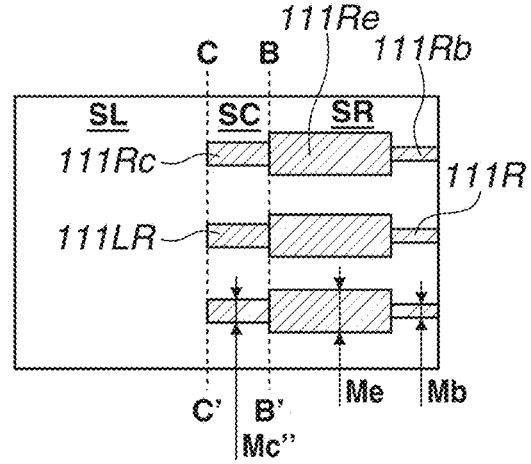
Figure 9E:
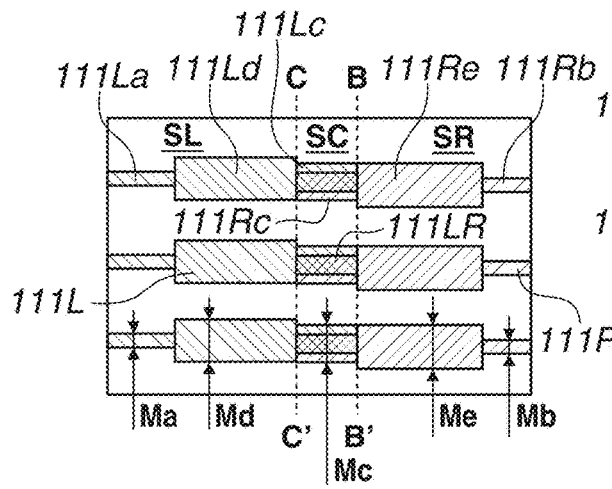
Figure 9F:
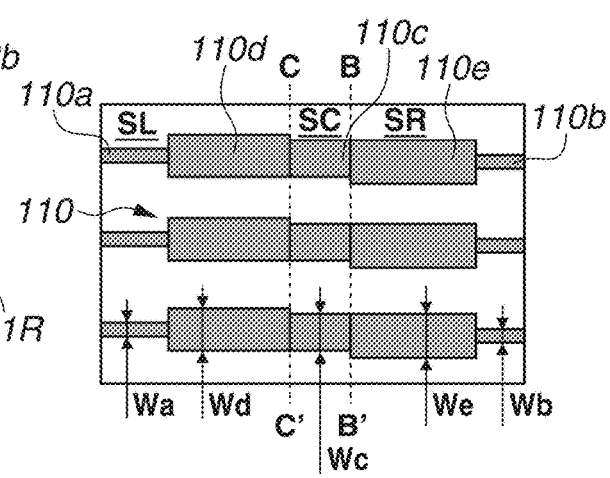

In the figures having figure numbers with a suffix "B" appended thereto out of FIGS. 5A 9F, the width Ma of the exposed portion 111La, the width Md of the exposed portion 111Ld, and the width Mc' of the exposed portion 111Lc are illustrated.

Moreover, in the figures having figure numbers with a suffix "D" appended thereto out of FIGS. 5A to 9F, the width Mb of the exposed portion 111Rb, the width Me of the exposed portion 111Re, and the width Mc" of the exposed portion 111Rc are illustrated. Furthermore, in the figures having figure numbers with a suffix "D" appended thereto out of FIGS. 5A to 9F, the width Mc" of the exposed portion 111Rc located on the intermediate region SC exposed with the right side exposure shot R can be the same as the width Mc'.

Moreover, in the figures having figure numbers with a suffix "E" appended thereto out of FIGS. 5A to 9F, the width Ma of a latent image of the exposed portion 111La, the width Md of a latent image of the exposed portion 111Ld, the width Mb of a latent image of the exposed portion 111Rb, the width Me of a latent image of the exposed portion 111Re, and the width Mc of a latent image in the intermediate region SC are illustrated. The width Ma and the width Md are equal to each other between the figures having figure numbers with a suffix "B" appended thereto and the figures having figure numbers with a suffix "E" appended thereto out of FIGS. 5A to 9F. Moreover, the width Mb and the width Me are equal to each other between the figures having figure numbers with a suffix "D" appended thereto and the figures having figure numbers with a suffix "E" appended thereto out of FIGS. 5A to 9F.

It should be noted here that the width Mc' and the width Mc can be different from each other. In the intermediate region SC, since double exposure is performed with the left side exposure shot L and the right side exposure shot R, the cumulated exposure amount increases, so that the width Mc can become larger than the width Mc' or Mc". This is because, due to an increase in the cumulated exposure amount, the amount of generation of acid in an exposed portion increases, a protective group elimination reaction using acid as a catalyst more often occurs, and a region which is dissoluble in a developing liquid broadens. Moreover, while diffraction of light can occur in an exposure, since double exposure is performed with both diffracted light used for the left side exposure shot L and diffracted light used for the right side exposure shot R, the width Mc can become larger than the width Mc'. Moreover, due to misregistration between the left side exposure shot L and the right side exposure shot R, the width Mc can also become different from the width Mc' or the width Mc". In the figures having figure numbers with a suffix "E" appended thereto out of FIGS. 5A to 9F, regions in which a latent image is formed not with only the left side exposure shot L or not with only the right side exposure shot R out of the left side exposure shot L and the right side exposure shot R is indicated with hatching formed not by oblique lines. Each region indicated with hatching formed not by oblique lines is a region in which a latent image is formed by the influence of acid, such as that mentioned above or double exposure caused by diffracted light. Each of the figures having figure numbers with a suffix "F" appended thereto out of FIGS. 5A to 9F illustrates a pattern of the wiring 110 obtained after the wiring process H. As illustrated in the figures having figure numbers with a suffix "F" appended thereto out of FIGS. 5A to 9F, the wiring 110 includes a left side portion 110a, a right side portion 110b, and an intermediate portion 110c located between the left side portion 110a and the right side portion 110b. Moreover, the wiring 110 includes a left side portion 110d located between the left side portion 110a and the intermediate portion 110c and a right side portion 110e located between the right side portion 110b and the intermediate portion 110c. The intermediate portion 110c is located between the left side portion 110d and the right side portion 110e.

In the figures having figure numbers with a suffix "F" appended thereto out of FIGS. 5A to 9F, the width Wa of the left side portion 110a, the width Wb of the right side portion 110b, the width We of the intermediate portion 110c, the width Wd of the left side portion 110d, and the width We of the right side portion 110e are illustrated. Furthermore, in FIG. 7F, a portion having a width We' and a portion having a width We" are also illustrated.

In the following description, the widths Ma, Mb, Mc, Mc', Mc", Md, and Me of the respective exposed portions and the widths Wa, Wb, We, We', We", Wd, and We of the respective portions of the wiring are described with respect to a plurality of exemplary embodiments (first to fifth exemplary embodiments).

One of things which are in common between the first to fifth exemplary embodiments is that the width We of the intermediate portion 110c is larger than each of the width Wa of the left side portion 110a and the width Wb of the right side portion 110b (We>Wa & Wb). Here, "Wa & Wb" means "Wa and Wb", and "We Wa & Wb" is synonymous with "We>Wa and We>Wb". In We>Wa & Wb, Wa and Wb can be the same or can be different. This also applies to the following description. Furthermore, in a case where the inequality sign with an equal sign is used, this means that the sign can be an equal sign or can be an inequality sign. Thus, "We≧Wa & Wb" is synonymous with "We=Wa & Wb" or "We>Wa & Wb".

In this way, making the width We of the wiring 110 in the intermediate region SC larger than each of the widths Wa and Wb enables preventing or reducing the wiring 110 from being broken in the intermediate region SC even when misregistration occurs between the photomask PML and the photomask PMR.

One of things which are in common between the first to fifth exemplary embodiments is that the width Ma of the exposed portion 111La is smaller than the width Mc' of the exposed portion 111Lc (Ma<Mc'). One of things which are in common between the first to fifth exemplary embodiments is that the width Mb of the exposed portion 111Rb is smaller than the width Mc" of the exposed portion 111Rc (Mb<Mc"). This enables increasing resolution in the exposed portion 111Lc and the exposed portion 111Rc than in the exposed portion 111La and the exposed portion 111Rb. This enables preventing or reducing the exposed portion 111Lc and the exposed portion 111Rc from not being resolved under the condition of exposing the exposed portion 111La and the exposed portion 111Rb.

Moreover, one of things which are in common between the first to fifth exemplary embodiments is that the width Md of the exposed portion 111Ld is larger than the width Ma of the exposed portion 111La (Md>Ma). One of things which are in common between the first to fifth exemplary embodiments is that the width Me of the exposed portion 111Re is larger than the width Mb of the exposed portion 111Rb (Me>Mb).

One of things which are in common between the second to fifth exemplary embodiments is that the width Me' of the exposed portion 111Lc is smaller than the width Md of the exposed portion 111Ld (Me'<Md). One of things which are in common between the second to fifth exemplary embodiments is that the width Me" of the exposed portion 111Rc is smaller than the width Me of the exposed portion 111Re (Me"<Me).

One of things which are in common between the first to fifth exemplary embodiments is that a difference (|Md−Ma|) between the width Ma of the exposed portion 111La and the width Md of the exposed portion 111Ld is larger than a difference (|Md−Mc'|) between the width Mc' of the exposed portion 111Lc and the width Md of the exposed portion 111Ld (|Md−Ma|>|Md−Mc'|). One of things which are in common between the first to fifth exemplary embodiments is that a difference (|Me−Mb|) between the width Mb of the exposed portion 111Rb and the width Me of the exposed portion 111Re is larger than a difference (|Me−Mc"|) between the width Mc" of the exposed portion 111Rc and the width Me of the exposed portion 111Re (|Me−Mb|>|Me−Mc"|).

First Exemplary Embodiment

Figure 5C:
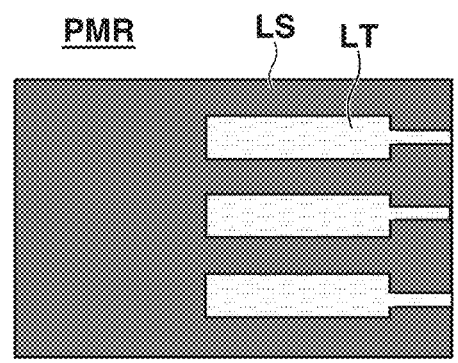
Figure 5B:
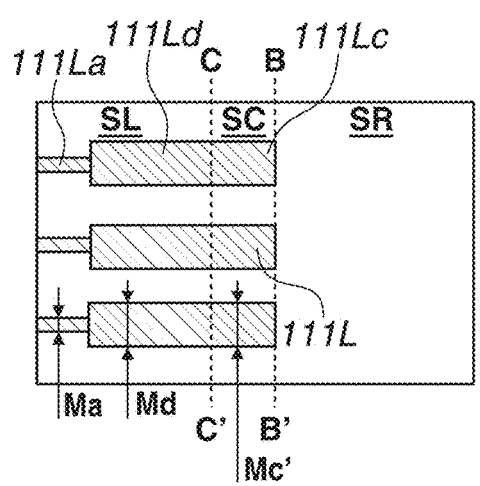
Figure 5D:
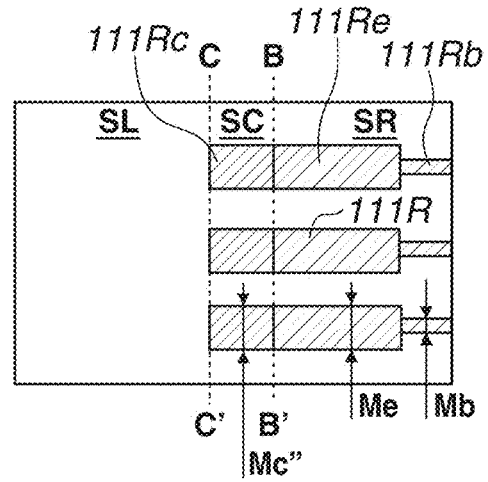

FIGS. 5A to 5F illustrates a method for manufacturing a semiconductor device APR according to a first exemplary embodiment. FIG. 5A illustrates a pattern on the photomask PML, which is used at the time of exposing the left side region SL. FIG. 5B illustrates a left side exposure pattern 111L with which to expose the photoresist film 111. FIG. 5C illustrates a pattern on the photomask PMR, which is used at the time of exposing the right side region SR. FIG. 5D illustrates a right side exposure pattern 111R with which to expose the photoresist film 111.

The first exemplary embodiment satisfies a relationship of Ma & Mb<Md & Me≤Mc' & Mc". Moreover, the first exemplary embodiment satisfies a relationship of Wa & Wb<Wd & We<Wc.

Figure 5E:
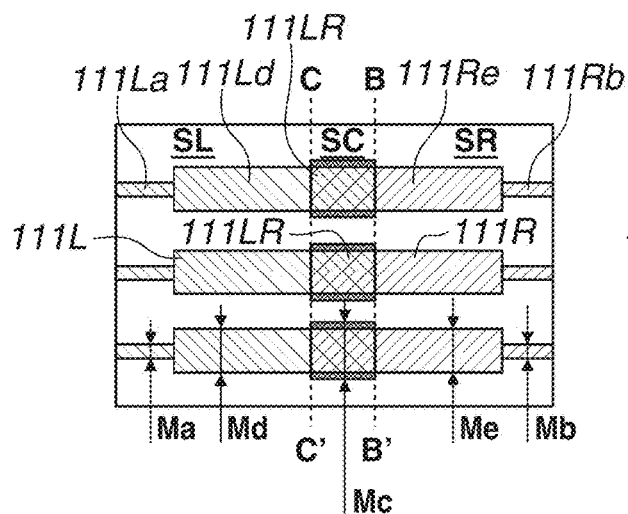
Figure 5F:
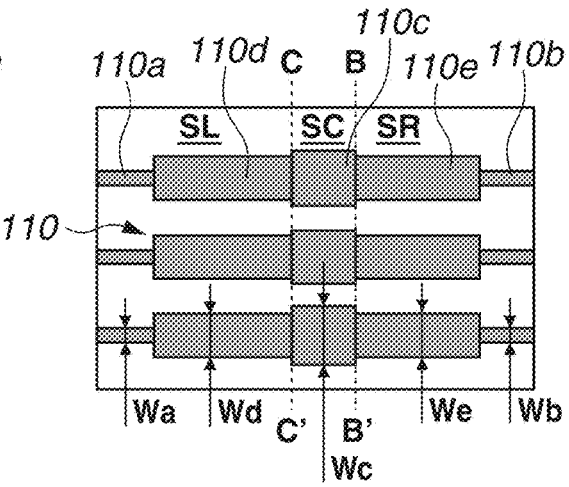

As illustrated in FIGS. 5B and 5D, the width Mc' of the exposed portion 111Lc and the width Md of the exposed portion 111Ld become the same, and the width Mc" of the exposed portion 111Rc and the width Me of the exposed portion 111Re become the same. However, since exposure is doubly performed in the intermediate region SC, as illustrated in FIG. 5E, the width Mc in the intermediate region SC of a latent image pattern including the exposed portion 111LR, which is formed on the photoresist film 111, can become larger than each of the width Mc' and the width MC" (Mc' & Mc"<Mc). Accordingly, the width Mc of the latent image pattern in the intermediate region SC becomes larger than each of the widths Md and Me of the latent image patterns in the regions other than the intermediate region SC. Accordingly, the opening of a resist pattern formed after development in the intermediate region SC becomes larger than each of the openings of the resist patterns formed after development in the left side region SL and the right side region SR, which are other than the intermediate region SC. It is thereby possible to prevent or reduce an increase in resistance of the wiring attributable to the intermediate region SC. Furthermore, if there are no influences of diffracted light, acid, and misregistration mentioned above, a relationship of Mc' & Mc"=Mc can be obtained. Even when a relationship of Mc' & Mc"=Mc is obtained, if a relationship of Md & Me≤Mc' & Mc" is obtained, a relationship of Wd & We<We can be obtained.

To prevent or reduce short circuit between adjacent wiring patterns in the intermediate region SC, it is favorable to increase a space between adjacent wiring patterns. It is enough that the distance Dc, which is an interval between wirings in the intermediate region SC, illustrated in FIG. 2B is larger than each of the distance Da and the distance Db. In terms of performing miniaturization, the distance Dc can be smaller than or equal to the width Wc.

Second Exemplary Embodiment

FIGS. 6A to 6F illustrate a method for manufacturing a semiconductor device APR according to a second exemplary embodiment. The semiconductor device APR in the second exemplary embodiment differs in regions which are exposed on the photoresist film 111 from that in the first exemplary embodiment.

Figure 6A:
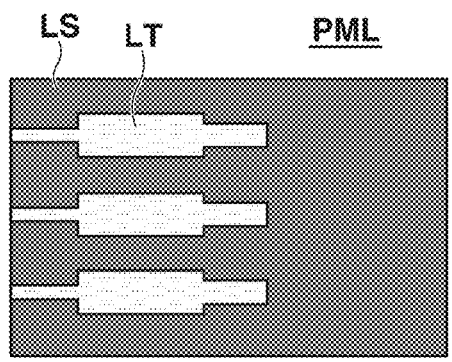
FIGS. 6A, 6B, 6C, 6D, 6E, and 6F are schematic diagrams illustrating a semiconductor device and a manufacturing method.
Figure 6C:
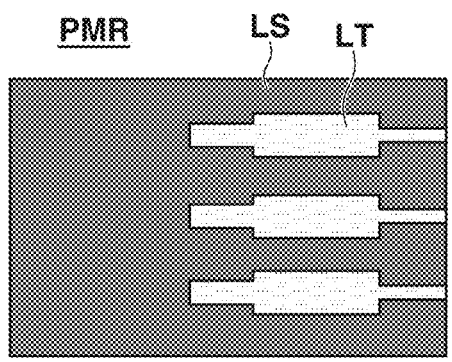
Figure 6B:
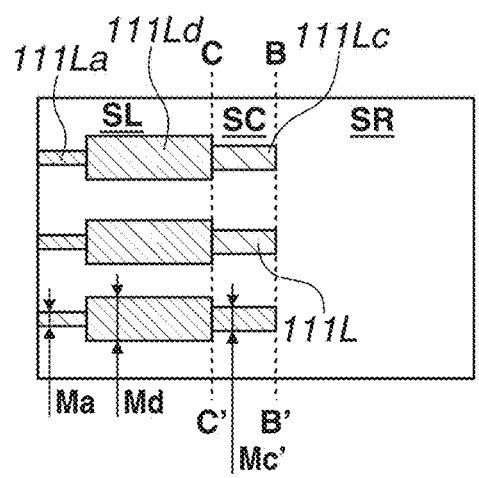
Figure 6D:
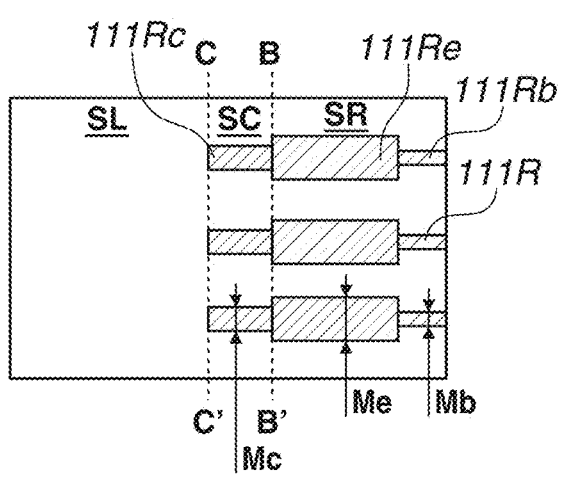
Figure 6E:
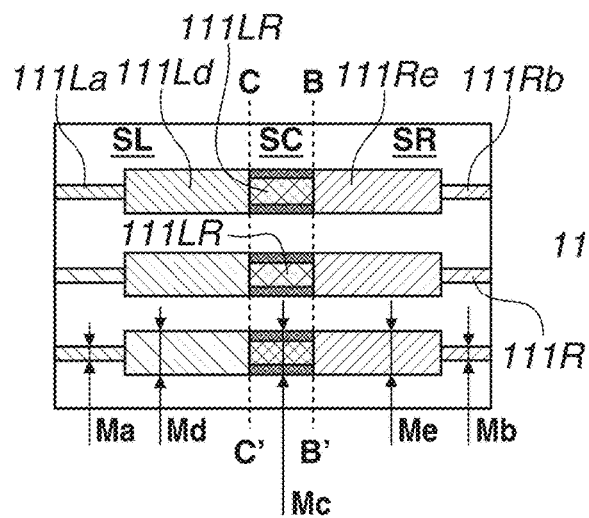
Figure 6F:
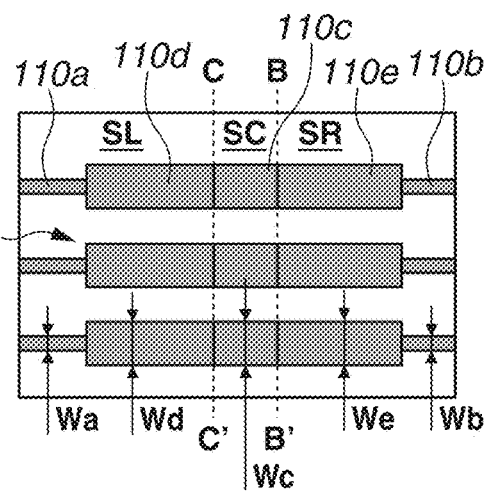

FIG. 6A illustrates a pattern on the photomask PML, which is used at the time of exposing the left side region SL. FIG. 6B illustrates a left side exposure pattern 111L with which to expose the photoresist film 111. FIG. 6C illustrates a pattern on the photomask PMR, which is used at the time of exposing the right side region SR. FIG. 6D illustrates a right side exposure pattern 111R with which to expose the photoresist film 111. Each of the photomasks PML and PMR includes a light-blocking region LS and a light-transmitting region LT. The photoresist film 111 is exposed with exposure light which has been transmitted through the light-transmitting region LT.

while the first exemplary embodiment satisfies a relationship of Mc' & Mc">Md & Me, the second exemplary embodiment satisfies a relationship of Mc' & Mc"<Md & Me. The second exemplary embodiment satisfies a relationship of Ma & Mb<Mc' & Mc"≤Mc≤Md & Me. Moreover, the second exemplary embodiment satisfies a relationship of Wa & Wb<We≤Wd & We.

In the second exemplary embodiment, as illustrated in FIG. 6A, a pattern width on the photomask PML corresponding to the intermediate region SC is partially thinned. As a result, as illustrated in FIG. 6B, exposure is performed with the left side exposure pattern 111L, with which to expose the photoresist film 111, in such a manner that the width Mc' in the intermediate region SC is thinner than the width Md in the left side region SL other than the intermediate region SC. Moreover, in the second exemplary embodiment, as illustrated in FIG. 6C, a pattern width on the photomask PMR corresponding to the intermediate region SC is partially thinned. As a result, as illustrated in FIG. 6D, exposure is performed with the right side exposure pattern 111R, with which to expose the photoresist film 111, in such a manner that the width Mc" in the intermediate region SC is thinner than the width Me in the right side region SR other than the intermediate region SC. In this way, double exposure is performed on an exposed portion 111LR located on the intermediate region SC of the photoresist film 111, and single exposure is performed on an exposed portion 111Ld of the left side region SL successively extending from the intermediate region SC.

Since exposure is doubly performed in the intermediate region SC, the width Mc of a latent image pattern in the intermediate region SC including the exposed portion 111LR formed on the photoresist film 111 can become larger than each of the width Mc' and the width Mc" (Mc' & Mc"<Mc). Furthermore, if there are no influences of diffracted light, acid, and misregistration mentioned above, a relationship of Mc' & Mc"=Mc can be obtained.

Setting the width Mc' and the width Mc" to appropriate values enables adjusting the cumulated exposure amount in the intermediate region SC and bringing the width Mc of a latent image pattern in the intermediate region SC close to the widths Md and Me of latent image patterns in regions other than the intermediate region SC. While, in the present example, a relationship of Mc=Md & Me is obtained, a relationship of Mc<Md & Me can be employed.

Development processing is performed on a photoresist film on which latent images have been formed in the above-described way, so that a resist pattern 111D is formed. The resist pattern 111D is formed in such a manner that pattern dimensions on the developed photoresist film in the intermediate region SC get close to pattern dimensions on the developed photoresist film in regions other than the intermediate region SC. This means that a difference between the width Mc and the width Md becomes smaller than a difference between the width Mc" and the width Md (|Mc−Md|<|Mc"−Md|).

In the manufacturing method in the second exemplary embodiment, each of the widths Mc' and Mc" of the exposed portions 111Lc and 111Rc of the intermediate region SC, which is a double exposure portion, is set smaller than each of the width Md of the left side region SL and the width Me of the right side region SR, each of which is a single exposure region. The second exemplary embodiment can thereby prevent or reduce short circuit between adjacent patterns more appropriately than the first exemplary embodiment. Moreover, the second exemplary embodiment enables making the width of a latent image pattern in the intermediate region SC including the exposed portion 111LR smaller than that in the first exemplary embodiment, and is, therefore, more advantageous than the first exemplary embodiment in terms of miniaturization.

Third Exemplary Embodiment

FIGS. 7A to 7F illustrate a method for manufacturing a semiconductor device APR according to a third exemplary embodiment. The semiconductor device APR in the third exemplary embodiment differs in regions which are exposed on the photoresist film 111 from that in each of the first and second exemplary embodiments. In the semiconductor device APR in the third exemplary embodiment, photomasks PML and PMR similar to those in the second exemplary embodiment can be used.

Figure 7A:
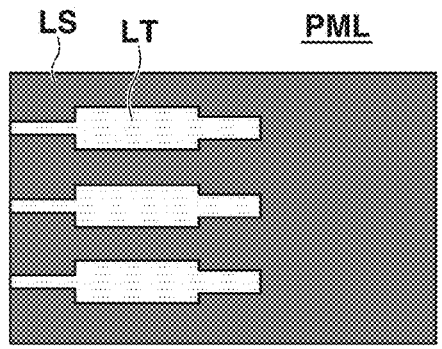
FIGS. 7A, 7B, 7C, 7D, 7E, and 7F are schematic diagrams illustrating a semiconductor device and a manufacturing method.
Figure 7C:
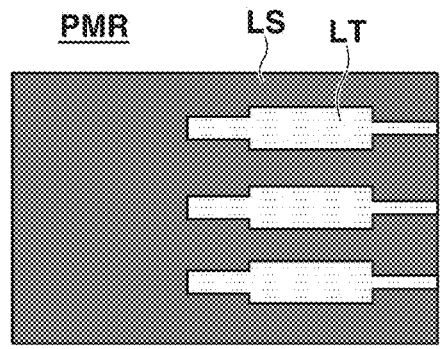
Figure 7B:
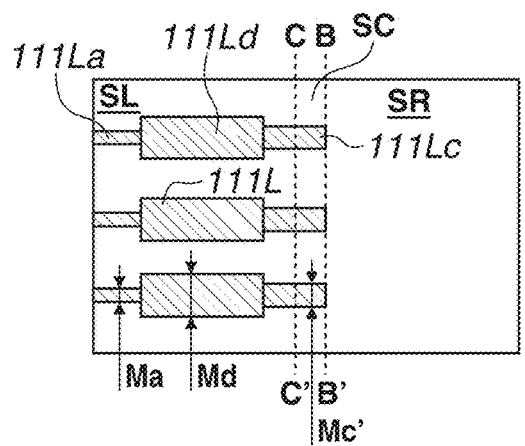
Figure 7D:
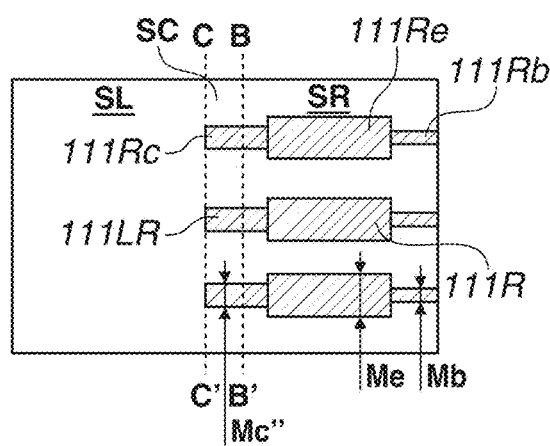

FIG. 7A illustrates a pattern on the photomask PML, which is used at the time of exposing the left side region SL. FIG. 7B illustrates a left side exposure pattern 111L with which to expose the photoresist film 111. FIG. 7C illustrates a pattern on the photomask PMR, which is used at the time of exposing the right side region SR. FIG. 7D illustrates a right side exposure pattern 111R with which to expose the photoresist film 111.

The third exemplary embodiment satisfies a relationship of Mc' & Mc"<Md & Me. The third exemplary embodiment satisfies a relationship of Ma & Mb<Mc' & Mc" ≤Mc≤Md & Me. Moreover, the third exemplary embodiment satisfies a relationship of Wa & Wb<We' & We"<We Wd & We.

In the third exemplary embodiment, as illustrated in FIG. 7A, a pattern width on the photomask PML is partially thinned in a region corresponding to the intermediate region SC and in a part of a region corresponding to the left side region SL. As a result, as illustrated in FIG. 7B, exposure is performed with the left side exposure pattern 111L, with which to expose the photoresist film 111, in such a manner that the width Mc' in the intermediate region SC is thinner than the width Md in the left side region SL other than the intermediate region SC. Moreover, an end portion of the left side region SL on the side of the intermediate region SC is exposed with the width Mc'. Moreover, in the third exemplary embodiment, as illustrated in FIG. 7C, a pattern width on the photomask PMR is partially thinned in a region corresponding to the intermediate region SC and in a part of a region corresponding to the right side region SR. As a result, as illustrated in FIG. 7D, exposure is performed with the right side exposure pattern 111R, with which to expose the photoresist film 111, in such a manner that the width Mc" in the intermediate region SC is thinner than the width Me in the right side region SR other than the intermediate region SC. Moreover, an end portion of the right side region SR on the side of the intermediate region SC is exposed with the width Mc". As with the second exemplary embodiment, due to an influence of double exposure in the intermediate region SC, a relationship of Mc' & Mc"<Mc can be obtained.

Figure 7E:
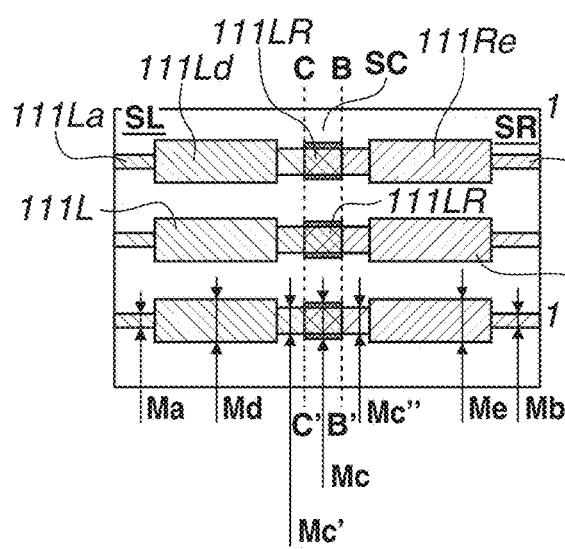
Figure 7F:
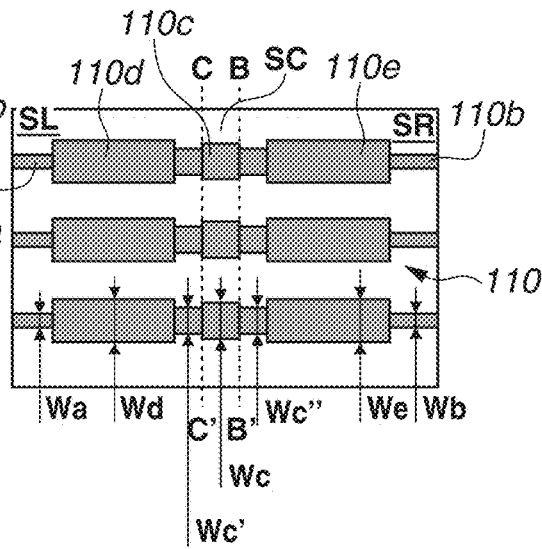

Moreover, in the third exemplary embodiment, a distance between the line B-B' and the line C-C' differs from that in the second exemplary embodiment. Under such a relationship, setting the width Mc' and the width Mc" of exposure patterns in the intermediate region SC to appropriate values also enables bringing dimensions of latent image patterns in the intermediate region SC close to dimensions of latent image patterns in regions other than the intermediate region SC, as illustrated in FIG. 7E.

Fourth Exemplary Embodiment

FIGS. 8A to 8F illustrate a method for manufacturing a semiconductor device APR according to a fourth exemplary embodiment. The semiconductor device APR in the fourth exemplary embodiment differs in regions which are exposed on the photoresist film 111 from that in each of the first, second, and third exemplary embodiments. In the semiconductor device APR in the fourth exemplary embodiment, photomasks PML and PMR similar to those in the second exemplary embodiment can be used.

Figure 8A:
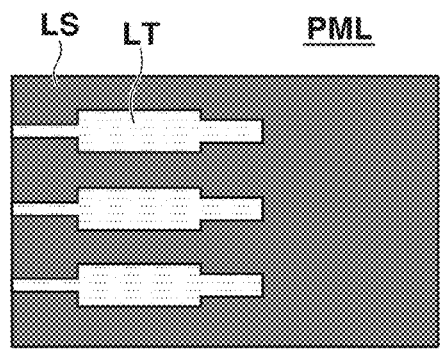
FIGS. 8A, 8B, 8C, 8D, 8E, and 8F are schematic diagrams illustrating a semiconductor device and a manufacturing method.
Figure 8C:
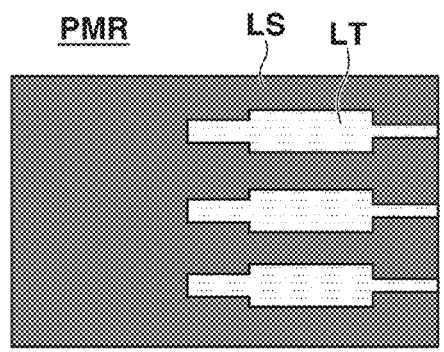
Figure 8B:
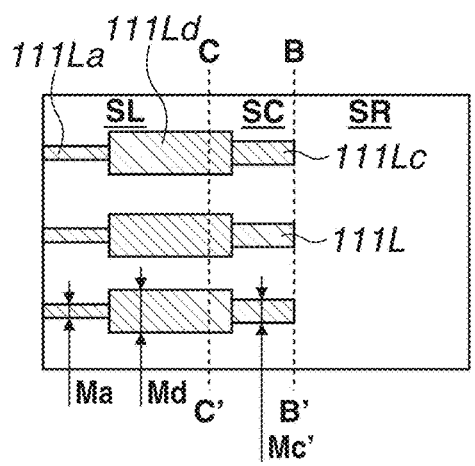
Figure 8D:
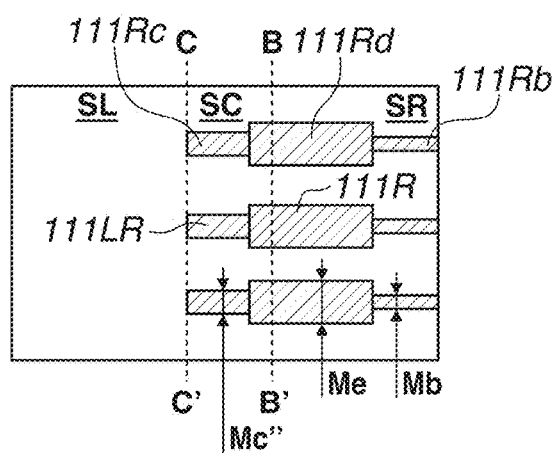

FIG. 8A illustrates a pattern on the photomask PML, which is used at the time of exposing the left side region SL. FIG. 8B illustrates a left side exposure pattern 111L with which to expose the photoresist film 111. FIG. 8C illustrates a pattern on the photomask PMR, which is used at the time of exposing the right side region SR. FIG. 8D illustrates a right side exposure pattern 111R with which to expose the photoresist film 111.

The fourth exemplary embodiment satisfies a relationship of Mc' & Mc"<Md & Me. The fourth exemplary embodiment satisfies a relationship of Ma & Mb<Mc' & Mc"≤Mc≤Md & Me. Moreover, the fourth exemplary embodiment satisfies a relationship of Wa & Wb<We<Wd & We.

In the fourth exemplary embodiment, as illustrated in FIG. 8A, a pattern width on the photomask PML is partially thinned in a region corresponding to an end portion of the intermediate region SC on the side of the right side region SR. As a result, as illustrated in FIG. 8B, exposure is performed with the left side exposure pattern 111L, with which to expose the photoresist film 111, in such a manner that the width Mc' of the intermediate region SC on the side of the right side region SR is thinner than the width Md in the left side region SL other than the intermediate region SC. Moreover, in the fourth exemplary embodiment, as illustrated in FIG. 8C, a pattern width on the photomask PMR is partially thinned in a region corresponding to an end portion of the intermediate region SC on the side of the left side region SL. As a result, as illustrated in FIG. 8D, exposure is performed with the right side exposure pattern 111R, with which to expose the photoresist film 111, in such a manner that the width Mc" of the intermediate region SC on the side of the left side region SL is thinner than the width Me in the right side region SR other than the intermediate region SC.

Figure 8E:
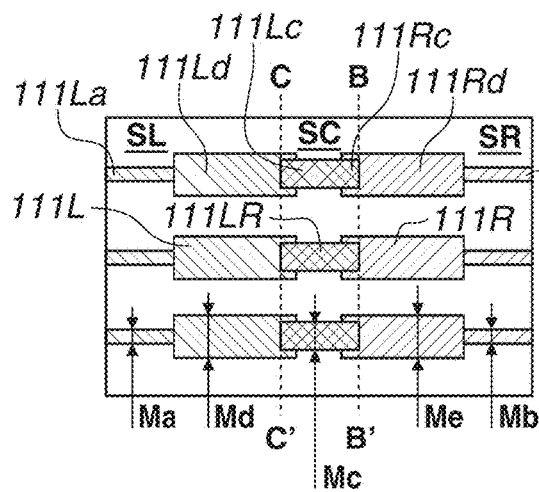
Figure 8F:
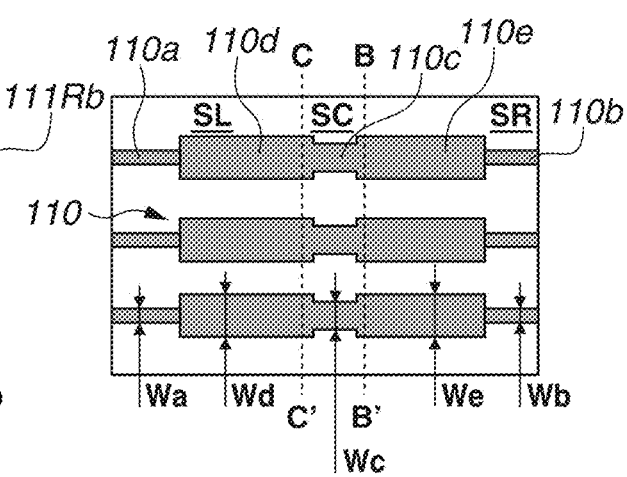

Moreover, in the fourth exemplary embodiment, a distance between the line B-B' and the line C-C' differs from that in the second exemplary embodiment. Under such a relationship, setting the width Mc' and the width Mc" of exposure patterns in the intermediate region SC to appropriate values also enables bringing dimensions of latent image patterns in the intermediate region SC close to dimensions of latent image patterns in regions other than the intermediate region SC, as illustrated in FIG. 8E. Furthermore, in FIG. 8E, regions in which a latent image is formed not with only the left side exposure shot L or not with only the right side exposure shot R and a latent image is formed due to an influence of acid or double exposure caused by diffracted light, such as those mentioned above, are omitted from illustration. Moreover, while FIG. 8E illustrates a case where a relationship of Ma & Mb<Mc' & Mc"<Mc<Md & Me is obtained, the width Mc can be formed equal to each of the width Md and the width Me to obtain a relationship of We=Wd & & We. In this case, portions thicker than each of the width Md and the width Me can be formed near the line B-B' and near the line C-C', which are end portions of the intermediate region SC.

Fifth Exemplary Embodiment

FIGS. 9A to 9F illustrate a method for manufacturing a semiconductor device APR according to a fifth exemplary embodiment. The semiconductor device APR in the fifth exemplary embodiment differs in regions which are exposed on the photoresist film 111 from that in each of the first, second, third, and fourth exemplary embodiments. In the semiconductor device APR in the fifth exemplary embodiment, photomasks PML and PMR similar to those in the second exemplary embodiment can be used.

The fifth exemplary embodiment satisfies a relationship of Mc' & Mc"<Md & Me. The fifth exemplary embodiment satisfies a relationship of Ma & Mb<Mc' & Mc" ≤Mc<Md & Me or a relationship of Ma & Mb<Mc' & Mc"<Md & Me<Mc. Moreover, the fifth exemplary embodiment satisfies a relationship of Wa & Wb<We<Wd & We or a relationship of Wa & Wb<Wd & We<Wc.

The fifth exemplary embodiment is directed to a case where misregistration has occurred between photomasks for the left side region SL and the right side region SR in the second exemplary embodiment. FIG. 9E illustrates a state in which exposure has been performed with the right side exposure shot R deviating downward in FIG. 9E with respect to the left side exposure shot L.

In the fifth exemplary embodiment, making the width Md larger than the width Ma enables preventing or reducing the wiring 110 from being broken in the intermediate region SC even when misregistration has occurred between photomasks in the above-mentioned way. Additionally, in the left side region SL and the right side region SR, in which there is no influence of photomask misregistration, it is possible to form minute patterns with the width Ma and the width Mb.

Furthermore, in FIG. 9E, regions in which a latent image is formed not with only the left side exposure shot L or not with only the right side exposure shot R and a latent image is formed due to an influence of acid or double exposure caused by diffracted light, such as those mentioned above, are omitted from illustration. In the fifth exemplary embodiment, regions in which latent images can be formed due to the influence of acid generated in a double exposure region are located outside the exposed portion 111Lc and the exposed portion 111Rc. Moreover, in the fifth exemplary embodiment, since misregistration in vertical direction in FIG. 9E is occurring between photomasks for the left side region SL and the right side region SR, there is almost no effect of a latent image being formed due to double exposure caused by diffracted light.

Moreover, in the fifth exemplary embodiment, since, due to misregistration occurring between photomasks for the left side region SL and the right side region SR, in the intermediate region SC, the area of a double exposure region becomes smaller than in a case where there is no misregistration between photomasks, the cumulated exposure amount in the double exposure region decreases. Thus, the amount of generation of acid in the double exposure region decreases. Moreover, a region in which double exposure is performed with diffracted light caused by the left side exposure shot L and diffracted light caused by the right side exposure shot R decreases. These effects can make the width of a latent image pattern in the intermediate region SC thinner than in a case where there is no misregistration between photomasks for the left side region SL and the right side region SR.

Moreover, in the fifth exemplary embodiment, due to misregistration occurring between photomasks for the left side region SL and the right side region SR, in the intermediate region SC, a width which is exposed can become thicker by an amount corresponding to the amount of occurrence of misregistration. This effect can make the width of a latent image pattern in the intermediate region SC thicker than in a case where there is no misregistration between photomasks for the left side region SL and the right side region SR. In the fifth exemplary embodiment, which of a relationship of Ma & Mb<Mc' & Mc"≤Mc<Md & Me and a relationship of Ma & Mb<Mc' & Mc"<Md & Me<Mc is satisfied depends on which of the above-mentioned effect which can make the width of a latent image in the intermediate region SC thinner and the above-mentioned effect which can make the width of a latent image in the intermediate region SC thicker emerges strongly.

Sixth Exemplary Embodiment

Figure 11A:
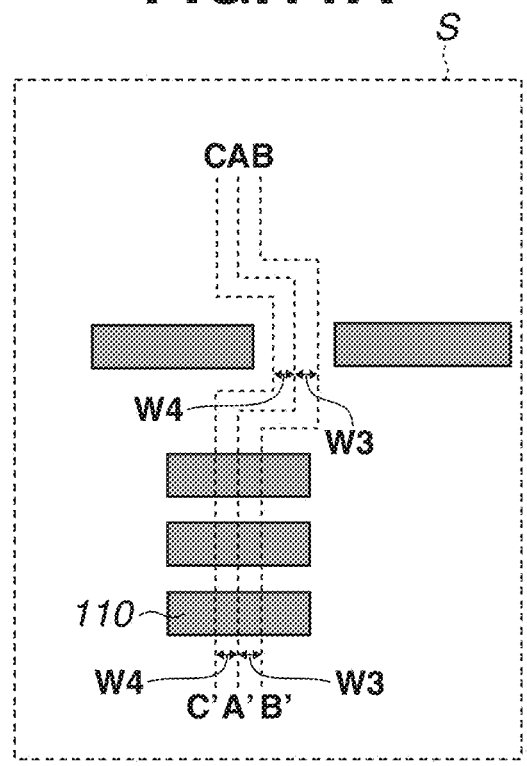
FIGS. 11A, 11B, 11C, and 11D are schematic diagrams illustrating semiconductor devices.

A sixth exemplary embodiment can be applied to any one of the first to fifth exemplary embodiments. FIG. 11A illustrates an enlarged view of the line A-A', the line B-B', and the line C-C' in a range S in the device region DR illustrated in FIG. 1C and a relationship between such lines and the wiring 110. In this way, the line A-A', the line B-B', and the line C-C' can be made meandering according to patterns, for example, in such a way as to avoid patterns.

Figure 11B:
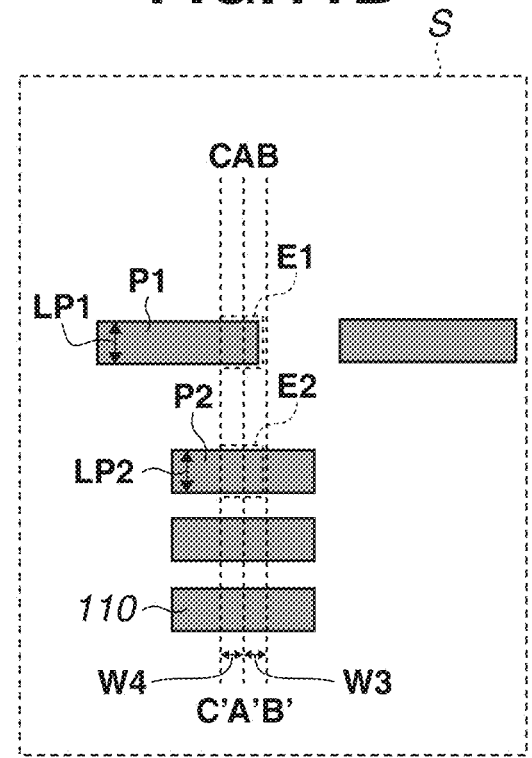

FIG. 11B illustrates a case where the line A-A', the line B-B', and the line C-C' are set as straight lines with respect to the same wiring 110 as that illustrated in FIG. 11A. In the case of a situation illustrated in FIG. 11B, a pattern P1 which straddles the line A-A' but does not reach the line B-B' occurs. At this time, the cumulated exposure amount in a double exposure region is compared between the pattern P1 and a pattern P2 which straddles the line A-A' and extends to the right side region across the line B-B'. Suppose that the line width of the pattern P1 is denoted by LP1, the double exposure region of the pattern P1 is denoted by E1, the line width of the pattern P2 is denoted by LP2, and the double exposure region of the pattern P2 is denoted by E2. Even in a case where the line widths LP1 and LP2 are equal to each other, the areas of the region E1 and the region E2 differ. The cumulated exposure amount in the double exposure region may thereby become different between the pattern P1 and the pattern P2, so that the line width in the double exposure region may become different between the pattern P1 and the pattern P2. Making the line A-A', the line B-B', and the line C-C' meandering to avoid the pattern P1 as illustrated in FIG. 11A enables eliminating the necessity of dividing the pattern P1 into portions for the photomask used for exposure on the left side region SL and the photomask used for exposure on the right side region SR.

Seventh Exemplary Embodiment

Figure 11C:
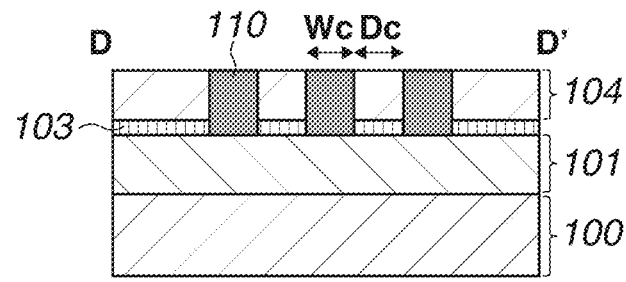
Figure 11D:
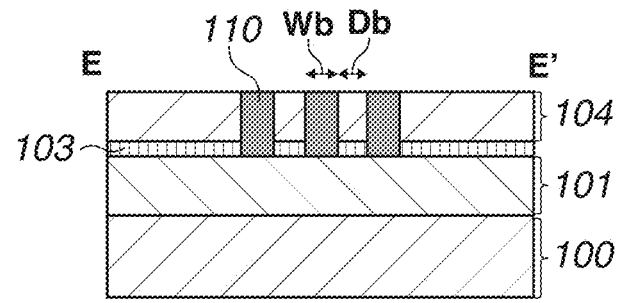

FIGS. 11C and 11D are sectional views of a semiconductor device APR, which is manufactured by a manufacturing method in a seventh exemplary embodiment. FIGS. 2A and 2B are plan views of the semiconductor device APR, which is manufactured by the manufacturing method in the seventh exemplary embodiment. FIGS. 11C and 11D illustrate cross sections of the semiconductor device APR in the seventh exemplary embodiment. FIG. 11C illustrates a cross section taken along the division center line A-A' illustrated in FIGS. 2A and 2B. FIG. 11D illustrates a cross section of a region located away from the division center line A-A'.

The semiconductor device APR includes a silicon layer serving as a semiconductor layer 100, and, on the semiconductor layer 100, an element functional layer (not illustrated) in which, for example, a photoelectric conversion portion, a transistor, and an isolation structure are formed is formed.

The element functional layer can be formed with divisional exposure, or can be formed with one-shot exposure using an exposure apparatus which has a maximum exposure region widened with a reduced resolution. Moreover, such divisional exposure and one-shot exposure can be selectively used depending on the degree of miniaturization in a plurality of photolithography processes required for forming the element functional layer.

On the element functional layer, an interlayer insulating film 101 made from silicon oxide is formed, and a contact plug made from tungsten is formed in the interlayer insulating film 101. Then, on the interlayer insulating film 101, there are formed a first insulator film 103 made from silicon carbide and a second insulator film 104 serving as an interlayer insulating film made from silicon oxide. Wirings 110 made from copper are formed in the first insulator film 103 and the second insulator film 104 serving as an interlayer insulating film.

As illustrated in FIG. 11C, the wirings 110 include portions in which the wirings 110 are formed with a width Wc and at an interval Dc on the division center line A-A'. Moreover, as illustrated in FIG. 11D, the wirings 110 include portions in which the wirings 110 are formed with a width Wb and at an interval Db in a region located away from the division center line A-A'. Here, the width Wc is larger than the width Wb, and the interval Dc is larger than the interval Db.

Eighth Exemplary Embodiment

Figure 12:
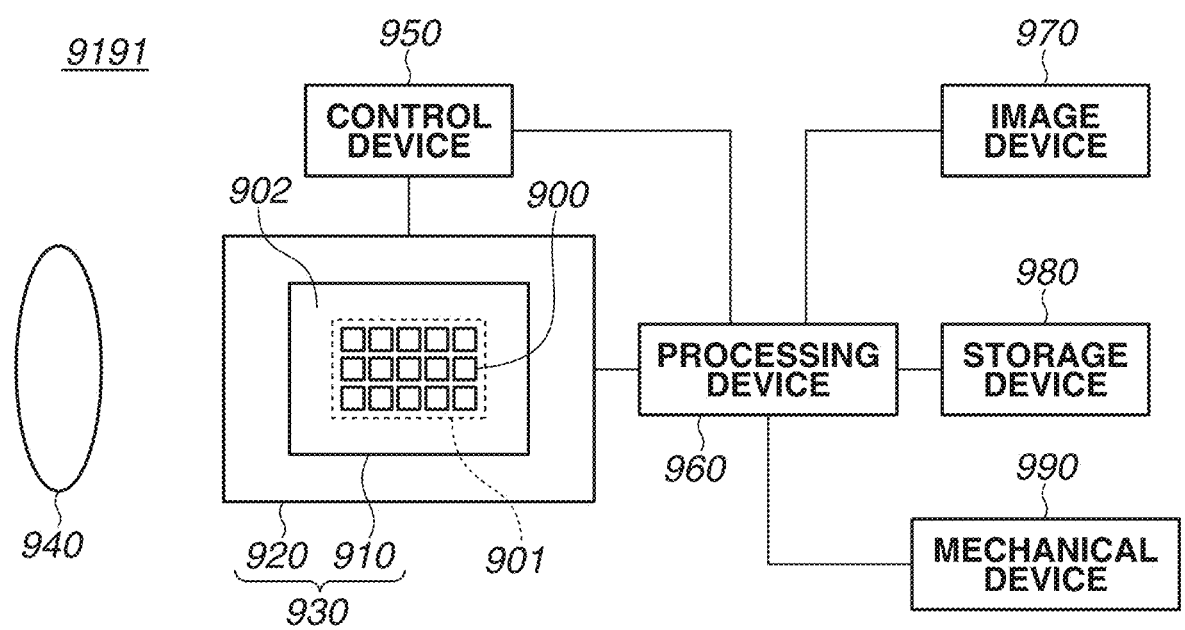
FIG. 12 is a schematic diagram illustrating an apparatus.

FIG. 12 illustrates an apparatus 9191 including a semiconductor device 930. An eighth exemplary embodiment is can be applied to any one of the first to seventh embodiments. FIG. 12 is a schematic diagram illustrating the apparatus 9191, which includes the semiconductor device 930 according to the present exemplary embodiment. The apparatus 9191 including the semiconductor device 930 is described in detail. The semiconductor device 930 has characteristics in the structure and/or manufacturing method described above with respect to the semiconductor device APR. The semiconductor device 930 includes a central portion 901, in which circuit units 900 are arranged, and a peripheral portion 902, which is located around the central portion 901. The pixel portion 11 described with reference to FIG. 1A is equivalent to the central portion 901, and the signal processing circuit 12 described with reference to FIG. 1A is provided in the peripheral portion 902. The semiconductor device 930 includes a semiconductor device portion 910, and the semiconductor device portion 910 includes a semiconductor layer 100 included in the semiconductor device APR. The semiconductor device 930 can include, in addition to the semiconductor device portion 910 including the semiconductor layer 100, a package 920, in which the semiconductor device portion 910 is contained. The package 920 can include a base body, to which the semiconductor device portion 910 is fixed, and a cover body such as a glass film, which faces the semiconductor device portion 910. The package 920 can further include a junction member, such as a bonding wire or bump, which interconnects a terminal provided in the base body and a terminal provided in the semiconductor device portion 910.

The apparatus 9191 can include at least one of an optical device 940, a control device 950, a processing device 960, an image device 970, a storage device 980, and a mechanical device 990. The optical device 940 is associated with the semiconductor device 930. The optical device 940 includes, for example, a lens, a shutter, a mirror, and a filter. The control device 950 controls the semiconductor device 930. The control device 950 is a semiconductor device, such as an application specific integrated circuit (ASIC).

The processing device 960 processes a signal which has been output from the semiconductor device 930 or a signal, which is to be input to the semiconductor device 930. The processing device 960 is a semiconductor device, such as a central processing unit (CPU) or an ASIC, for configuring an analog front end (AFE) or a digital front end (DFE).

In a case where the semiconductor device 930 is a photoelectric conversion device (imaging device), the image device 970 is an electroluminescence (EL) display device or a liquid crystal display device for displaying information (image) obtained by the semiconductor device 930. In a case where the semiconductor device 930 is a display device, the image device 970 can be a photoelectric conversion device (imaging device) for capturing an image which is to be displayed on the semiconductor device 930.

The storage device 980 is a magnetic device or a semiconductor device portion for storing information (image), which is handled by the semiconductor device 930. The storage device 980 is a volatile memory, such as a static random access memory (SRAM) or a dynamic random access memory (DRAM), or a non-volatile memory, such as a flash memory or a hard disk drive.

The mechanical device 990 includes a moving portion or a propulsion portion, such as a motor or an engine. The apparatus 9191 displays a signal output from the semiconductor device 930 on the image device 970 or transmits a signal output from the semiconductor device 930 to the outside via a communication device (not illustrated) included in the apparatus 9191. For such reasons, it is favorable that the apparatus 9191 further includes, in addition to a storage circuit or computation circuit included in the semiconductor device 930, the storage device 980 and the processing device 960. The mechanical device 990 can be configured to be controlled based on a signal output from the semiconductor device 930.

Moreover, the apparatus 9191 is suitable for an electronic apparatus, such as an information terminal having an image capturing function (for example, a smartphone or a wearable terminal) or a camera (for example, a lens-interchangeable type camera, a compact camera, a video camera, or a monitoring camera). The mechanical device 990 in the camera can drive components of the optical device 940 for zooming, focusing, and shutter operations. Alternatively, the mechanical device 990 in the camera can drive the semiconductor device 930 for an image stabilizing operation.

Moreover, the apparatus 9191 can be a transport apparatus, such as a vehicle, a boat or ship, or an air vehicle. The mechanical device 990 in the transport apparatus can be used as a moving apparatus. The apparatus 9191 serving as a transport apparatus is suitable for an apparatus for transporting the semiconductor device 930 or an apparatus for assisting or automatizing driving (maneuvering) using an image capturing function. The processing device 960 for assisting or automatizing driving (maneuvering) can perform processing for operating the mechanical device 990 serving as a moving apparatus based on information obtained by the semiconductor device 930. Alternatively, the apparatus 9191 can be medical equipment, such as an endoscope, measurement equipment including a distance measuring sensor, analytical equipment including an electron microscope, or office equipment including a copying machine or a printer.

According to the above-described exemplary embodiments, forming excellent wirings is enabled. Accordingly, it is possible to heighten the value of a semiconductor device. Heightening the value as mentioned herein refers to at least one of addition of a function, improvement of performance, improvement of characteristics, improvement of reliability, improvement of manufacturing yield, reduction of environmental load, reduction of cost, reduction in size, and reduction in weight.

Accordingly, using the semiconductor device 930 according to the present exemplary embodiment for the apparatus 9191 also enables improving the value of the apparatus 9191. For example, when the semiconductor device 930 is mounted on a transport apparatus to be used for performing image capturing of the outside of the transport apparatus or measuring the external environment thereof, excellent performance can be attained. Thus, in manufacturing and selling transport apparatuses, determining to mount a semiconductor device according to the present exemplary embodiment on the transport apparatus is advantageous in terms of heightening the performance of the transport apparatus itself. Particularly, the semiconductor device 930 is suitable for a transport apparatus which performs drive assist and/or automatic driving of the transport apparatus using information obtained by a semiconductor device.

Example 1

Figure 10A:
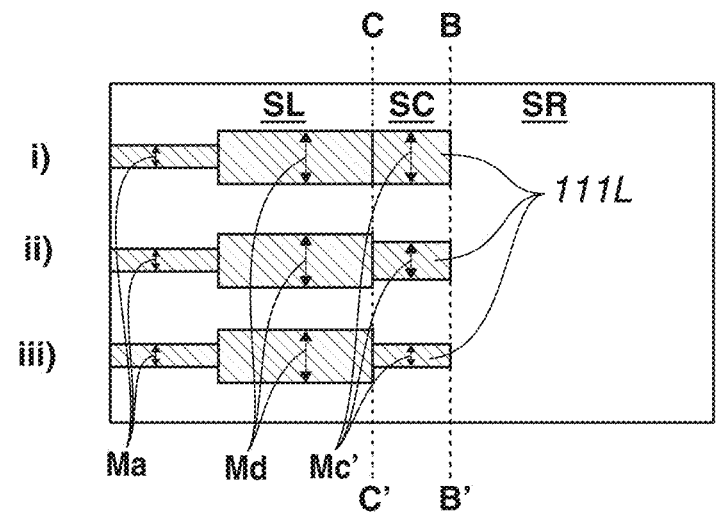
FIGS. 10A, 10B, and 10C are schematic diagrams illustrating a semiconductor device and a manufacturing method.
Figure 10B:
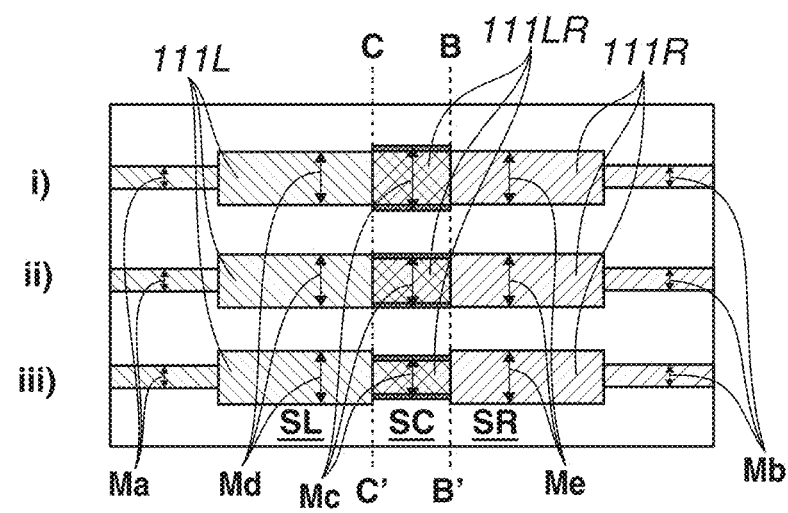
Figure 10C:
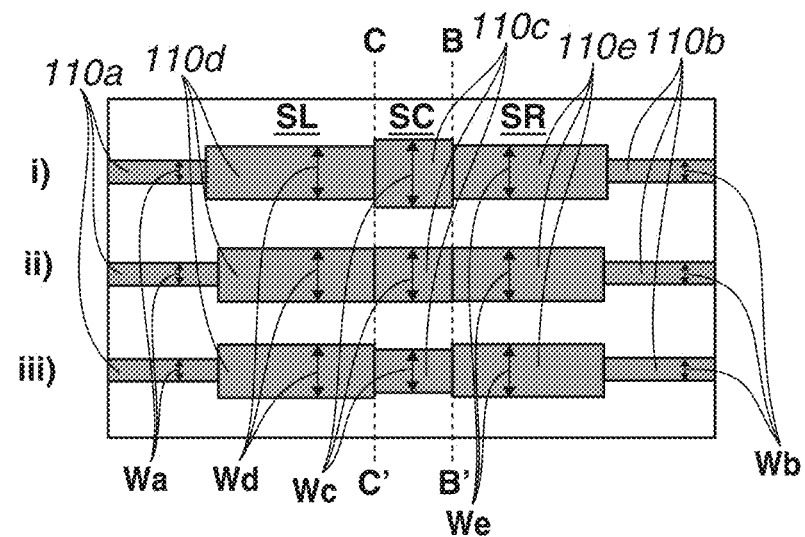

An example 1 in which the manufacturing method forms the wiring 110 using an exposure apparatus with a wavelength 193 nm using an ArF light source and a maximum exposure region 26 mm×33 mm is described. In the example 1, in a configuration illustrated in FIGS. 5A to 5F as the first exemplary embodiment, each of the width Ma and the width Mb is set to 120 nm, each of the width Mc' and the width Mc" is set to 230 nm, and each of the width Md and the width Me is set to 230 nm. Moreover, the length of a portion, which is exposed with each of the width Mc' and the width Mc", i.e., the length from the line B-B' to the line C-C', is set to 200 nm. Moreover, the length of a portion, which is exposed with each of the width Md and the width Me is set to 200 nm. This corresponds to a row i) illustrated in FIGS. 10A and 10B. This enables forming a wiring 110 in which each of the width Wa and the width Wb is 120 nm, the width Wc is 290 nm, and each of the width Wd and the width We is 230 nm. This corresponds to a row i) illustrated in FIG. 10C.

Here, each of the distance Da and the distance Db illustrated in FIG. 2B is 120 nm, and the distance Dc is 170 nm. Furthermore, as in a configuration illustrated in FIGS. 9A to 9F as the fifth exemplary embodiment, misregistration may occur in the Y-direction between the photomask PML and the photomask PMR. Moreover, misregistration may also occur in the X-direction illustrated in FIG. 2A between the photomask PML and the photomask PMR. If the amount of misregistration is up to 60 nm, it is highly likely that, even when misregistration occurs in the Y-direction illustrated in FIG. 2A between the photomask PML and the photomask PMR, neither breaking nor short circuit occurs in the wiring Q1, the wiring Q2, and the wiring Q3.

When misregistration has occurred by 60 nm in the Y-direction illustrated in FIG. 2A between the photomask PML and the photomask PMR, the distance Dc illustrated in FIG. 2B has become 120 nm. If the amount of misregistration is any larger than that, the distance Dc illustrated in FIG. 2B becomes smaller than each of the distance Da and the distance Db illustrated in FIG. 2B, so that short circuit becomes highly likely to occur in a portion associated with the distance Dc illustrated in FIG. 2B.

In the present example, the length of each of portions which are exposed with the width Md and the width Me is set to 200 nm. Thus, even in a case where misregistration has occurred in the X-direction illustrated in FIG. 2A between the photomask PML and the photomask PMR, the area of a double exposure region has changed, and the cumulated exposure amount in the double exposure region has changed, it is possible to reduce such an influence from reaching up to regions which are exposed with the width Ma and the width Mb.

Example 2

An example 2 in which the manufacturing method forms the wiring 110 using an exposure apparatus with a wavelength 193 nm using an ArF light source and a maximum exposure region 26 mm×33 mm is described. In the example 2, in a configuration illustrated in FIGS. 6A to 6F as the second exemplary embodiment, each of the width Ma and the width Mb is set to 120 nm, each of the width Mc' and the width Mc" is set to 180 nm, and each of the width Md and the width Me is set to 230 nm. Moreover, the length of a portion, which is exposed with each of the width Mc' and the width Mc", i.e., the length from the line B-B' to the line C-C', is set to 200 nm. Moreover, the length of a portion, which is exposed with each of the width Md and the width Me is set to 200 nm. This corresponds to a row ii) illustrated in FIGS. 10A and 10B. This enables forming a wiring 110 in which each of the width Wa and the width Wb is 120 nm and each of the width We, the width Wd, and the width We is 230 nm. This corresponds to a row ii) illustrated in FIG. 10C. Here, each of the distance Da and the distance Db illustrated in FIG. 2B is 120 nm, and the distance Dc is 230 nm. Furthermore, as in a configuration illustrated in FIGS. 9A to 9F as the fifth exemplary embodiment, misregistration may occur in the Y-direction between the photomask PML and the photomask PMR. Moreover, misregistration may also occur in the X-direction illustrated in FIG. 2A between the photomask PML and the photomask PMR. If the amount of misregistration is up to 95 nm, it is highly likely that, even when misregistration occurs in the Y-direction illustrated in FIG. 2A between the photomask PML and the photomask PMR, neither breaking nor short circuit occurs in the wiring Q1, the wiring Q2, and the wiring Q3.

When misregistration has occurred by 95 nm in the Y-direction illustrated in FIG. 2A between the photomask PML and the photomask PMR, the distance Dc illustrated in FIG. 2B has become 120 nm. If the amount of misregistration is any larger than that, the distance Dc illustrated in FIG. 2B becomes smaller than each of the distance Da and the distance Db illustrated in FIG. 2B, so that short circuit becomes highly likely to occur in a portion associated with the distance Dc illustrated in FIG. 2B.

In the present example, the length of each of portions which are exposed with the width Md and the width Me is set to 200 nm. Thus, even in a case where misregistration has occurred in the X-direction illustrated in FIG. 2A between the photomask PML and the photomask PMR, the area of a double exposure region has changed, and the cumulated exposure amount in the double exposure region has changed, it is possible to reduce such an influence from reaching up to regions which are exposed with the width Ma and the width Mb.

Example 3

An example 3 in which the manufacturing method forms the wiring 110 using an exposure apparatus with a wavelength 248 nm using a KrF light source and a maximum exposure region 26 mm×33 mm is described. In the example 3, in a configuration illustrated in FIGS. 6A to 6F as the second exemplary embodiment, each of the width Ma and the width Mb is set to 140 nm, each of the width Mc' and the width Mc" is set to 180 nm, and each of the width Md and the width Me is set to 240 nm. Moreover, the length of a portion, which is exposed with each of the width Mc' and the width Mc", i.e., the length from the line B-B' to the line C-C', is set to 300 nm. Moreover, the length of a portion, which is exposed with each of the width Md and the width Me is set to 150 nm. This corresponds to a row ii) illustrated in FIGS. 10A and 10B. This enables forming a wiring 110 in which each of the width Wa and the width Wb is 140 nm and each of the width Wc, the width Wd, and the width We is 240 nm. This corresponds to a row ii) illustrated in FIG. 10C. Here, each of the distance Da and the distance Db illustrated in FIG. 2B is 140 nm, and the distance Dc is 240 nm. Furthermore, as in a configuration illustrated in FIGS. 9A to 9F as the fifth exemplary embodiment, misregistration may occur in the Y-direction between the photomask PML and the photomask PMR. Moreover, misregistration may also occur in the X-direction illustrated in FIG. 2A between the photomask PML and the photomask PMR. If the amount of misregistration is up to 80 nm, it is highly likely that, even when misregistration occurs in the Y-direction illustrated in FIG. 2A between the photomask PML and the photomask PMR, neither breaking nor short circuit occurs in the wiring Q1, the wiring Q2, and the wiring Q3.

When misregistration has occurred by 80 nm in the Y-direction illustrated in FIG. 2A between the photomask PML and the photomask PMR, the distance Dc illustrated in FIG. 2B has become 140 nm. If the amount of misregistration is any larger than that, the distance Dc illustrated in FIG. 2B becomes smaller than each of the distance Da and the distance Db illustrated in FIG. 2B, so that short circuit becomes highly likely to occur in a portion associated with the distance Dc illustrated in FIG. 2B.

In the present example, the length of each of portions which are exposed with the width Md and the width Me is set to 150 nm. Thus, even in a case where misregistration has occurred in the X-direction illustrated in FIG. 2A between the photomask PML and the photomask PMR, the area of a double exposure region has changed, and the cumulated exposure amount in the double exposure region has changed, it is possible to reduce such an influence from reaching up to regions which are exposed with the width Ma and the width Mb.

Example 4

An example 4 in which the manufacturing method forms the wiring 110 using an exposure apparatus with a wavelength 193 nm using an ArF light source and a maximum exposure region 26 mm×33 mm is described. In the example 4, in a configuration illustrated in FIGS. 6A to 6F as the second exemplary embodiment, each of the width Ma and the width Mb is set to 120 nm, each of the width Mc' and the width Mc" is set to 120 nm, and each of the width Md and the width Me is set to 230 nm. Moreover, the length of a portion, which is exposed with each of the width Mc' and the width Mc", i.e., the length from the line B-B' to the line C-C', is set to 200 nm. Moreover, the length of a portion, which is exposed with each of the width Md and the width Me is set to 200 nm. This corresponds to a row iii) illustrated in FIGS. 10A and 10B. This enables forming a wiring 110 in which each of the width Wa and the width Wb is 120 nm, the width Wc is 160 nm, and each of the width Wd and the width We is 230 nm. This corresponds to a row iii) illustrated in FIG. 10C. Here, each of the distance Da and the distance Db illustrated in FIG. 2B is 120 nm, and the distance Dc is 300 nm. Moreover, as in a configuration illustrated in FIGS. 9A to 9F as the fifth exemplary embodiment, misregistration may occur in the Y-direction between the photomask PML and the photomask PMR. Moreover, misregistration may also occur in the X-direction illustrated in FIG. 2A between the photomask PML and the photomask PMR. If the amount of misregistration is up to 120 nm, it is highly likely that, even when misregistration occurs in the Y-direction illustrated in FIG. 2A between the photomask PML and the photomask PMR, neither breaking nor short circuit occurs in the wiring Q1, the wiring Q2, and the wiring Q3.

When misregistration has occurred by 120 nm or more in the Y-direction illustrated in FIG. 2A between the photomask PML and the photomask PMR, the exposed portion 111Lc and the exposed portion 111Rc become not overlapping each other, so that breaking becomes highly likely to occur in the wiring Q1, the wiring Q2, and the wiring Q3.

Ninth Exemplary Embodiment

In the following description, a ninth exemplary embodiment is described. Furthermore, in the following description and drawings, constituent elements which are in common with each other in a plurality of drawings are assigned the respective same reference characters. Thus, constituent elements which are in common with each other are described by mutually referring to a plurality of drawings, and the description of constituent elements with the respective same reference characters assigned thereto is not repeated as appropriate.

Figure 13A:
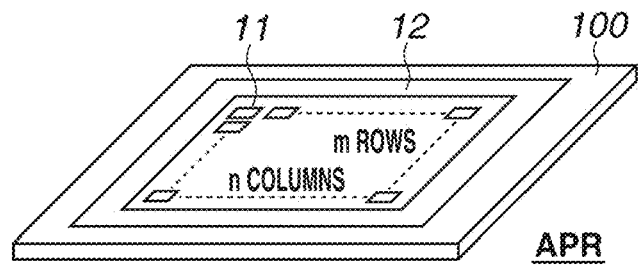
FIGS. 13A, 13B, and 13C are schematic diagrams illustrating a semiconductor device.

FIG. 13A illustrates a photoelectric conversion device as an example of a semiconductor device APR. The photoelectric conversion device is, for example, a complementary metal-oxide semiconductor (CMOS) image sensor, and can be used for, for example, an imaging apparatus, a distance measuring apparatus, or a light metering apparatus. The semiconductor device APR serving as a photoelectric conversion device is a semiconductor device in which a plurality of wirings 110 (FIG. 13C) each having a damascene structure is provided on a semiconductor layer 100. The semiconductor device APR includes a pixel portion 11, in which unit pixels each including a photoelectric conversion element are two-dimensionally arranged in m rows and n columns, and a signal processing circuit 12, which is formed around the pixel portion 11. The semiconductor device APR has a dimension greater than or equal to the maximum exposure region of an exposure apparatus (exposure machine), and cannot be manufactured by such an exposure apparatus using one-shot exposure. Thus, the semiconductor device APR is manufactured by a divisional exposure technique in which a device region is divided into a left side region and a right side region adjacent to each other and exposure is performed on the left side region and the right side region on an individual basis. For example, a wiring layer can be formed by divisional exposure. In the following description, a direction advancing toward a central portion of the semiconductor device APR on a plane thereof is referred to as an inner circumference side, and a direction opposite to the inner circumference side is referred to as an outer circumference side.

Figure 13B:
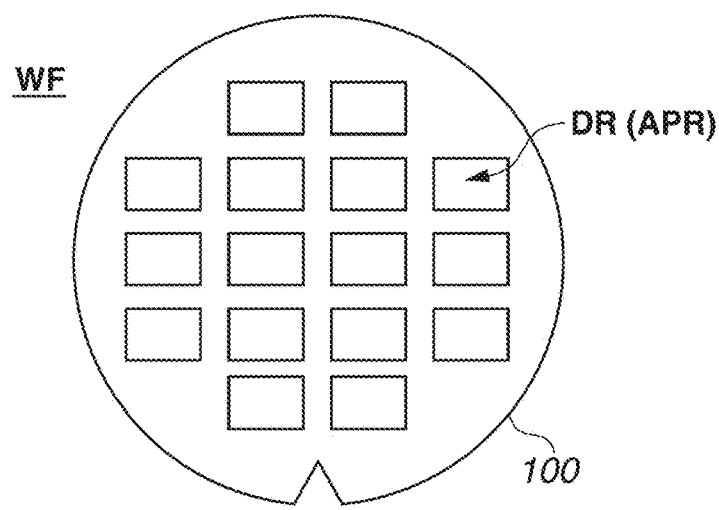

FIG. 13B is a plan view illustrating a plurality of device regions DR, which is formed on a wafer WF. The dimension of each device region DR is larger than the maximum exposure region of an exposure apparatus. Each device region DR is divided into regions each having a dimension smaller than or equal to the maximum exposure region of the exposure apparatus and is formed by divisional exposure in which exposure is performed on the respective regions on an individual basis.

Figure 13C:
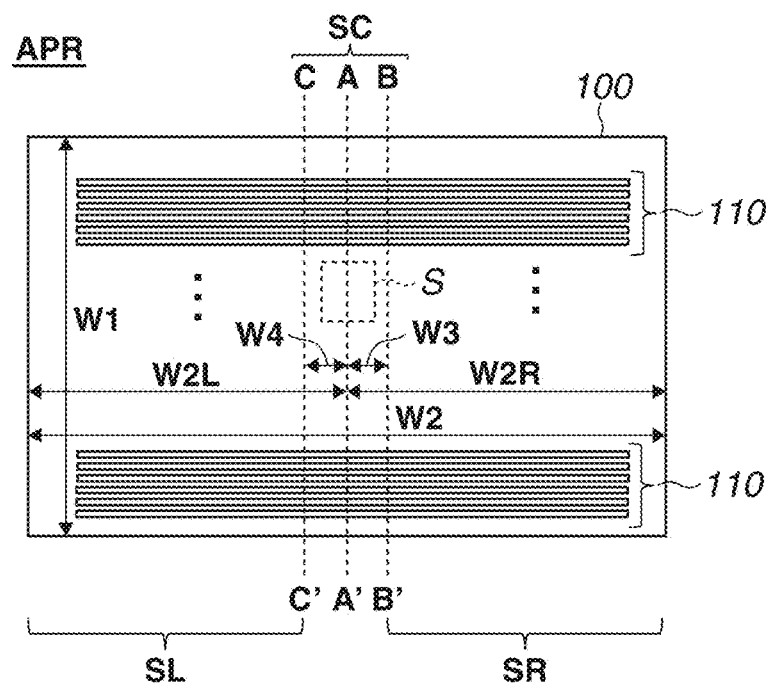

FIG. 13C is a conceptual diagram illustrating one device region DR. The device region DR is divided into at least a left side region SL and a right side region SR with respect to a line A-A' serving as a baseline, and the left side region SL and the right side region SR are exposed with use of the respective different photomasks. Hereinafter, the line A-A' is sometimes referred to as a "division center line". The left side region SL is defined by a region extending from the left end to a line C-C', and the right side region SR is defined by a region extending from the right end to a line B-B'. Hereinafter, the line C-C' is sometimes referred to as the "right end of the left side region", and the line B-B' is sometimes referred to as the "left end of the right side region". An intermediate region SC, which lies between the line B-B' and the line C-C', can be exposed at the time of exposing the left side region SL and can also be exposed at the time of exposing the right side region SR. In this way, since exposure is duplicated on the intermediate region SC, the intermediate region SC can also be referred to as a "duplication region". Furthermore, while, in the description of the present exemplary embodiment, the device region DR is divided into two regions, the division number can be three or more. Moreover, while, in the following example, the device region DR is divided into left and right side regions, the direction of division is optional and thus can be divided into upper and lower side regions.

The semiconductor device APR illustrated in FIG. 13A is formed in a state in which a plurality of device regions DR is two-dimensionally arranged on the wafer WF as illustrated in FIG. 13B, is subjected to an additional manufacturing process, and is then divided into individual semiconductor device portions (chips) by dicing (die cutting). The semiconductor device APR includes at least the thus-formed semiconductor device portion (chip). As described below, the semiconductor device APR can include, in addition to a semiconductor device portion, a package in which the semiconductor device portion is contained.

FIG. 13C illustrates dimensions of the device region DR of the semiconductor device APR, which is manufactured by a manufacturing method in the present exemplary embodiment. The length W1 in vertical direction of the semiconductor device APR is 33 mm or smaller, and the length W2 in horizontal direction thereof is larger than 33 mm. For example, the length W1 in vertical direction of the device region DR is 32 mm, and the length W2 in horizontal direction thereof is 42 mm. Accordingly, an exposure apparatus the maximum exposure region of which is 26 mm×33 mm cannot perform one-shot exposure on the device region DR.

A distance W2L between the reference line A-A', with respect to which to divide the device region DR into the left side region SL and the right side region SR, and the left side end portion of the device region DR is set to 26 mm or smaller, for example, to 21 mm. Moreover, a distance W2R between the reference line A-A' and the right side end portion of the device region DR is set to 26 mm or smaller, for example, to 21 mm. Moreover, a distance W3 between the line A-A' and the line B-B' is set to 10 nm to 1,000 nm, favorably, to 50 nm to 500 nm, for example, to 100 nm. Moreover, a distance W4 between the line A-A' and the line C-C' is set to 10 nm to 1,000 nm, favorably, to 50 nm to 500 nm, for example, to 100 nm.

Since the length W1 is 33 mm or smaller and the sum of the distance W2L and the distance W3 is 26 mm or smaller, the left side region SL and the intermediate region SC can be exposed by an exposure apparatus the maximum exposure region of which is 26 mm×33 mm.

Since the length W1 is 33 mm or smaller and the sum of the distance W2R and the distance W4 is 26 mm or smaller, the right side region SR and the intermediate region SC can be exposed by an exposure apparatus the maximum exposure region of which is 26 mm×33 mm.

Accordingly, a semiconductor device APR the length W1 of which is 33 mm or smaller and the length W2 of which is larger than 33 mm can be exposed with use of an exposure apparatus the maximum exposure region of which is 26 mm×33 mm and with the division number of the device region DR set to "2".

In this example, the distance W2L and the distance W2R are set equal to each other, but do not need to be equal to each other. Moreover, each of the line A-A', the line B-B', and the line C-C' is set to be a straight line, but can be set to be a meandering line as appropriate within a range in which the sum of the distance W2L and the distance W3 does not exceed the maximum exposure region depending on a pattern in the device region.

Since, in an exposure apparatus the maximum exposure region of which is 26 mm×33 mm, the marginal portion of the maximum exposure region may be in some cases lower in resolution than the central portion thereof, there may be a case where even an exposure apparatus the maximum exposure region of which is 26 mm×33 mm performs exposure using substantially only a part of the maximum exposure region. In such a case, divisional exposure can be applied to even a semiconductor device APR having a size smaller than 26 mm×33 mm. In other words, the size of a semiconductor device APR to which divisional exposure in the present exemplary embodiment is applied is not particularly limited.

The dimension of the pixel portion 11 illustrated in FIG. 13A is 36 mm±1 mm×24 mm±1 mm in the case of an image sensor of what is called the 35 mm full-size standard. In FIG. 13C, row wirings of the pixel portion 11 out of a plurality of wirings 110 in the semiconductor device APR are illustrated. The row wiring is a global wiring connected in common to a pixel group included in one pixel row. The row wiring is, for example, a signal line via which to transfer input signals (control signals) to a pixel group included in one pixel row. Moreover, the row wiring is, for example, a power line via which to supply electric power (power source potential or grounding potential) to a pixel group included in one pixel row. Furthermore, the column wiring is a global wiring intersecting with the row wiring and connected in common to a pixel group included in one pixel column. The row wiring and the column wiring need to extend at least from one end of the pixel portion 11 to the other end thereof. Thus, a distance from one end of the row wiring to the other end thereof can need to be a length greater than or equal to the horizontal width (36 mm±1 mm) of the pixel portion 11, and a distance from one end of the column wiring to the other end thereof can need to be a length greater than or equal to the vertical width (24 mm±1 mm) of the pixel portion 11. The column wiring is, for example, a signal line via which to transfer output signals (pixel signals) from a pixel group included in one pixel column. Moreover, the column wiring is, for example, a power line via which to supply electric power (power source potential or grounding potential) to a pixel group included in one pixel column. These row wirings and column wirings can be allocated to any one of a first wiring layer, a second wiring layer, a third wiring layer, and a fourth wiring layer, which are arranged in the order of nearer to the semiconductor layer 100. The first wiring layer can have a single damascene structure, and the second wiring layer, the third wiring layer, and the fourth wiring layer can have a dual damascene structure. Power lines serving as global wirings (column wirings) can be arranged in, for example, the first wiring layer and/or the second wiring layer. Signal lines serving as global wirings (row wirings) can be arranged in, for example, one of the third wiring layer and the fourth wiring layer (typically, the third wiring layer). Signal lines serving as global wirings (column wirings) can be arranged in, for example, the other of the third wiring layer and the fourth wiring layer (typically, the fourth wiring layer). In addition, local wirings are arranged in each wiring layer, and, particularly, many local wirings can be arranged in the first wiring layer. While, here, an example in which there are four wiring layers has been described, for example, the second wiring layer can be omitted and local wirings and power lines can be arranged in the first wiring layer. While allocation of global lines to wiring layers is not limited to the above-mentioned ones, in consideration of these relationships, a wiring having a length exceeding 33 mm can be a power line (row wiring) having a single damascene structure or a signal line (row wiring) having a dual damascene structure.

Figure 14A:
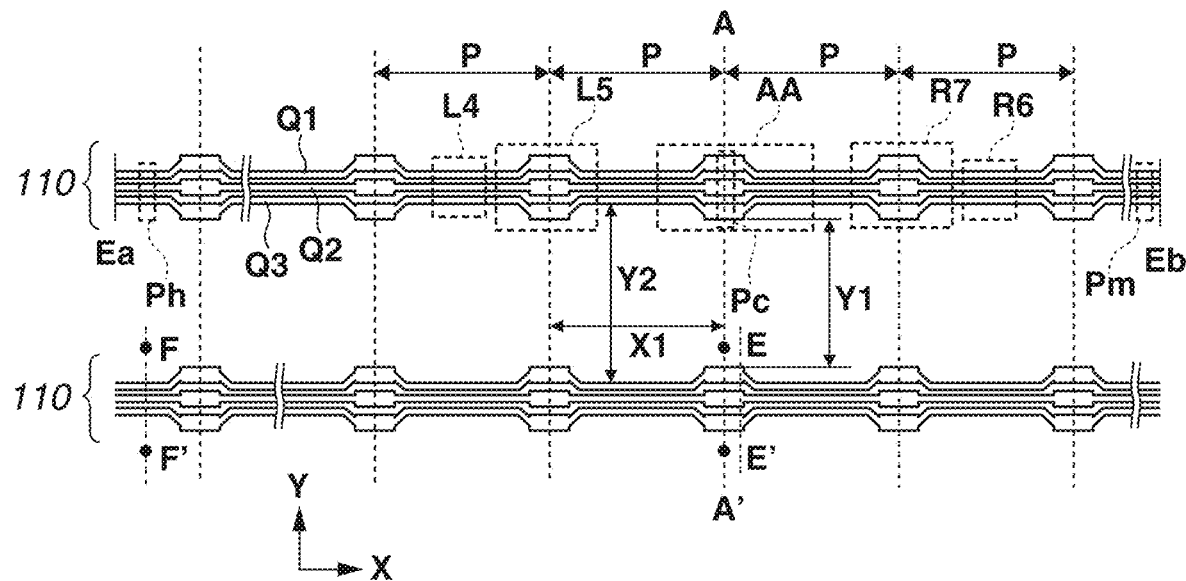
FIGS. 14A and 14B are schematic diagrams illustrating the semiconductor device.
Figure 14B:
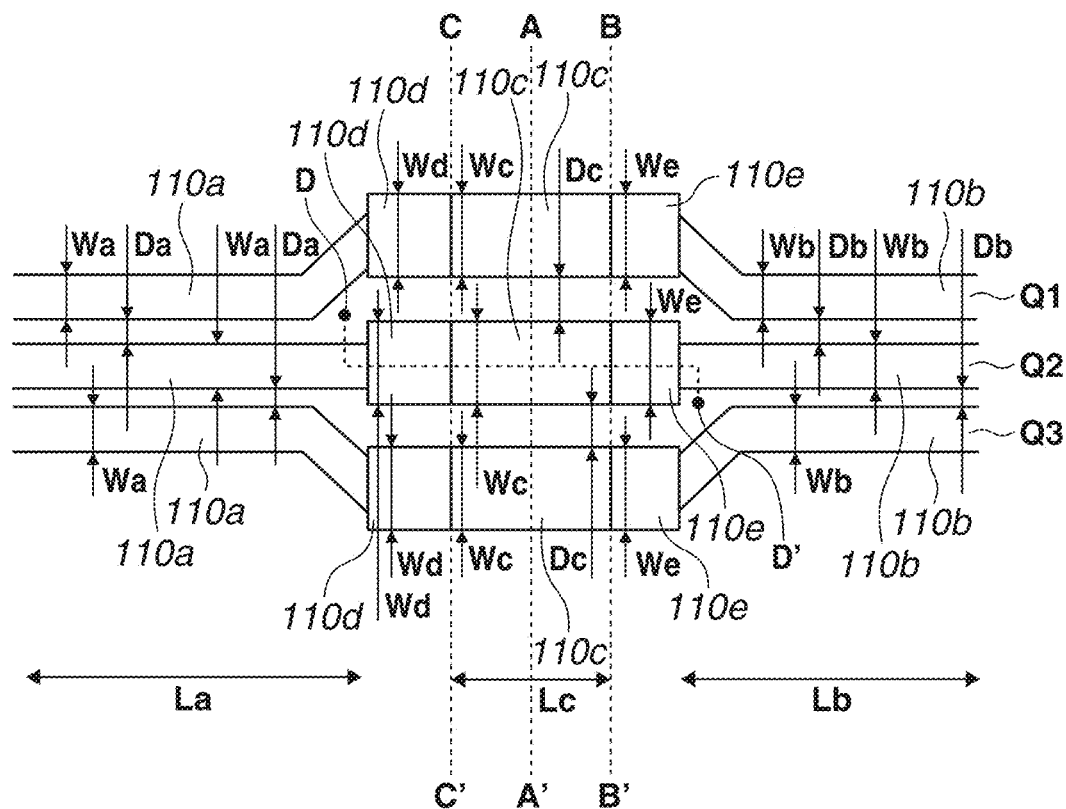
Figure 19A:
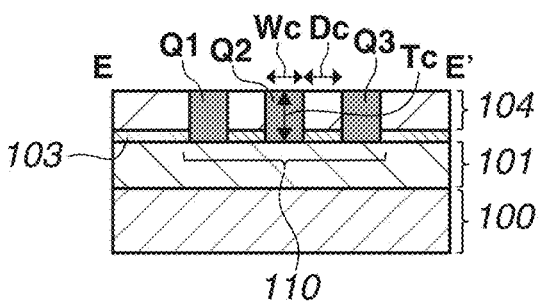
FIGS. 19A, 19B, 19C, 19D, and 19E are schematic diagrams illustrating a method for manufacturing a semiconductor device.
Figure 19B:
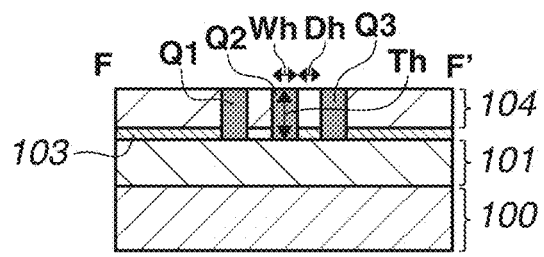

FIGS. 14A and 14B are plan views of the semiconductor device APR in the present exemplary embodiment. FIGS. 19A and 19B are sectional views of the semiconductor device APR in the present exemplary embodiment. FIG. 19A illustrates a cross section taken along the division center line A-A' illustrated in FIGS. 14A and 14B. FIG. 19B illustrates a cross section of a region located away from the division center line A-A'. The semiconductor device APR includes a silicon layer serving as a semiconductor layer 100, and, on the semiconductor layer 100, an element functional layer (not illustrated) in which, for example, a photoelectric conversion portion, a transistor, and an isolation structure are formed is formed. The element functional layer can be formed with divisional exposure, or can be formed with one-shot exposure using an exposure apparatus which has a maximum exposure region widened with a reduced resolution. Moreover, such divisional exposure and one-shot exposure can be selectively used depending on the degree of miniaturization in a plurality of photolithography processes required for forming the element functional layer. On the element functional layer, an interlayer insulating film 101 made from silicon oxide is formed, and a contact plug made from tungsten is formed in the interlayer insulating film 101. Then, on the interlayer insulating film 101, there are formed a first insulator film 103 made from silicon carbide and a second insulator film 104 serving as an interlayer insulating film made from silicon oxide. Wirings 110 made from copper are formed in the first insulator film 103 and the second insulator film 104 serving as an interlayer insulating film. As illustrated in FIG. 19A, the wirings 110 include portions in which the wirings 110 are formed with a width Wc and at an interval Dc on the intermediate region SC. Moreover, as illustrated in FIG. 19B, the wirings 110 include portions in which the wirings 110 are formed with a width Wh and at an interval Dh in each of the left side region SL and the right side region SR. Here, the width Wc is larger than the width Wh and the interval Dc is larger than the interval Dh, but the present exemplary embodiment is not limited to this.

FIG. 14A is a plan view of a plurality of wirings 110 in the semiconductor device APR. Each of wirings Q1, Q2, and Q3 has a damascene structure. The wiring Q1 and the wiring Q2 are adjacent to each other, and the wiring Q2 and the wiring Q3 are adjacent to each other. A distance between one end Ea of the wiring Q2 and the other end Eb thereof is larger than 33 mm. As mentioned above, the distance between one end Ea of the wiring Q2 and the other end Eb thereof can be 36 mm±1 mm or larger. While, here, one end Ea of the wiring Q2 and the other end Eb thereof has been described, the same also applies to one end Ea of each of the wiring Q1 and the wiring Q3 and the other end Eb thereof.

Each of the wirings Q1, Q2, and Q3 includes a portion Ph, a portion Pm, and a portion Pc, which lies between the portion Ph and the portion Pm, along a direction in which the wirings Q1, Q2, and Q3 extend. Here, the portion Ph and the portion Pm are set in such a manner that a distance between the portion Ph and the portion Pm is larger than 33 mm. In each of the wirings Q1, Q2, and Q3, the width Wmax of the portion Pc is the maximum width of each of the wirings Q1, Q2, and Q3 in a range from the portion Ph to the portion Pm. Each of the wirings Q1, Q2, and Q3 can include a portion (not illustrated) having a width Wmax' exceeding the width Wmax of the portion Pc outside the range from the portion Ph to the portion Pm. Thus, the maximum width Wmax' of each of the wirings Q1, Q2, and Q3 in the entirety of each of the wirings Q1, Q2, and Q3 can be larger than the width Wmax of the portion Pc (Wmax'>Wmax) or can be equal to the width Wmax of the portion Pc (Wmax'=Wmax). Thus, each of the wirings Q1, Q2, and Q3 only needs to have a width not exceeding the width Wmax of the portion Pc at least over a length of 33 mm. While, in the present example, the portion Pc is located within a range AA, the position of the portion Pc can be anywhere as long as between the portion Ph and the portion Pm. Typically, the portion Ph is located in the left side region SL, the portion Pm is located in the right side region SR, and the portion Pc is located in the intermediate region SC.

FIG. 19A illustrates a cross section of a portion having a structure equivalent to the portion Pc illustrated in FIG. 14A (a cross section taken along a line E-E' illustrated in FIG. 14A). In FIG. 19A, the maximum width Wmax of each of the wirings Q1, Q2, and Q3 is illustrated as a width Wc (Wmax=Wc). The thickness of a portion having the maximum width Wmax of each of the wirings Q1, Q2, and Q3 is illustrated as a thickness Tc. FIG. 19B illustrates a cross section of a portion having a structure equivalent to the portion Ph illustrated in FIG. 14A (a cross section taken along a line F-F' illustrated in FIG. 14A). The width of the portion Ph of each of the wirings Q1, Q2, and Q3 is illustrated as a width Wh. Furthermore, the width Wm in the portion Pm of each of the wirings Q1, Q2, and Q3 can be equal to the width Wh or can be different from the width Wh.

Since the width We of the portion Pc is the maximum width Wmax in a range from the portion Ph to the portion Pm, each of the width Wh and the width Wm does not exceed the width Wc. The width We can be larger than each of the width Wh and the width Wm (We>Wh & Wm) or the width We can be equal to each of the width Wh and the width Wm (We=Wh & Wm). Here, it is favorable that the maximum width Wmax is smaller than 230 nm. It is more favorable that the maximum width Wmax is smaller than 180 nm. In terms of preventing or reducing an increase in resistance of each of the wirings Q1, Q2, and Q3, it is more favorable that the maximum width Wmax is larger than 65 nm. The maximum width Wmax can be larger than or equal to 90 nm, and the maximum width Wmax can be larger than or equal to 120 nm. Making the width of each of the wirings Q1, Q2, and Q3 smaller than 230 nm in a range from the portion Ph to the portion Pm enables attaining miniaturization of each of the wirings Q1, Q2, and Q3. It is favorable that, as illustrated in FIG. 19A, the thickness Tc of the portion Pc is larger than each of the width Wh of the portion Ph and the width Wm of the portion Pm (Tc>Wh & Wm). Making the thickness Tc of the portion Pc larger than each of the width Wh and the width Wm enables preventing or reducing an increase in resistance of each of the wirings Q1, Q2, and Q3 even when miniaturizing (reducing the width of) each of the wirings Q1, Q2, and Q3. In FIG. 19B, the thickness Th of the portion Ph is illustrated. While, in the present example, the thickness Th is equal to the thickness Tc (Tc=Th), the thickness Th can be larger than the thickness Tc, or the thickness Th can be smaller than the thickness Tc. Similarly, the thickness Tm of the portion Pm can be larger than the thickness Tc, or the thickness Tm can be smaller than the thickness Tc. It is favorable that the thickness Th is larger than the width Wh. Making the thickness Th of the portion Ph larger than the width Wh enables preventing or reducing an increase in resistance of each of the wirings Q1, Q2, and Q3 even when miniaturizing (reducing the width of) each of the wirings Q1, Q2, and Q3. Similarly, it is favorable that the thickness Tm is larger than the width Wm. While, in the present example, the thickness Tm is equal to the thickness Th (Tm=Th), the thickness Tm can be larger than the thickness Th, or the thickness Tm can be smaller than the thickness Th. In order to miniaturize each of the wirings Q1, Q2, and Q3, it is favorable that each of the width Wh of the portion Ph and the width Wm of the portion Pm is smaller than 230 nm, it is more favorable that each of the width Wh of the portion Ph and the width Wm of the portion Pm is smaller than 180 nm, and it is furthermore favorable that each of the width Wh of the portion Ph and the width Wm of the portion Pm is smaller than 140 nm. In order to prevent or reduce an increase in resistance of each of the wirings Q1, Q2, and Q3 each having a length larger than or equal to 33 mm, it is favorable that each of the width Wh of the portion Ph and the width Wm of the portion Pm is larger than 65 nm. Each of the width Wh of the portion Ph and the width Wm of the portion Pm can be 90 nm or larger, or each of the width Wh of the portion Ph and the width Wm of the portion Pm can be 120 nm or larger. In order to prevent or reduce an increase in resistance of each of the wirings Q1, Q2, and Q3 each having a length larger than or equal to 33 mm, it is favorable that the thickness Tc (similarly, the thickness Th and/or the thickness Tm) is larger than 130 nm. At least one of the thickness Tc, the thickness Th, and the thickness Tm can be 150 nm or larger or can be larger than 180 nm. It is favorable that each of a distance Dc between the wiring Q2 and the wiring Q3 in the portion Pc and a distance between the wiring Q2 and the wiring Q1 in the portion Pc is smaller than the thickness Tc (Dc<Tc). It is favorable that each of a distance Dh between the wiring Q2 and the wiring Q3 in the portion Ph and a distance between the wiring Q2 and the wiring Q1 in the portion Ph is smaller than the thickness Th (Dh<Th). Similarly, it is favorable that each of a distance between the wiring Q2 and the wiring Q3 in the portion Pm and a distance between the wiring Q2 and the wiring Q1 in the portion Pm is smaller than the thickness Tm.

FIG. 14B is an enlarged view of a range AA illustrated in FIG. 14A. Each of the wirings Q1, Q2, and Q3 includes a left side portion 110a, a right side portion 110b, and an intermediate portion 110c, which lies between the left side portion 110a and the right side portion 110b, along a direction in which the wirings Q1, Q2, and Q3 extend. The left side portion 110a is located in the left side region SL, the right side portion 110b is located in the right side region SR, and the intermediate portion 110c is located in the intermediate region SC.

In FIG. 14B, the width Wa of the left side portion 110a, the width Wb of the right side portion 110b, and the width We of the intermediate portion 110c are illustrated. Here, since the width Wa and the width Wh can be equal to each other (Wa=Wh), a description about the width Wa in the following description can also be applied to the width Wh. Similarly, since the width Wb and the width Wm can be equal to each other (Wb=Wm), a description about the width Wb in the following description can also be applied to the width Wm. While it is also favorable that the width We of the intermediate portion 110c is larger than each of the width Wa of the left side portion 110a and the width Wb of the right side portion 110b (We>Wa, We>Wb), the widths of the wirings Q1, Q2, and Q3 can be equal to each other in a range between the portion Ph and the portion Pm. Each of the width Wa of the left side portion 110a and the width Wb of the right side portion 110b can be smaller than 230 nm. An advantageous effect in implementing a miniaturization which is obtained by making the width We larger than each of the width Wa and the width Wb can be conspicuously acquired in a case where each of the width Wa of the left side portion 110a and the width Wb of the right side portion 110b is smaller than 230 nm. The maximum width Wmax of any one of the wirings Q1, Q2, and Q3 can be 230 nm or larger. In a case where each of the width Wa of the left side portion 110a and the width Wb of the right side portion 110b is 230 nm or larger, the width We of the intermediate portion 110c can be equal to or different from each of the width Wa of the left side portion 110a and the width Wb of the right side portion 110b. Making the width We of the intermediate portion 110c larger than each of the width Wa and the width Wb in a case where each of the width Wa and the width Wb is 230 nm or larger may be disadvantageous in attaining miniaturization. Each of the width Wa of the left side portion 110a and the width Wb of the right side portion 110b can be smaller than 180 nm. An advantageous effect in implementing a miniaturization which is obtained by making the width We larger than each of the width Wa and the width Wb can be conspicuously acquired in a case where each of the width Wa of the left side portion 110a and the width Wb of the right side portion 110b is smaller than 180 nm. It is favorable that a difference between the width We of the intermediate portion 110c and the width Wa of the left side portion 110a (We−Wa) is larger than 50 nm, and this is favorable in terms of making the width Wa of the left side portion 110a smaller than 180 nm. It is favorable that a difference between the width We of the intermediate portion 110c and the width Wb of the right side portion 110b (We−Wb) is larger than 50 nm, and this is favorable in terms of making the width Wb of the right side portion 110b smaller than 180 nm. It is favorable that a difference between the width We of the intermediate portion 110c and the width Wa of the left side portion 110a (We−Wa) is smaller than the width Wa of the left side portion 110a (We−Wa<Wa). It is also favorable that a difference between the width We of the intermediate portion 110c and the width Wb of the right side portion 110b (We Wb) is smaller than the width Wb of the right side portion 110b (We−Wb<Wb). It is also favorable that the width We of the intermediate portion 110c is larger than 110 nm. It is also favorable that the width We of the intermediate portion 110c is larger than 180 nm. The width We of the intermediate portion 110c can be smaller than 300 nm. While, in the present example, the width Wb is equal to the width Wa, the width Wb can be different from the width Wa.

In FIG. 14B, a distance Da between the left side portion 110a of the wiring Q2 and each of the wirings Q1 and Q3, a distance Db between the right side portion 110b of the wiring Q2 and each of the wirings Q1 and Q3, and a distance Dc between the intermediate portion 110c of the wiring Q2 and each of the wirings Q1 and Q3 are illustrated. It is favorable that the distance Dc between the intermediate portion 110c of the wiring Q2 and each of the wirings Q1 and Q3 is larger than the width Wa of the left side portion 110a (Dc>Wa). It is favorable that the distance Dc between the intermediate portion 110c of the wiring Q2 and each of the wirings Q1 and Q3 is larger than the width Wb of the right side portion 110b (Dc>Wb). It is favorable that the distance Da between the left side portion 110a of the wiring Q2 and each of the wirings Q1 and Q3 is smaller than the width We of the intermediate portion 110c (Da<Wc). It is favorable that the distance Db between the right side portion 110b of the wiring Q2 and each of the wirings Q1 and Q3 is smaller than the width We of the intermediate portion 110c (Db<Wc). While, in the present example, the distance Db is equal to the distance Da, the distance Db can be different from the distance Da.

In FIG. 14B, a length La of the left side portion 110a, a length Lb of the right side portion 110b, and a length Lc of the intermediate portion 110c taken along a direction in which the wirings Q1, Q2, and Q3 extend are illustrated. The length Lc of the intermediate portion 110c can be larger than the width Wa of the left side portion 110a. The length Lc of the intermediate portion 110c can be larger than the width Wb of the right side portion 110b. The length Lc of the intermediate portion 110c can be smaller than the length La of the left side portion 110a. The length Lc of the intermediate portion 110c can be smaller than the length Lb of the right side portion 110b.

Typically, each of the width Wa, the width Wb, the distance Da, and the distance Db is smaller than each of the width We and the distance Dc.

An example in which the semiconductor device APR is applied to a photoelectric conversion device is described. Each of the wirings Q1, Q2, and Q3 is, for example, a row wiring having a dual damascene structure. Each of the wirings Q1, Q2, and Q3 is a signal line used to transfer a control signal to a pixel circuit, which includes four transistors (a transfer transistor, a reset transistor, an amplification transistor, and a selection transistor) per one pixel P. For example, the wiring Q1 is a transfer signal line used to control the transfer transistor, the wiring Q2 is a reset signal line used to control the reset transistor, and the wiring Q3 is a selection signal line used to control the selection transistor. What functions the plurality of wirings 110 and the wirings Q1, Q2, and Q3 in the present exemplary embodiment have is not limited to the above-described example.

In FIG. 14A, the respective ranges of a plurality of pixels P are illustrated. A portion in which the width of a wiring is thick (a thick line portion) and a portion in which the width of a wiring is thin (a thin line portion) are repeatedly provided for each pixel P. The left side portion 110a is located between one end Ea and the intermediate portion 110c of the range AA along a direction in which the wirings Q1, Q2, and Q3 extend. The right side portion 110b is located between the other end Eb and the intermediate portion 110c of the range AA along a direction in which the wirings Q1, Q2, and Q3 extend. Each of the wirings Q1, Q2, and Q3 includes a thin line portion L4 located between one end Ea and the left side portion 110a and a thick line portion L5 located between the thin line portion L4 and the left side portion 110a along a direction in which the wirings Q1, Q2, and Q3 extend. Moreover, each of the wirings Q1, Q2, and Q3 includes a thin line portion R6 located between the other end Eb and the right side portion 110b and a thick line portion R7 located between the thin line portion R6 and the right side portion 110b along a direction in which the wirings Q1, Q2, and Q3 extend. The width of the thick line portion L5 is larger than each of the width Wa of the left side portion 110a, the width Wb of the right side portion 110b, the width of the thin line portion L4, and the width of the thin line portion R6. The width of the thick line portion R7 is larger than each of the width Wa of the left side portion 110a, the width Wb of the right side portion 110b, the width of the thin line portion L4, and the width of the thin line portion R6. While it is favorable that the width of the thick line portion L5 or the width of the thick line portion R7 is equal to the width We, the width of the thick line portion L5 or the width of the thick line portion R7 can be different from the width Wc. While it is favorable that the width of the thin line portion L4 or the width of the thin line portion R6 is equal to the width Wa or Wb, the width of the thin line portion L4 or the width of the thin line portion R6 can be different from the width Wa or Wb.

In this way, providing thick line portions (i.e., the thick line portions L5 and R7) at positions corresponding to the range AA in pixels away from the line A-A', which do not include the intermediate region SC, enables improving the uniformity of a wiring layout in each pixel and thus increasing the uniformity of characteristics of each pixel. In other words, providing such thick line portions enables decreasing a difference in signal output between a pixel near the line A-A' including the intermediate region SC and a pixel away from the line A-A' not including the intermediate region SC and preventing or reducing a line noise from occurring along the line A-A' in an image. Naturally, since the thick line portion L5 is present on the left side region SL and the thick line portion R7 is present on the right side region SR, the thick line portions L5 and R7 have almost no function of mitigating the influence of misregistration between a photomask for use at the time of exposure on the left side region SL and a photomask for use at the time of exposure on the right side region SR.

Each of the wirings Q1, Q2, and Q3 includes, along a direction in which the wirings Q1, Q2, and Q3 extend, a left side portion 110d, which is located between the left side portion 110a and the intermediate portion 110c, and a right side portion 110e, which is located between the right side portion 110b and the intermediate portion 110c. In FIG. 14B, the width Wd of the left side portion 110d and the width We of the right side portion 110e are illustrated. The width Wd of the left side portion 110d is larger than the width Wa of the left side portion 110a (Wd>Wa), and the width We of the right side portion 110e is larger than the width Wb of the right side portion 110b (We>Wb). In the present example, the width Wd of the left side portion 110d is equal to the width We of the intermediate portion 110c (Wd=We). In a case where the width Wd of the left side portion 110d is different from the width We of the intermediate portion 110c, while the width Wd of the left side portion 110d can be larger than the width We of the intermediate portion 110c (Wd>Wc), it is favorable that the width Wd of the left side portion 110d is smaller than the width We of the intermediate portion 110c (Wd<Wc). Similarly, the width We of the right side portion 110e is equal to the width We of the intermediate portion 110c (We=Wc). In a case where the width We of the right side portion 110e is different from the width We of the intermediate portion 110c, while the width We of the right side portion 110e can be larger than the width We of the intermediate portion 110c (We>Wc), it is favorable that the width We of the right side portion 110e is smaller than the width We of the intermediate portion 110c (We<Wc). It is favorable that a difference (|Wc−Wd|) between the width We of the intermediate portion 110c and the width Wd of the left side portion 110d is smaller than a difference (|Wd−Wa|) between the width Wa of the left side portion 110a and the width Wd of the left side portion 110d (|Wc−Wd|<|Wd−Wa|). Similarly, it is favorable that a difference (|Wc−We|) between the width We of the intermediate portion 110c and the width We of the right side portion 110e is smaller than a difference (|We−Wb|) between the width Wb of the right side portion 110b and the width We of the right side portion 110e (|Wc−We|<|We−Wb|). Since, as mentioned above, there can be a relationship of We=Wd=We, the relationship between the width We and the widths Wa and Wb can be applied to the relationship between the widths Wd and We and the widths Wa and Wb. Furthermore, the left side portion 110d and the right side portion 110e can be omitted, and this is equivalent to making the width Wd of the left side portion 110d equal to the width Wa and making the width We of the right side portion 110e equal to the width Wb.

As illustrated in FIG. 14B, the wiring Q1 and the wiring Q3 are located obliquely between the left side portion 110a and the left side portion 110d. This implements satisfying both of Wa<We and Da<Dc. Similarly, the wiring Q1 and the wiring Q3 are located obliquely between the right side portion 110b and the right side portion 110e. This implements satisfying both of Wb<We and Db<Dc.

Moreover, making the width We larger than each of the width Wa and the width Wb (We>Wa & Wb) enables preventing or reducing a pattern from being broken at the intermediate portion 110c even when misregistration occurs between photomasks for the left side region SL and the right side region SR. Then, this enables forming a more minute pattern at the left side portion 110a and the right side portion 110b. Moreover, making the distance Dc larger than each of the distance Da and the distance Db (Dc>Da & Db) enables preventing or reducing a pattern from being short-circuited in the intermediate portion 110c even when misregistration occurs between photomasks for the left side region SL and the right side region SR.

As illustrated in FIG. 14A, a wiring interval Y2 in the Y-direction can be made larger than a wiring interval Y1 in the Y-direction. This enables making a wiring opening in the Y-direction wider and thus improving the sensitivity of a photoelectric conversion device.

In the following description, a method for manufacturing a semiconductor device is described with reference to FIGS. 15A1, 15A2, 15B1, 15B2, 15C1, 15C2, 15D1, and 15D2, FIGS. 16A1, 16A2, 16B1, 16B2, 16C1, and 16C2, and FIGS. 17A1, 17A2, 17B1, 17B2, 17C1, and 17C2. In FIGS. 15A1 to 15D2, FIGS. 16A1 to 16C2, and FIGS. 17A1 to 17C2, figures having figure numbers with a suffix "1" appended thereto are sectional views and figures having figure numbers with a suffix "2" appended thereto are plan views with a semiconductor device viewed from the top. The sectional views, which have figure numbers with a suffix "1" appended thereto, represent cross sections taken along a line D-D' in the plan views, which have figure numbers with a suffix "2" appended thereto. A line corresponding to the line D-D' is also illustrated in FIG. 14B. Members which are in common between figures having figure numbers with a suffix "1" appended thereto and figures having figure numbers with a suffix "2" appended thereto are assigned the respective same hatchings.

As illustrated in each of the plan views, which have figure numbers with a suffix "2" appended thereto, the wafer WF includes, in each of a plurality of device regions DR, a left side region SL to the left of a line C-C', a right side region SR to the right of a line B-B', and an intermediate region SC between the left side region SL and the right side region SR.

FIGS. 15A1 and 15A2 illustrate a process A for preparing the wafer WF, which includes a semiconductor layer 100 and an insulator film 104 provided on the semiconductor layer 100. The wafer WF, which is used for manufacturing the semiconductor device APR in the present exemplary embodiment, includes the semiconductor layer 100, which serves as an element functional layer. The semiconductor layer 100 to be used includes a silicon layer or a compound semiconductor layer. In the element functional layer, for example, a plurality of photoelectric conversion portions (not illustrated), a plurality of transistors (not illustrated), and an isolation structure (not illustrated) for isolating the plurality of photoelectric conversion portions and the plurality of transistors at portions where those are to be electrically isolated from each other. The element functional layer can be formed by a known method using a known material.

On the semiconductor layer 100 serving as an element functional layer, there is formed an interlayer insulating film 101. The interlayer insulating film 101 is formed to establish electrical insulation between a structure included in the semiconductor layer 100 serving as an element functional layer and a layer above the interlayer insulating film 101. The interlayer insulating film 101 to be used can be made from, for example, a silicon oxide and can be formed by a known method.

In the interlayer insulating film 101, there is formed a contact plug 102 at a portion where an electrical conduction is intended to be secured between a structure included in the semiconductor layer 100 serving as an element functional layer and a wiring above the interlayer insulating film 101. On the contact plug 102, there are formed an insulator film 103, which functions as an etching stop layer, and an insulator film 104, which serves an interlayer insulating film. For example, the contact plug 102 can be made from tungsten, the insulator film 103 can be a silicon carbide film or a silicon nitride film, and the insulator film 104 can be a silicon oxide film. Furthermore, the silicon oxide film is a film including oxygen and silicon as principal constituent elements, and can include an impurity, such as carbon, nitrogen, fluorine, or chlorine, at a rate lower than that of each of oxygen and silicon. Similarly, the silicon nitride film is a film including nitrogen and silicon as principal constituent elements, and can include an impurity, such as carbon, oxygen, fluorine, or chlorine, at a rate lower than that of each of nitrogen and silicon. Similarly, the silicon carbide film is a film including carbon and silicon as principal constituent elements, and can include an impurity, such as nitrogen, oxygen, fluorine, or chlorine, at a rate lower than that of each of carbon and silicon. Here, with regard to the composition of a silicon compound, such as the silicon oxide film, the silicon nitride film, or the silicon carbide film, a light element such as hydrogen or helium, is not deemed as a principal constituent element. Thus, the silicon oxide film, the silicon nitride film, or the silicon carbide film can include a light element such as hydrogen at a rate higher than that of nitrogen and/or silicon. The insulator film 104 serving as an interlayer insulating film can be a silicon oxide film including carbon, an organic material film, a silicon nitride film, or a silicon carbide film. The insulator film 104 can be a porous film or can be a low-κ (material with a small relative dielectric constant (κ, kappa) relative to silicon dioxide) film. Furthermore, these configurations are not intended to limit the present exemplary embodiment, and are merely described as examples.

FIGS. 15B1 and 15B2 illustrate a process B for forming a mask material film 105 and a mask material film 106 on the wafer WF. The manufacturing method forms, on the insulator film 104 serving as an interlayer insulating film, a mask material film 105 and a mask material film 106. The mask material film 105 is configured with an inorganic material film 1051 and an organic material film 1052. For example, the inorganic material film 1051 can be a silicon nitride film, and the organic material film 1052 can be made from a novolak-type resin. The mask material film 105 can include an inorganic material film 1053 (not illustrated) provided on the organic material film 1052, and can have a stacked (laminated) structure in which the organic material film 1052 is sandwiched between the inorganic material film 1053 (not illustrated) and the inorganic material film 1051. The inorganic material film 1053 (not illustrated) on the organic material film 1052 can be a silicon oxide film. In the present exemplary embodiment, the mask material film 105 has the above-described configuration, but can have another configuration. The material of the mask material film 106 only needs to be a material different from the material of the uppermost layer of the mask material film 105. If the material of the uppermost layer of the mask material film 105 is the organic material film 1052, the mask material film 106 to be used can be an inorganic material film, such as a silicon oxide film or a silicon nitride film. If the material of the uppermost layer (for example, the inorganic material film 1053) of the mask material film 105 is a silicon oxide film, the mask material film 106 to be used can be an inorganic material film different from the inorganic material film 1053, such as a silicon nitride film or a titanium nitride film. Furthermore, forming the mask material film 105 can be omitted, and, in that case, the mask material film 106 only needs to be formed in such a way as to be in contact with the insulator film 104.

FIGS. 15C1 and 15C2 illustrate an exposure process C for exposing a positive-type photoresist film 107, which is provided on the side of a layer above the insulator films 103 and 104, with a left side exposure shot L. The left side exposure shot L is used to expose the photoresist film 107 in above the left side region SL and the intermediate region SC. After forming the positive-type photoresist film 107 on the mask material film 106, the manufacturing method exposes the photoresist film 107 with a left side exposure pattern 107H using a photomask PML in above the left side region SL and the intermediate region SC. Registration (position adjustment) between the photomask PML and the wafer can be performed with use of an alignment mark (not illustrated) formed in a layer below the mask material film 106. As illustrated in FIG. 15C2, the left side exposure pattern 107H is used for exposure up to the line B-B' across the line A-A'. The exposure process C enables forming an exposure pattern 107A for alignment on the photoresist film 107 in addition to the left side exposure pattern 107H.

FIGS. 15D1 and 15D2 illustrate a development process D for developing the photoresist film 107 to form a resist pattern 107L from the photoresist film 107. Since the photoresist film 107 is of the positive type, a portion exposed by the exposure process C in the photoresist film 107 (the left side exposure pattern 107H) is removed by the development process. In a similar way, the exposure pattern 107A for alignment is removed, so that a resist pattern 107A for alignment is formed.

FIGS. 16A1 and 16A2 illustrate a working process E for performing working on the mask material film 106 using the resist pattern 107L as a mask to transfer the resist pattern 107L onto the mask material film 106. The manufacturing method forms a mask pattern 106L by performing etching on the mask material film 106 using the resist pattern 107L as a mask. After forming the mask pattern 106L, the manufacturing method removes the resist pattern 107L. Furthermore, the resist pattern 107A for alignment is used to form an alignment mark 106A in the mask material film 106.

FIGS. 16B1 and 16B2 illustrate an exposure process F for exposing a positive-type photoresist film 108, which is provided on the side of a layer above the insulator films 103 and 104, with a right side exposure shot R. The right side exposure shot R is used to expose the photoresist film 108 in above the right side region SR and the intermediate region SC. After forming the positive-type photoresist film 108 on the mask material film 106, the manufacturing method exposes the photoresist film 108 with a right side exposure pattern 108M using the photomask PMR in above the right side region SR and the intermediate region SC. As illustrated in FIG. 16B2, the right side exposure pattern 108M is used for exposure up to the line C-C' across the line A-A'. The exposure process F enables performing registration between the photomask PMR and the wafer using an alignment mark 106A. Moreover, the manufacturing method can perform registration between the photomask PMR and the wafer using both the alignment mark 106A and an alignment mark (not illustrated) formed in a layer below the mask material film 106. This way enables accurately controlling any misregistration occurring at the time of exposure of the right side region SR with respect to both lower layers and the left side region SL.

FIGS. 16C1 and 16C2 illustrate a development process G for developing the photoresist film 108 to form a resist pattern 108R from the photoresist film 108. Since the photoresist film 108 is of the positive type, a portion exposed by the exposure process F in the photoresist film 108 (the right side exposure pattern 108M) is removed by the development process.

FIGS. 17A1 and 17A2 illustrate a working process H for performing working on the mask material film 106 using the resist pattern 108R as a mask to transfer the resist pattern 108R onto the mask material film 106. The manufacturing method forms a mask pattern 106R by performing etching on the mask material film 106 using the resist pattern 108R as a mask. Thus, a mask pattern 106LR obtained by combining the mask pattern 106L and the mask pattern 106R is formed. After forming the mask pattern 106R (the mask pattern 106LR), the manufacturing method can remove the resist pattern 108R.

While an example in which the manufacturing method performs the right side exposure shot R after the left side exposure shot L has been described, the manufacturing method can perform the left side exposure shot L after the right side exposure shot R. Details of the left side exposure pattern 107L and the right side exposure pattern 108R are described below. The wavelength of exposure light is, for example, in a range of 175 nm to 275 nm, and, for example, exposure light with a wavelength in a range of 225 nm to 275 nm (for example, KrF excimer laser with a wavelength 248 nm) or exposure light with a wavelength in a range of 175 nm to 225 nm (for example, ArF excimer laser with a wavelength 193 nm) is favorable. Using ArF excimer laser as exposure light is more favorable in terms of miniaturization of wiring. In order to form a wiring smaller in width than 230 nm, it is favorable that the wavelength of exposure light (exposure wavelength) for use in each of the exposure processes C and F is smaller than 230 nm.

FIGS. 17B1 and 17B2 illustrate a working process I for performing working on the insulator films 104 and 103 using the mask pattern 106LR as a mask to form a trench 109 in the insulator films 104 and 103. The manufacturing method performs etching on the mask material film 105, the insulator film 104 serving as an interlayer insulating film, and the insulator film 103 using the mask pattern 106LR as a mask, thus forming the trench 109. The trench 109 extends from the left side region SL to the right side region SR across the intermediate region SC. It is favorable that the depth of the trench 109 in the intermediate region SC is larger than the width of the trench 109. In the entirety of the trench 109, the maximum depth of the trench 109 can be larger than the maximum width of the trench 109.

FIGS. 17C1 and 17C2 illustrate a wiring process J for forming a wiring 110 in the trench 109. For example, the manufacturing method embeds an electrical conducting material into the trench 109 using a plating method. The electrical conducting material can be, for example, copper or an alloy containing copper. Then, after embedding the electrical conducting material, the manufacturing method removes an unnecessary electrical conducting material formed on the insulator film 104 using, for example, a chemical mechanical polishing (CMP) method. With this processing, the manufacturing method forms the wiring 110 in the trench 109. The wiring 110 extends from the left side region SL to the right side region SR across the intermediate region SC. The wiring 110 includes, along a direction in which the wiring 110 extends, a left side portion 110L, which is located on the left side region SL, a right hand portion 110R, which is located on the right side region SR, and an intermediate portion 110C, which is located on the intermediate region SC. In this way, a wiring formed by embedding an electrical conducting material into an insulator film and then removing an unnecessary electrical conducting material is referred to as a "damascene wiring", and such a process is referred to as a "damascene process". While, here, a case where such a process is applied to a single damascene process has been described, a similar method can also be applied to a dual damascene process.

The manufacturing method then forms at least one upper-layer wiring layer (typically, a plurality of upper-layer wiring layers). Formation of the upper-layer wiring layer can be performed by applying a damascene process similar to the above-described one to an interlayer insulating film formed on the insulator film 104 and the wiring 110. In a case where the semiconductor device APR is a photoelectric conversion device of the obverse surface irradiation type, after forming the upper-layer wiring layer, the manufacturing method can provide an opening to a plurality of interlayer insulating films including the insulator film 104. This opening is used to form an optical path for light to a photoelectric conversion portion. A light-transmitting material different from the material of the insulator film 103 and/or the insulator film 104 can be embedded into this opening. For example, if the insulator film 103 is made from silicon carbide or silicon nitride and the insulator film 104 is made from silicon oxide, the light-transmitting material only needs to be silicon nitride, silicon oxide, or resin.

In the above description, a case where the method for manufacturing a semiconductor device is applied to formation of wiring has been described. The wiring layer includes wirings used to transfer electric power and signals which are in common with respective columns of a pixel portion, and these wirings are arranged while extending between the left side region SL and the right side region SR. Applying divisional exposure according to the present exemplary embodiment enables performing miniaturization working on wirings in the respective regions and also performing miniaturization on a portion extending between regions. A wiring obtained by connection using divisional exposure can be, for example, an electric power line used to supply electric power for causing a pixel portion or a column circuit to operate. Alternatively, a wiring obtained by connection using divisional exposure can be, for example, a signal line used to supply a control signal for controlling the operation of a pixel portion or a column circuit or a signal line used to transfer an output signal from a column circuit that is based on the amount of light received for each pixel. However, another type of wiring can be formed by connection using divisional exposure. While a wiring the manufacturing method for which has been described in the present exemplary embodiment is a single damascene wiring formed by a single damascene process, a similar method can be applied to a dual damascene wiring formed by a dual damascene process. While "trench first" can be employed for the dual damascene process, employing "via first" is more advantageous in terms of miniaturization.

While a wiring layer the manufacturing method for which has been described is one layer, the above-described exemplary embodiment can be applied to two or more wiring layers. Moreover, an exposure apparatus used for exposure at the time of formation can differ between a wiring in the first layer and a wiring in the second layer. For example, when forming a wiring in the first layer, the manufacturing method can use an exposure apparatus with a wavelength of 193 nm using an ArF light source and a maximum exposure region of 26 mm×33 mm, and, when forming wirings in the second layer and subsequent layers, the manufacturing method can use an exposure apparatus with a wavelength of 248 nm using a KrF light source and a maximum exposure region of 26 mm×33 mm. The wiring in the first layer can be a single damascene wiring and the wiring in the second layer can be a dual damascene wiring. Then, the manufacturing method can apply connective exposure (divisional exposure) using an ArF light source to a single damascene wiring in the first layer and apply connective exposure (divisional exposure) using a KrF light source to a dual damascene wiring in the second layer.

While, in the above-described exemplary embodiment, a case where each of the photoresist films 107 and 108 is of the positive type has been described, the photoresist film 107 and the photoresist film 108 can be configured to be of the negative type. In that case, the manufacturing method can use photomasks PML and PMR configured to be used for exposing portions of the negative type photoresist film corresponding to portions in which no wirings are to be formed, and can remove unexposed portions of the negative type photoresist film by a development process.

In the following description, details of the left side exposure pattern 107H and the right side exposure pattern 108M in the exposure processes illustrated in FIGS. 15A1 to 15D2 included in the method for manufacturing the semiconductor device APR are described with reference to FIGS. 18A1, 18A2, 18B1, 18B2, 18C1, and 18C2.

Figures having figure numbers with a suffix "1" appended thereto out of FIGS. 18A1 to 18C2 are plan views illustrating a positional relationship between the left side exposure pattern 107H for the left side region SL and the right side exposure pattern 108M for the right side region SR. Moreover, figures having figure numbers with a suffix "2" appended thereto out of FIGS. 18A1 to 18C2 are plan views obtained when a mask pattern 106LR composed of the mask pattern 106L and the mask pattern 106R has been formed.

FIG. 18A1 illustrates a form in which the left side exposure pattern 107H and the right side exposure pattern 108M overlap each other in the intermediate region SC. In a position where the left side exposure pattern 107H and the right side exposure pattern 108M overlap each other, a hatching obtained by lapping a hatching of the left side exposure pattern 107H and a hatching of the right side exposure pattern 108M on each other is illustrated. The present exemplary embodiment is characteristic in that, as mentioned above, the left side exposure pattern 107H is formed on the photoresist film 107 and the right side exposure pattern 108M is formed on the photoresist film 108.

On the other hand, if, with respect to the same photoresist film, the left side region SL is exposed with the left side exposure pattern 107H and the right side region SR is exposed with the right side exposure pattern 108M, double exposure, in which exposure is doubly performed with such exposure patterns, occurs in the intermediate region SC. This may result in a problem of a variation in line width occurring due to this double exposure. In the intermediate region SC, since double exposure is performed with the left side exposure shot L and the right side exposure shot R, the cumulated exposure amount increases, so that the width of a latent image pattern may become larger than the width of an exposure pattern. This is because, due to an increase in the cumulated exposure amount, the amount of generation of acid in an exposed portion increases, a protective group elimination reaction using acid as a catalyst more often occurs, and a region, which is dissoluble in a developing liquid broadens. Moreover, while diffraction of light can occur in an exposure, since double exposure is performed with both diffracted light used for the left side exposure shot L and diffracted light used for the right side exposure shot R, the variation in line width may occur. Shaping a layout, such as providing an auxiliary pattern, in the intermediate region SC enables preventing or reducing a variation in line width caused by double exposure. In the method of providing such an auxiliary pattern, for example, in the case of a line pattern (a wiring, which is formed with a remaining pattern), to prevent or reduce a variation in line width caused by double exposure, it is possible to arrange an auxiliary pattern in such a manner that the line width becomes larger. At this time, to prevent or reduce a deficiency in resolution between auxiliary patterns, it is desirable to sufficiently secure a distance between auxiliary patterns. Moreover, in the case of a trench pattern (a wiring, which is formed with an opening pattern), to prevent or reduce a variation in line width caused by double exposure, it is possible to arrange an auxiliary pattern in such a manner that the line width becomes smaller.

At that time, if the dimension of an auxiliary pattern is too large with respect to the trench width, since the trench may rupture, it is necessary to set the trench width to a dimension greater than or equal to a predetermined value. For the above-mentioned reasons, only with the method of providing an auxiliary pattern, there is a limit in terms of miniaturization of a pattern. On the other hand, the present exemplary embodiment is configured to form a mask pattern 106LR by performing exposure on respective different photoresist films in the left side region SL and the right side region SR. Thus, double exposure in the intermediate region SC does not occur and, since it is possible to prevent or reduce a variation in dimension of a pattern in the intermediate region SC as illustrated in FIG. 18A2, the present exemplary embodiment is advantageous in miniaturization of a pattern.

FIG. 18B1 is a plan view illustrating a positional relationship between exposure patterns for the left side region SL and the right side region SR obtained when misalignment has occurred between the left side region SL and the right side region SR in the X-direction. Moreover, FIG. 18B2 is a plan view illustrating the mask pattern 106L and the mask pattern 106R formed on the mask material film 106 in that case. In a conventional divisional exposure technique, since exposure is performed on the same photoresist in the left side region SL and the right side region SR, if misalignment occurs in the X-direction as illustrated in FIG. 18B1, the area of the intermediate region SC changes. In that case, since the cumulated exposure amount changes in the intermediate region SC, the line width of a pattern varies, so that rupture of a pattern or short circuit between patterns may become an issue. To prevent a pattern from being broken even in a case where a variation in line width of a pattern caused by misalignment has occurred, an auxiliary pattern is provided in the intermediate region SC. However, this method contradicts miniaturization because the dimension of a pattern width becomes large in a duplication region. On the other hand, the present exemplary embodiment is configured to form a pattern by performing exposure on respective different photoresist films in the left side region SL and the right side region SR. Since it is possible to prevent or reduce a variation in dimension of a pattern even in a case where the area of the intermediate region SC has changed due to misalignment in the X-direction, the present exemplary embodiment is thus advantageous in miniaturization of a pattern, as illustrated in FIG. 18B2.

FIG. 18C1 is a plan view illustrating a positional relationship between exposure patterns for the left side region SL and the right side region SR obtained when misalignment has occurred between the left side region SL and the right side region SR in the Y-direction. Moreover, FIG. 18C2 is a plan view illustrating the mask pattern 106L and the mask pattern 106R formed on the mask material film 106 in that case. Supposing that the width of the exposure pattern 107H is denoted by Mh, the width of the exposure pattern 108M is denoted by Mm, and the amount of misalignment in the Y-direction is denoted by My, the width of a wiring in the intermediate region SC becomes "My+(Mh+Mm)/2". Furthermore, a condition under which a wiring is not short-circuited is "My<Mh & Mm". Typically, the condition becomes "My+(Mh+Mm)/2≈Wmax". For example, in the case of Mh & Mm<180 nm, if My<50 nm, a relationship of Wmax<230 nm is obtained. In the case of Mh & Mm<130 nm, if My<100 nm, a relationship of Wmax<230 nm is obtained. In the case of Mh & Mm<130 nm, if My<50 nm, a relationship of Wmax<180 nm is obtained. In the case of Mh & Mm<90 nm, if My<80 nm, a relationship of Wmax<170 nm is obtained. In the case of Mh & Mm<90 nm, if My<40 nm, a relationship of Wmax<130 nm is obtained.

A typical divisional exposure technique is configured to perform exposure on the same photoresist film in the left side region SL and the right side region SR. Thus, as illustrated in FIG. 18C2, in a case where misalignment in the Y-direction occurs, a space portion SS between a pattern for the left side region SL and a pattern for the right side region SR becomes small in the intermediate region SC. As a result, an optical contrast required for resolution in the space portion cannot be sufficiently obtained, so that short circuit of a pattern may become an issue. On the other hand, since the present exemplary embodiment is configured to perform exposure on respective different photoresist films in the left side region SL and the right side region SR, even in a case where the distance SS between patterns becomes small, the width of a portion Ps between adjacent mask patterns 106LR is unlikely to decrease. Accordingly, the present exemplary embodiment can prevent or reduce short circuit of a wiring as compared with a case where exposure is performed on the same photoresist.

In this way, the method in the present exemplary embodiment performs exposure on respective different photoresist films in the left side region SL and the right side region SR, can thus prevent or reduce a variation in dimension, rupture of a pattern, and short circuit between adjacent patterns, and is, therefore, advantageous in miniaturization of a pattern.

Figure 19C:
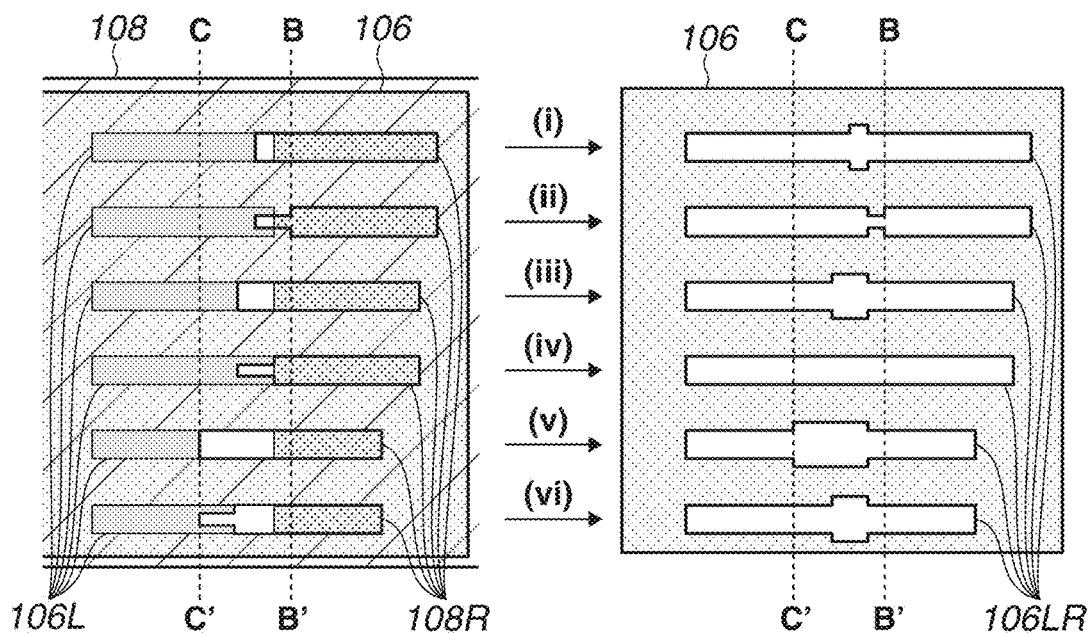
Figure 19D:
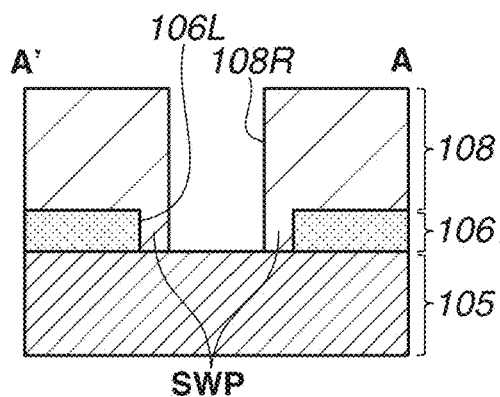
Figure 19E:
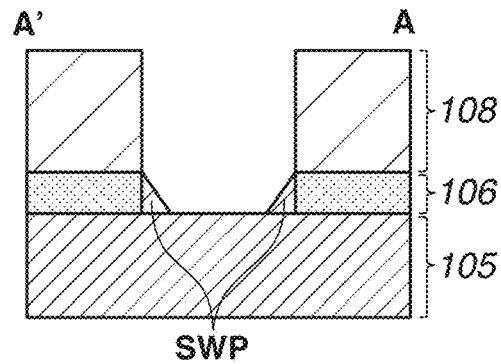

A relationship between the mask pattern 106L and the resist pattern 108R is described with reference to FIGS. 19C, 19D, and 19E. The left half of FIG. 19C is a plan view of a semiconductor device in the process G viewed from the top, and the right half of FIG. 19C is a plan view of the semiconductor device in the process H viewed from the top. FIGS. 19D and 19E are sectional views taken along a line A-A' (not illustrated) located between a line C-C' and a line B-B' in FIG. 19C. The line A-A' in FIGS. 19D and 19E is equivalent to the line A-A' illustrated in FIG. 16C2 or FIG. 17A2. Members which are in common between FIG. 19C and FIGS. 19D and 19E are assigned the respective same hatchings. In FIG. 19C, to illustrate a relationship between the resist pattern 108R and the mask pattern 106L, a hatching (oblique lines) for the photoresist film 108 and a hatching (dots) for the mask material film 106 are illustrated while being superposed on each other. If a side surface of the mask pattern 106L formed by etching in the process E is exposed on the outside by the resist pattern 108R in the process G, the side surface of the mask pattern 106L may be subjected to etching in the process H. Accordingly, in the intermediate region SC in which the resist pattern 108R and the mask pattern 106L overlap each other, the side surface of the mask pattern 106L may be subjected to side etching. Then, the shape of the mask pattern 106LR may become different from a shape simply obtained by the exposure pattern 107H and the exposure pattern 108M overlapping each other. The left half of FIG. 19C illustrates a relationship between the mask pattern 106L and the resist pattern 108R, and the right half of FIG. 19C illustrates a shape of the mask pattern 106LR. In FIG. 19C, six examples (i) to (vi) are illustrated. The examples (i), (iii), and (v) indicate changes corresponding to the amounts of misalignment in the X-direction as illustrated in FIGS. 18B1 and 18B2. Even if, as in the example (i), the amount of misalignment in the Y-direction is zero, the width of a wiring can become large in the intermediate region SC due to the above-mentioned side etching with the mask pattern 106L. This portion can be a portion Pc having the maximum width Wmax as mentioned above. As indicated in the examples (i), (iii), and (v), as the amount of misalignment is larger, a portion subjected to etching in the process H included in the mask pattern 106L increases. Thus, a range in which the width of a wiring is large increases. This is advantageous in terms of preventing or reducing an increase in resistance of a wiring. However, this is disadvantageous in terms of reducing an interval between adjacent wirings.

As illustrated in FIGS. 19D and 19E, it is effective to arrange a side surface protective member SWP, which protects the side surface of the mask pattern 106L, in the process H. The side surface protective member SWP is present between the opening of the resist pattern 108R and the side surface of the mask pattern 106L. For example, it is favorable that, as illustrated in FIG. 19D, the resist pattern 108R is configured to cover the side surface of the mask pattern 106L. Here, the side surface protective member SWP can be a part of the resist pattern 108R. Such a configuration can be formed by making the dimension of the opening of the resist pattern 108R smaller than the dimension of the opening of the mask pattern 106L. This enables preventing or reducing a deformation of the mask pattern 106L in the process H. Alternatively, as illustrated in FIG. 19E, the side surface protective member SWP can be arranged on the side surface of the mask pattern 106L. The side surface protective member SWP can be a part of the photoresist film 108 and be a member isolated from the resist pattern 108R. Alternatively, the side surface protective member SWP can be configured with a material different from that of the photoresist film 108.

Each of the examples (ii), (iv), and (vi) illustrated in FIG. 19C indicates a configuration in which the resist pattern 108R covers the side surface of the mask pattern 106L. The resist pattern 108R is set thinner than the other portion in the intermediate region SC (a portion on the right side region SR). While the amount of misalignment in the X-direction is the same between the example (iii) and the example (iv), an increase in wiring width in the intermediate region SC is more prevented or reduced in the example (iv) than in the example (iii). While the amount of misalignment in the X-direction is the same between the example (v) and the example (vi), an increase in wiring width in the intermediate region SC is more prevented or reduced in the example (vi) than in the example (v).

Figure 20A:
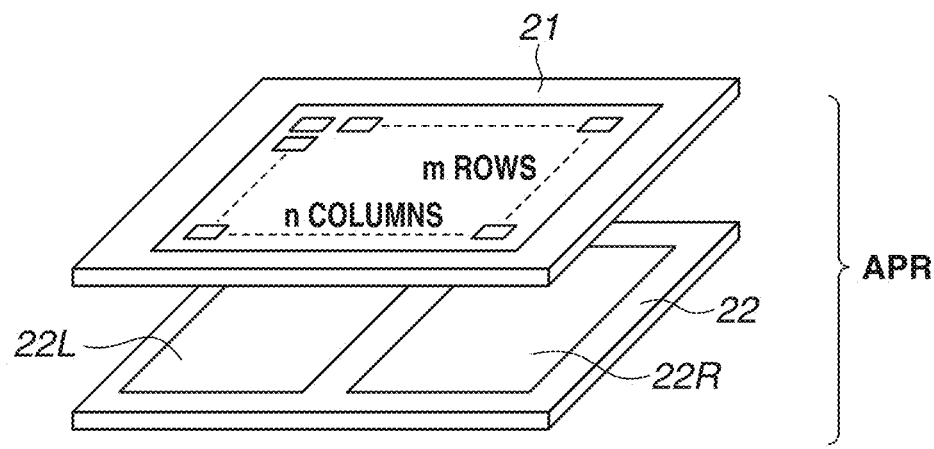
FIGS. 20A and 20B are schematic diagrams illustrating a semiconductor device and an apparatus, respectively.

The present exemplary embodiment can also be applied to a stacked type semiconductor device APR illustrated in FIG. 20A. The stacked type semiconductor device APR has a structure in which a photoelectric conversion chip 21 and a peripheral circuit chip 22 are stacked in layers. The photoelectric conversion chip 21 is a semiconductor component including a pixel array in which unit pixels including photoelectric conversion elements are arranged in a two-dimensional manner. The peripheral circuit chip 22 is a semiconductor component having a structure in which a signal processing circuit 22L and a signal processing circuit 22R are arranged on the same substrate.

Circuits included in each of the signal processing circuit 22L and the signal processing circuit 22R are, for example, a timing generator (TG) circuit, an analog-to-digital converter (ADC) circuit, and a digital-to-analog converter (DAC) circuit.

Circuits included in each of the signal processing circuit 22L and the signal processing circuit 22R are, for example, a digital front end (DFE) circuit, a digital signal processor (DSP) circuit, a vertical scanning circuit, and a horizontal scanning circuit. Circuits included in each of the signal processing circuit 22L and the signal processing circuit 22R are, for example, a static random access memory (SRAM) circuit and a dynamic random access memory (DRAM) circuit. Moreover, the signal processing circuit 22L and the signal processing circuit 22R can be interconnected by an inter-circuit wiring layer (not illustrated). The dimension of each of the photoelectric conversion chip 21 and the peripheral circuit chip 22 is larger than that of the maximum exposure region of the exposure apparatus, and the dimension of each of the signal processing circuit 22L and the signal processing circuit 22R formed on the peripheral circuit chip 22 is smaller than that of the maximum exposure region of the exposure apparatus. The method in the present exemplary embodiment can be applied to pattern formation of the photoelectric conversion chip 21 and the peripheral circuit chip 22.

Figure 20B:
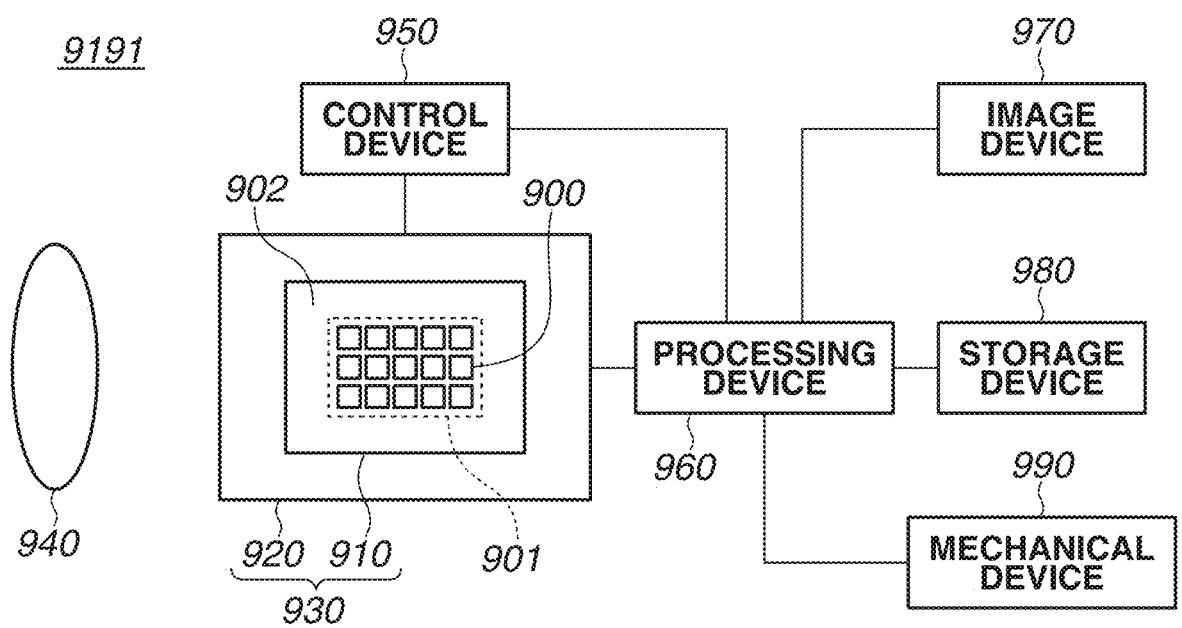

An apparatus 9191 including a semiconductor device 930 is described with reference to FIG. 20B. FIG. 20B is a schematic diagram illustrating the apparatus 9191, which includes the semiconductor device 930, according to the present exemplary embodiment. The apparatus 9191 including the semiconductor device 930 is described in detail. The semiconductor device 930 has characteristics in the structure and/or manufacturing method described above with respect to the semiconductor device APR. The semiconductor device 930 includes a central portion 901, in which circuit units 900 are arranged, and a peripheral portion 902, which is located around the central portion 901. The pixel portion 11 described with reference to FIG. 1A is equivalent to the central portion 901, and the signal processing circuit 12 described with reference to FIG. 1A is provided in the peripheral portion 902. The semiconductor device 930 includes a semiconductor device portion 910, and the semiconductor device portion 910 includes a semiconductor layer 100 included in the semiconductor device APR. The semiconductor device 930 can include, in addition to the semiconductor device portion 910 including the semiconductor layer 100, a package 920, in which the semiconductor device portion 910 is contained. The package 920 can include a base body, to which the semiconductor device portion 910 is fixed, and a cover body such as a glass film, which faces the semiconductor device portion 910. The package 920 can further include a junction member, such as a bonding wire or bump, which interconnects a terminal provided in the base body and a terminal provided in the semiconductor device portion 910.

The apparatus 9191 can include at least one of an optical device 940, a control device 950, a processing device 960, an image device 970, a storage device 980, and a mechanical device 990. The optical device 940 is associated with the semiconductor device 930. The optical device 940 includes, for example, a lens, a shutter, a mirror, and a filter. The control device 950 controls the semiconductor device 930. The control device 950 is a semiconductor device, such as an application specific integrated circuit (ASIC).

The processing device 960 processes a signal which has been output from the semiconductor device 930 or a signal which is to be input to the semiconductor device 930. The processing device 960 is a semiconductor device, such as a central processing unit (CPU) or an ASIC, for configuring an analog front end (AFE) or a digital front end (DFE).

In a case where the semiconductor device 930 is a photoelectric conversion device (imaging device), the image device 970 is an electroluminescence (EL) display device or a liquid crystal display device for displaying information (image) obtained by the semiconductor device 930. In a case where the semiconductor device 930 is a display device, the image device 970 can be a photoelectric conversion device (imaging device) for capturing an image, which is to be displayed on the semiconductor device 930.

The storage device 980 is a magnetic device or a semiconductor device portion for storing information (image) handled by the semiconductor device 930. The storage device 980 is a volatile memory, such as a static random access memory (SRAM) or a dynamic random access memory (DRAM), or a non-volatile memory, such as a flash memory or a hard disk drive.

The mechanical device 990 includes a moving portion or a propulsion portion, such as a motor or an engine. The apparatus 9191 displays a signal output from the semiconductor device 930 on the image device 970 or transmits a signal output from the semiconductor device 930 to the outside via a communication device (not illustrated) included in the apparatus 9191. For such reasons, it is favorable that the apparatus 9191 further includes, in addition to a storage circuit or computation circuit included in the semiconductor device 930, the storage device 980 and the processing device 960. The mechanical device 990 can be configured to be controlled based on a signal output from the semiconductor device 930.

Moreover, the apparatus 9191 is suitable for an electronic apparatus, such as an information terminal having an image capturing function (for example, a smartphone or a wearable terminal) or a camera (for example, a lens-interchangeable type camera, a compact camera, a video camera, or a monitoring camera). The mechanical device 990 in the camera can drive components of the optical device 940 for zooming, focusing, and shutter operations. Alternatively, the mechanical device 990 in the camera can drive the semiconductor device 930 for an image stabilizing operation.

Moreover, the apparatus 9191 can be a transport apparatus, such as a vehicle, a boat or ship, or an air vehicle. The mechanical device 990 in the transport apparatus can be used as a moving apparatus. The apparatus 9191 serving as a transport apparatus is suitable for an apparatus for transporting the semiconductor device 930 or an apparatus for assisting or automatizing driving (maneuvering) using an image capturing function. The processing device 960 for assisting or automatizing driving (maneuvering) can perform processing for operating the mechanical device 990 serving as a moving apparatus based on information obtained by the semiconductor device 930. Alternatively, the apparatus 9191 can be medical equipment, such as an endoscope, measurement equipment including a distance measuring sensor, analytical equipment including an electron microscope, or office equipment including a copying machine or a printer.

According to the above-described exemplary embodiments, forming excellent wirings is enabled. Accordingly, it is possible to heighten the value of a semiconductor device. Heightening the value as mentioned herein refers to at least one of addition of a function, improvement of performance, improvement of characteristics, improvement of reliability, improvement of manufacturing yield, reduction of environmental load, reduction of cost, reduction in size, and reduction in weight.

Accordingly, using the semiconductor device 930 according to the present exemplary embodiment for the apparatus 9191 also enables improving the value of the apparatus 9191. For example, when the semiconductor device 930 is mounted on a transport apparatus to be used for performing image capturing of the outside of the transport apparatus or measuring the external environment thereof, excellent performance can be attained. Thus, in manufacturing and selling transport apparatuses, determining to mount a semiconductor device according to the present exemplary embodiment on the transport apparatus is advantageous in terms of heightening the performance of the transport apparatus itself. Particularly, the semiconductor device 930 is suitable for a transport apparatus which performs drive assist and/or automatic driving of the transport apparatus using information obtained by a semiconductor device.

Tenth Exemplary Embodiment

Figure 21:
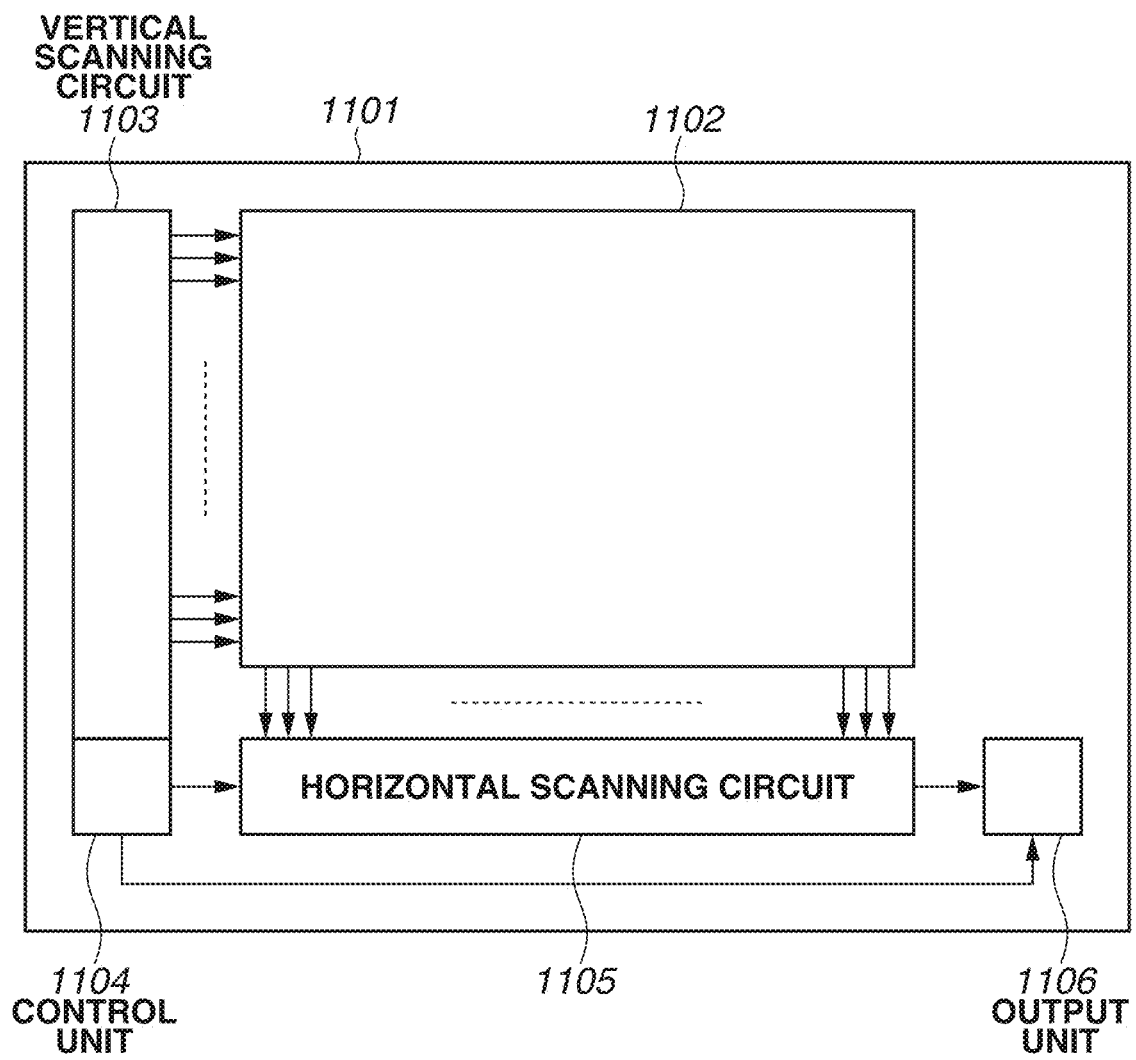
FIG. 21 is a schematic diagram illustrating a configuration of a semiconductor device.

FIG. 21 is an outline block diagram of a photoelectric conversion device according to the present exemplary embodiment. The photoelectric conversion device 1101 includes an imaging region 1102, in which a plurality of pixels is arranged in a matrix manner, a vertical scanning circuit 1103, which is configured to drive each portion included in each pixel, a horizontal scanning circuit 1105, which is configured to read out an electrical signal output from each pixel, and an output unit 1106, which is configured to output an electrical signal output from each pixel. The output unit 1106 outputs an electrical signal to the outside of the photoelectric conversion device 1101. The photoelectric conversion device 1101 outputs an electrical signal corresponding to the amount of light incident on the imaging region 1102. Moreover, the photoelectric conversion device 1101 includes a control unit 1104, which controls operations of the vertical scanning circuit 1103, the horizontal scanning circuit 1105, and the output unit 1106. The control unit 1104 can also be called a timing generator.

Figure 22:
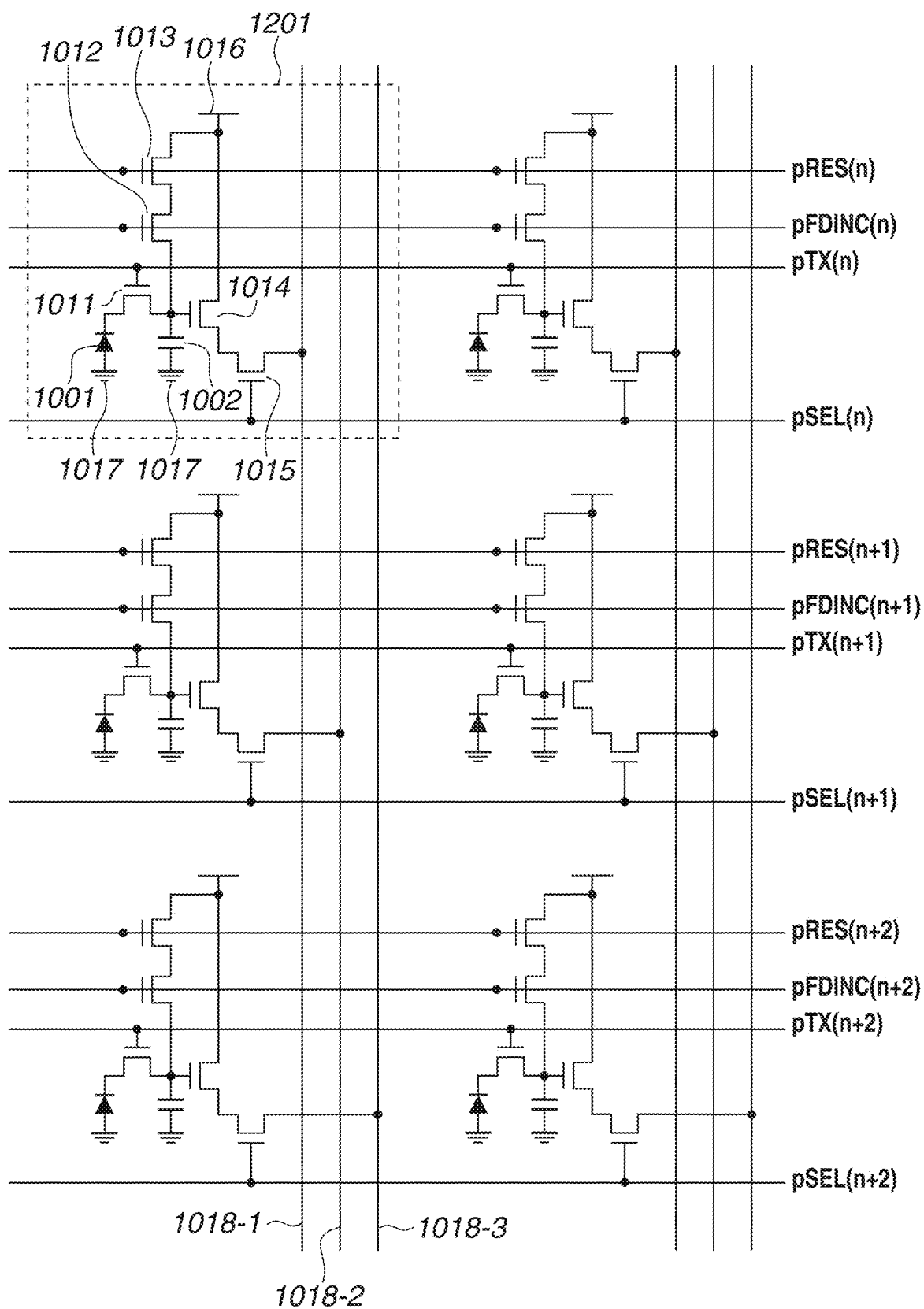
FIG. 22 is a schematic diagram illustrating a configuration of the semiconductor device.

FIG. 22 is an equivalent circuit diagram of pixels included in the imaging region 1102. While, in FIG. 22, a configuration composed of three rows by two columns are illustrated for simplicity, the number of pixels is not limited to this. Typically, tens of millions of pixels are arranged in the imaging region 1102. Moreover, while three output lines 1018-1, 1018-2, and 1018-3 are arranged with respect to one column, the number of output lines is not limited to this and many more output lines can be arranged.

Each unit pixel 1201 includes a photoelectric conversion portion 1001, a floating diffusion portion 1002, and a transfer portion 1011, which is provided between the photoelectric conversion portion 1001 and the floating diffusion portion 1002. Moreover, each unit pixel 1201 includes a capacity switching portion 1012, which is configured to switch the capacity of the floating diffusion portion 1002 as needed. Additionally, each unit pixel 1201 includes a reset portion 1013, which is configured to reset the floating diffusion portion 1002, an amplification portion 1014, which is configured to output a signal output from the floating diffusion portion 1002, and a row selection portion 1015, which is provided as needed.

The photoelectric conversion portion 1001 receives light incident on the unit pixel 1201 and generates electric charge corresponding to the amount of received light. The floating diffusion portion 1002 temporarily stores electric charge transferred from the photoelectric conversion portion 1001 and, at the same time, functions as an electric-charge to voltage conversion portion which converts the stored electric charge into a voltage signal.

The transfer portion 1011, which is driven by a signal pTX output from the vertical scanning circuit 1103, transfers electric charge generated by the photoelectric conversion portion 1001 to the floating diffusion portion 1002.

The capacity switching portion 1012, which is driven by a signal pFDINC, switches the capacity of the floating diffusion portion 1002. Bringing the capacity switching portion 1012 into an on-state enables adding the gate capacity portion of the capacity switching portion 1012 to the floating diffusion portion 1002. The signal pFDINC can be output from the vertical scanning circuit 1103 or can be output from the control unit 1104. In a case where the vertical scanning circuit 1103 outputs the signal pFDINC, the capacity switching portion 1012 can switch the capacity of the floating diffusion portion 1002 for each row of pixels. In a case where the control unit 1104 outputs the signal pFDINC, the capacity switching portion 1012 can switch the capacity of the floating diffusion portion 1002 collectively for the entirety of the imaging region 1102.

The reset portion 1013 is driven by a signal pRES output from the vertical scanning circuit 1103. At that time, bringing the reset portion 1013 and the capacity switching portion 1012 into an on-state at the same time enables resetting the floating diffusion portion 1002.

The amplification portion 1014 amplifies a voltage signal obtained by conversion performed by the floating diffusion portion 1002 and then outputs the amplified voltage signal as a pixel signal. The row selection portion 1015, which is driven by a row selection driving pulse pSEL, outputs the pixel signal output from the amplification portion 1014 to any of the output lines 1018-1, 1018-2, and 1018-3.

Figure 23:
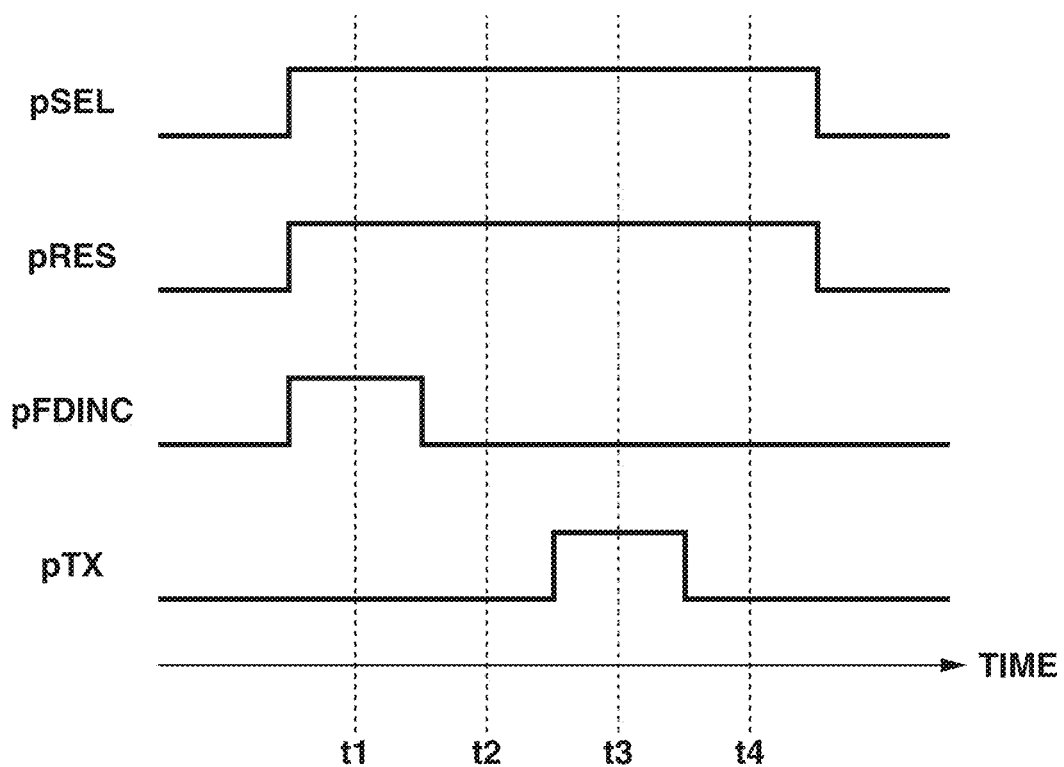
FIG. 23 is a schematic diagram illustrating an operation of the semiconductor device.

FIG. 23 is a timing chart obtained when a pixel signal obtained at the time of low luminance is output as an example. The horizontal axis indicates time and the vertical axis indicates a voltage, and the respective lines correspond to the driving pulses illustrated in FIG. 22.

At time t1, the vertical scanning circuit 1103 brings the capacity switching portion 1012, the reset portion 1013, and the row selection portion 1015 of a pixel in a predetermined row into an on-state. With this operation, the vertical scanning circuit 1103 selects a pixel and resets the floating diffusion portion 1002. In the following description, control of a pixel in a predetermined row which has been selected at that time is described.

At time t2, the vertical scanning circuit 1103 brings the capacity switching portion 1012 into an off-state. This enables making the capacity of the floating diffusion portion 1002 at the time of readout small and thus reducing noise. Moreover, at this time, the vertical scanning circuit 1103 outputs a signal which has been output to the output line **1018-*m* (m being any one of 1 to 3) to the output unit 1106 via the amplification portion 1014 as a reset level signal. Furthermore, the output line 1018-*m*, when indicating an output line in a comprehensive way, may be referred to simply as an "output line 1018**".

At time t3, the vertical scanning circuit 1103 brings the transfer portion 1011 into an on-state. With this operation, the vertical scanning circuit 1103 transfers electric charge accumulated in the photoelectric conversion portion 1001 to the floating diffusion portion 1002.

At time t4, the vertical scanning circuit 1103 brings the transfer portion 1011 into an off-state. The amplification portion 1014 outputs a signal (pixel signal) corresponding to the electric charge of the floating diffusion portion 1002 to the corresponding output line **1018-*m*. The pixel signal output to the output line 1018-*m* is subjected to processing, such as amplification, noise reduction, and AD conversion, by a corresponding column circuit. Then, the processed pixel signal is output from the column circuit in each column to the output unit 1106 by horizontal scanning performed by the horizontal scanning circuit 1105**.

Figure 24A:
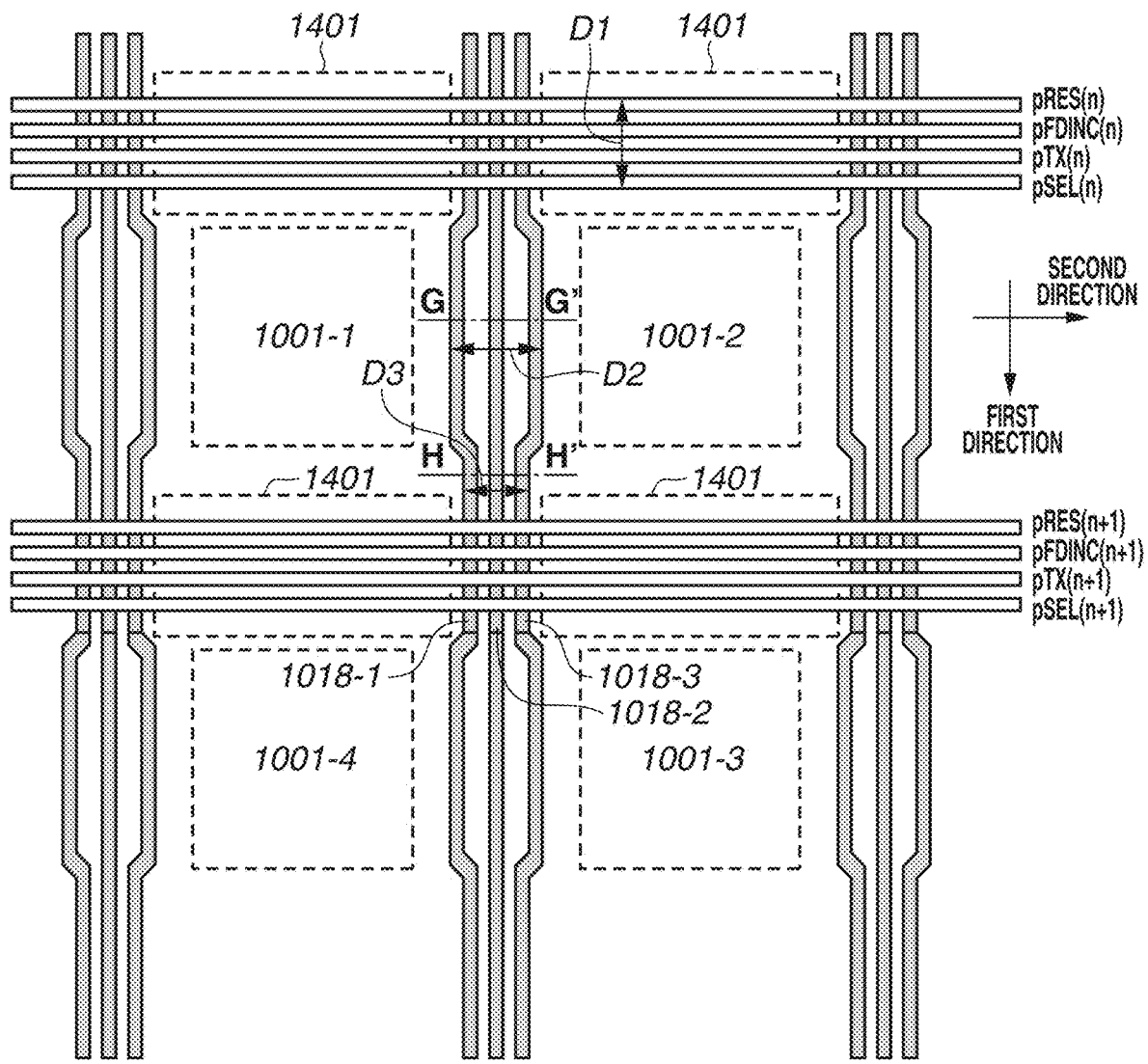
FIGS. 24A, 24B, and 24C are schematic diagrams illustrating a configuration of the semiconductor device.

FIG. 24A is a plan view of the unit pixel 1201 in the present exemplary embodiment. Elements which are the same as or correspond to the elements illustrated in FIG. 22 are assigned the respective same reference numerals. Moreover, while, in the plan view, each region is represented by a rectangle for simplicity, the rectangle does not express the shape of each portion but indicates that each portion is at least located at that region. In a pixel transistor region 1401, there are arranged, for example, a reset portion 1013, an amplification portion 1014, and a row selection portion 1015. FIG. 24A illustrates unit pixels 1201 arranged in two rows by two columns. Output lines 1018-1 to 1018-3 extend along a first direction. Out of a plurality of unit pixels, a first pixel includes a photoelectric conversion portion 1001-1. A second pixel, which is adjacent to the first pixel along a second direction different from the first direction, includes a photoelectric conversion portion 1001-2. Furthermore, in FIG. 24A, the first direction and the second direction are directions perpendicular to each other in plan view as viewed from the top of a semiconductor substrate. A third pixel, which is adjacent to the second pixel along the first direction, includes a photoelectric conversion portion 1001-3. Moreover, a fourth pixel, which is adjacent to the first pixel along the first direction, includes a photoelectric conversion portion 1001-4. The photoelectric conversion portion 1001-3 is adjacent to the photoelectric conversion portion 1001-4 along the second direction.

Figure 24B:
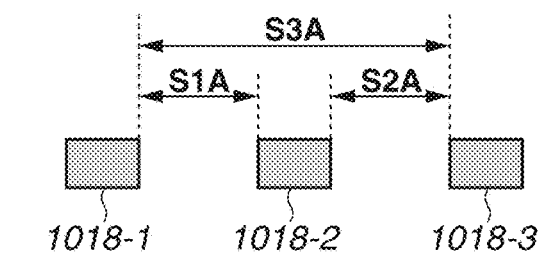
Figure 24C:
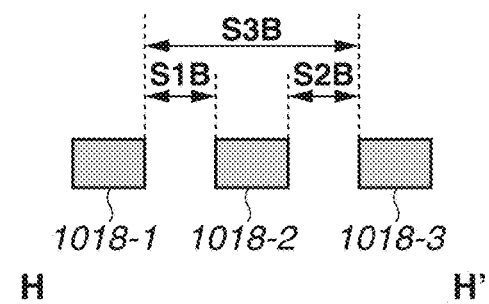

FIG. 24B is a sectional view taken along a line G-G', which is a second position, in FIG. 24A. Moreover, FIG. 24C is a sectional view taken along a line H-H', which is a first position, in FIG. 24A. The first position is located between the photoelectric conversion portion 1001-1 of the first pixel and the photoelectric conversion portion 1001-3 of the third pixel. The second position is located between the photoelectric conversion portion 1001-1 of the first pixel and the photoelectric conversion portion 1001-2 of the second pixel. Furthermore, for ease of explanation, wirings other than the output lines 1018 are omitted from illustration. The first output line 1018-1, the second output line 1018-2, and the third output line 1018-3 are configured into the same wiring layer. Here, a space between the first output line 1018-1 and the second output line 1018-2, as viewed in a G-G' cross section, is denoted by S1A, and a space between the second output line 1018-2 and the third output line 1018-3 is denoted by S2A. Moreover, a space between the first output line 1018-1 and the third output line 1018-3 is denoted by S3A. Moreover, a space between the first output line 1018-1 and the second output line 1018-2, as viewed in an H-H' cross section, is denoted by S1B, a space between the second output line 1018-2 and the third output line 1018-3 is denoted by S2B, and a space between the first output line 1018-1 and the third output line 1018-3 is denoted by S3B.

In the present exemplary embodiment, the wiring capacity of the second output line 1018-2, which is located at the center of the first output line 1018-1, the second output line 1018-2, and the third output line 1018-3, is reduced. In the present exemplary embodiment, with regard to a distance between the first output line 1018-1 and the second output line 1018-2 and a distance between the second output line 1018-2 and the third output line 1018-3, the respective directions in the second position are made larger than the respective directions in the first position. Specifically, the space S1A is made larger than the space S1B, the space S2A is made larger than the space S2B, and the space S3A is made larger than the space S3B. This reduces the parasitic capacity of the second output line 1018-2. This reduction in parasitic capacity enables accelerating the statically determinate state of electric potential of the output line 1018-2. Thus, it is possible to increase the readout speed of a pixel signal. Moreover, in the present exemplary embodiment, with respect to pixels in one row, there are provided four control lines used to respectively transfer the signal pRES, the signal pFDINC, the signal pTX, and the signal pSEL. A distance between one end of a control line group including the four control lines (the control line for the signal pRES) and the other end of the control line group (the control line for the signal pSEL) is a distance D1 as illustrated in FIG. 24A. On the other hand, as output lines used to output pixels signals with respect to pixels in one column, there are provided three output lines 1018-1 to 1018-3. A distance between one end of an output line group including the output lines 1018-1 to 1018-3 (the output line 1018-1) and the other end of the output line group (the output line 1018-3) is a distance D3 in between a plurality of transistor regions of adjacent unit pixels 1201. Moreover, a distance between one end of the output line group (the output line 1018-1) and the other end of the output line group (the output line 1018-3) is a distance D2, which is larger than the distance D3, in between a plurality of photoelectric conversion portions 1001 of adjacent unit pixels 1201. In terms of one row by one column, there are provided more control lines than output lines. Thus, if the distance between one end of the output line group and the other end thereof is set to the distance D3 even in between a plurality of photoelectric conversion portions 1001, a distance between unit pixels in between a plurality of rows tends to become larger than a distance between unit pixels in between a plurality of columns. With regard to the opening of the photoelectric conversion portion 1001 of one unit pixel 1201, the length thereof taken along a direction in which unit pixels in a plurality of rows are arranged side by side tends to become larger than the length thereof taken along a direction in which unit pixels in a plurality of columns are arranged side by side. On the other hand, in the present exemplary embodiment, a portion at which a space from each of the output lines 1018-1 and 1018-3 to the output line 1018-2 is broadened is provided in a region between a plurality of photoelectric conversion portions 1001. This enables, with regard to the opening of the photoelectric conversion portion 1001 of one unit pixel 1201, facilitating making uniform the length thereof taken along a direction in which unit pixels in a plurality of rows are arranged side by side and the length thereof taken along a direction in which unit pixels in a plurality of columns are arranged side by side. This enables making uniform the likelihood of crosstalk in between a plurality of rows of unit pixels 1201 and the likelihood of crosstalk in between a plurality of columns thereof. Here, consider a case where a plurality of unit pixels 1201 is provided with a color filter having a Bayer array. With respect to a unit pixel 1201 provided with a color filter through which light corresponding to the wavelength of green light is transmitted, a unit pixel 1201 located in an adjacent row thereto and a unit pixel 1201 located in an adjacent column thereto are set to be provided with respective color filters through which light corresponding to the wavelength of different color light is transmitted. Typically, a unit pixel 1201 provided with a color filter through which light corresponding to the wavelength of red light is transmitted and a unit pixel 1201 provided with a color filter through which light corresponding to the wavelength of blue light is transmitted are located in an adjacent row and in an adjacent column, respectively, or in an adjacent column and in an adjacent row, respectively. In this case, if the likelihood of crosstalk in between a plurality of rows of unit pixels 1201 and the likelihood of crosstalk in between a plurality of columns of unit pixels 1201 differ from each other, one of signals output from unit pixels 1201 for red color and blue color becomes likely to cause crosstalk with a unit pixel 1201 for green color. This causes an image coming close to a color different from the original color to be likely to be generated in images generated from pixel signals output from a photoelectric conversion device. Thus, a decrease in image quality may occur. On the other hand, in the present exemplary embodiment, since cross talk in between a plurality of rows and crosstalk in between a plurality of columns are made likely to be made uniform, crosstalk from a unit pixel 1201 for red color and crosstalk from a unit pixel 1201 for blue color become likely to be made uniform. This enables facilitating acquiring an image which expresses the original color of a subject.

Eleventh Exemplary Embodiment

Figure 25A:
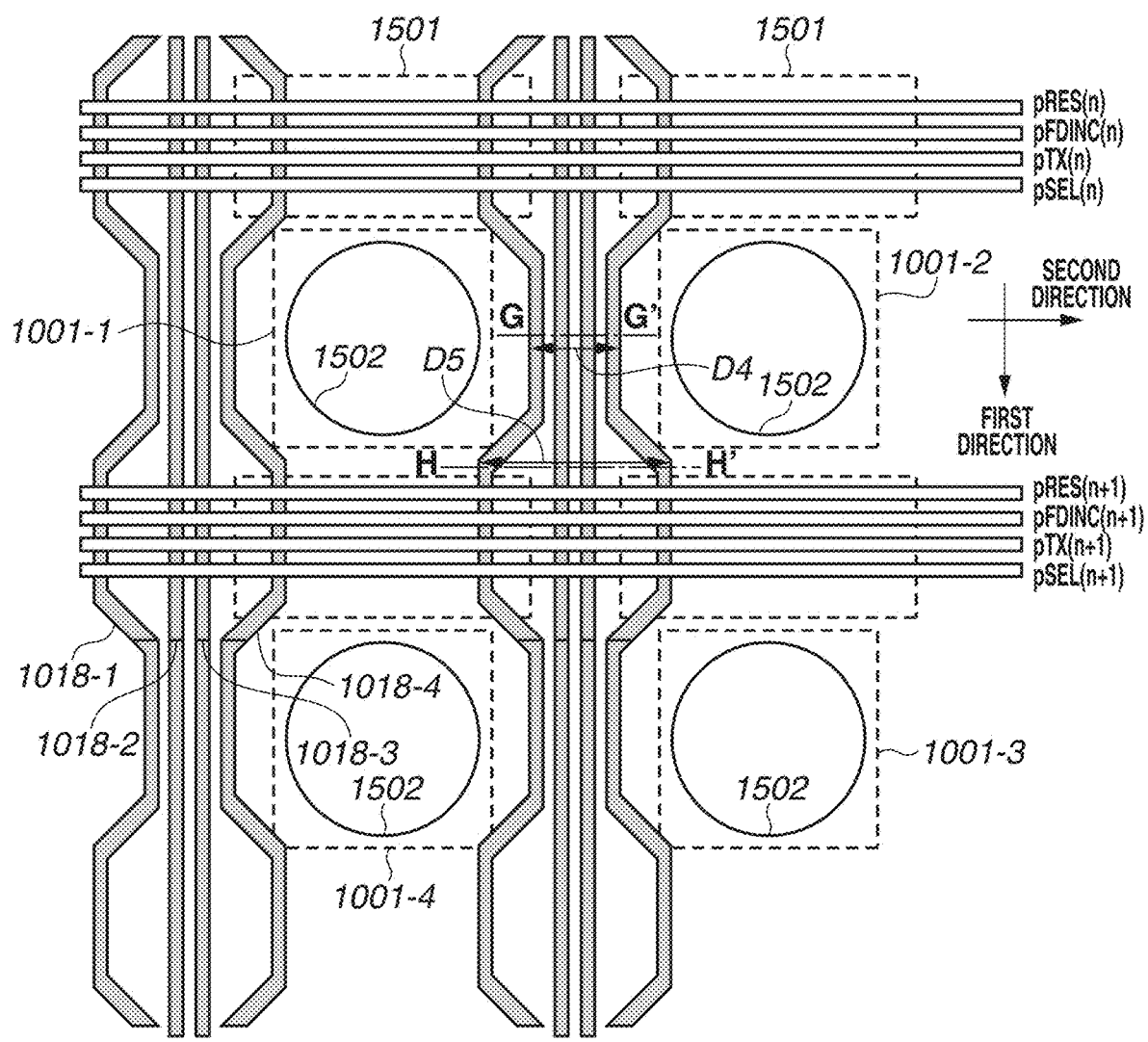
FIGS. 25A, 25B, and 25C are schematic diagrams illustrating a configuration of a semiconductor device.

FIG. 25A is a plan view of the unit pixel 1201 in the present exemplary embodiment. Elements which are the same as or correspond to the elements illustrated in FIG. 22 are assigned the respective same reference numerals. Moreover, while, in the plan view, each region is represented by a rectangle for simplicity, the rectangle does not express the shape of each portion but indicates that each portion is at least located at that region. In a pixel transistor region 1501, there are arranged, for example, a reset portion 1013, an amplification portion 1014, and a row selection portion 1015. Moreover, in an obverse surface irradiation type photoelectric conversion device, a waveguiding structure 1502 can increase pixel sensitivity by concentrating light onto the photoelectric conversion portion 1001. However, it is necessary to arrange the waveguiding structure 1502 in such a way as not to overlap any wiring.

Figure 25B:
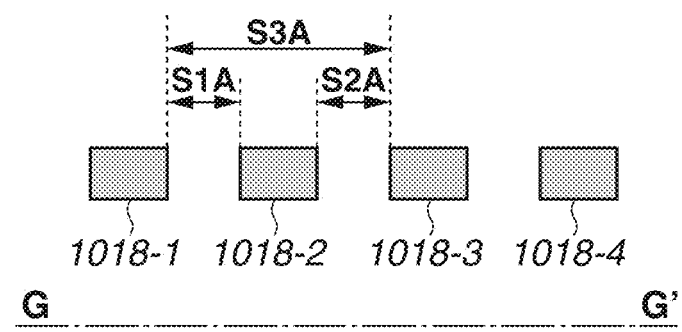
Figure 25C:
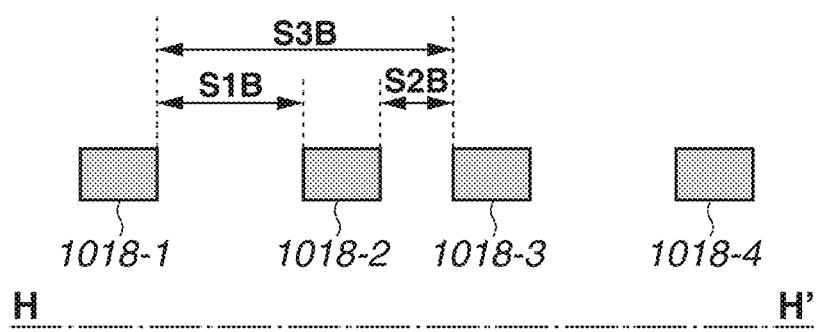

FIG. 25B is a sectional view taken along a line G-G' (a first position) in FIG. 25A. Moreover, FIG. 25C is a sectional view taken along a line H-H' (a second position) in FIG. 25A. In the first position, a distance from one end of the first output line 1018-1 to one end of the fourth output line 1018-4 is indicated by a distance D4. Moreover, in the second position, a distance from one end of the first output line 1018-1 to one end of the fourth output line 1018-4 is indicated by a distance D5. There is a relationship in which the distance D5 is larger than the distance D4. Furthermore, for ease of explanation, wirings other than the output lines 1018 are omitted from illustration. The first output line 1018-1, the second output line 1018-2, the third output line 1018-3, and the fourth output line 1018-4 are configured with the same wiring layer. Here, a space between the first output line 1018-1 and the second output line 1018-2, as viewed in a G-G' cross section, is denoted by S1A, and a space between the second output line 1018-2 and the third output line 1018-3 is denoted by S2A. Additionally, a space between the first output line 1018-1 and the third output line 1018-3 is denoted by S3A. Moreover, a space between the first output line 1018-1 and the second output line 1018-2, as viewed in an H-H' cross section, is denoted by S1B, a space between the second output line 1018-2 and the third output line 1018-3 is denoted by S2B, and a space between the first output line 1018-1 and the third output line 1018-3 is denoted by S3B.

In the present exemplary embodiment, the wiring capacity of the second output line 1018-2 out of the first output line 1018-1, the second output line 1018-2, the third output line 1018-3, and the fourth output line 1018-4, is reduced. Specifically, the space S1B is made larger than the space S1A, and the space S3B is made larger than the space S3A. Moreover, the wiring capacity of the third output line 1018-3 can also be reduced by a method similar to that for the second output line 1018-2. This reduces the parasitic capacity of each of the second output line 1018-2 and the third output line 1018-3, which are located in the center. This reduction in parasitic capacity enables accelerating the statically determinate state of each of a reset level signal and a pixel signal. Thus, it is possible to increase the readout speed of a pixel signal. Moreover, it is possible to prevent or reduce a decrease in diameter of the waveguiding structure 1502 caused by the output lines 1018-1 to 1018-3. This enables preventing or reducing a reduction in sensitivity of the photoelectric conversion portion 1001.

Twelfth Exemplary Embodiment

Figure 26A:
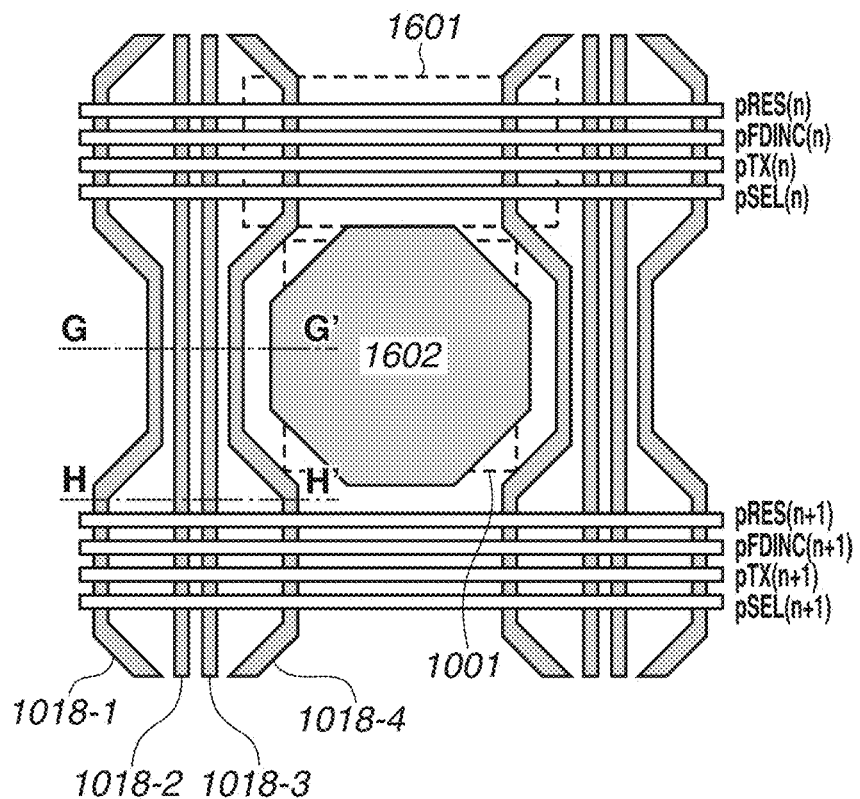
FIGS. 26A, 26B, and 26C are schematic diagrams illustrating a configuration of a semiconductor device.

FIG. 26A is a plan view of the unit pixel 1201 in the present exemplary embodiment. Elements which are the same as or correspond to the elements illustrated in FIG. 22 are assigned the respective same reference numerals. Moreover, while, in the plan view, each region is represented by a rectangle for simplicity, the rectangle does not express the shape of each portion but indicates that each portion is at least located at that region. In a pixel transistor region 1601, there are arranged, for example, a reset portion 1013, an amplification portion 1014, and a row selection portion 1015. Moreover, in a reverse surface irradiation type photoelectric conversion device, a shield wiring 1602 can increase pixel sensitivity by reflecting light having passed through a silicon substrate toward the photoelectric conversion portion 1001. Thus, a microlens is configured to be provided above a first surface, serving as a light incidence surface, of a semiconductor substrate provided with the photoelectric conversion portion 1001, and a wiring layer including the shield wiring 1602 is configured to be provided above a second surface facing the first surface. The shield wiring 1602 is a metallic film made from metal (including an alloy).

Figure 26B:
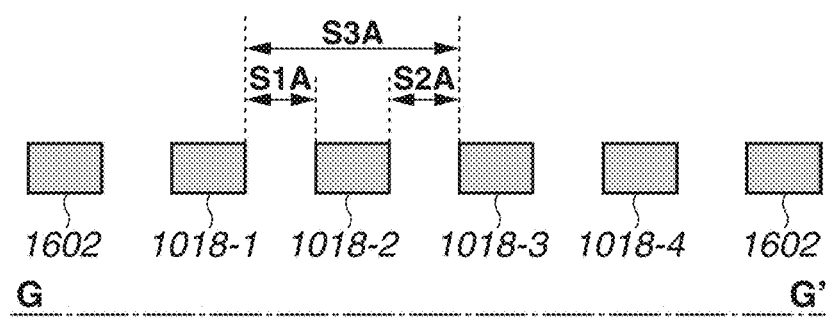
Figure 26C:
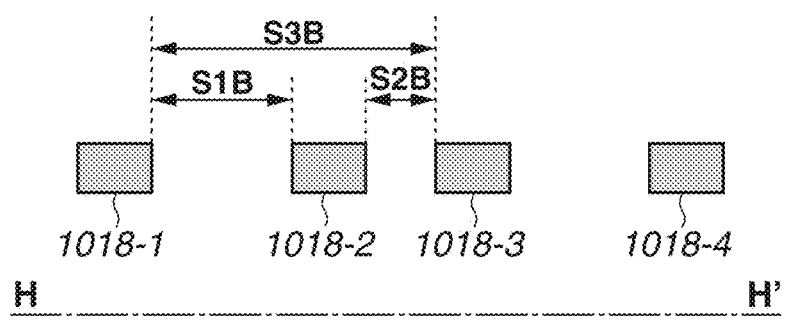

FIG. 26B is a sectional view taken along a line G-G', which is a first position, in FIG. 26A. Moreover, FIG. 26C is a sectional view taken along a line H-H', which is a second position, in FIG. 26A. In the present exemplary embodiment, the first position is located in a region between a photoelectric conversion portion 1001-1 of a first pixel and a photoelectric conversion portion 1001-2 of a second pixel. The second position is located in a region between the photoelectric conversion portion 1001-1 of the first pixel and a photoelectric conversion portion 1001-3 of a third pixel. Furthermore, for ease of explanation, wirings other than the shield wiring 1602 are omitted from illustration. The first output line 1018-1, the second output line 1018-2, the third output line 1018-3, and the fourth output line 1018-4 are configured with the same wiring layer. Here, a space between the first output line 1018-1 and the second output line 1018-2, as viewed in a G-G' cross section, is denoted by S1A, a space between the second output line 1018-2 and the third output line 1018-3 is denoted by S2A, and a space between the first output line 1018-1 and the third output line 1018-3 is denoted by S3A. Moreover, a space between the first output line 1018-1 and the second output line 1018-2, as viewed in an H-H' cross section, is denoted by S1B, a space between the second output line 1018-2 and the third output line 1018-3 is denoted by S2B, and a space between the first output line 1018-1 and the third output line 1018-3 is denoted by S3B.

In the present exemplary embodiment, the wiring capacity of the second output line 1018-2 out of the first output line 1018-1, the second output line 1018-2, the third output line 1018-3, and the fourth output line 1018-4, is reduced. In the present exemplary embodiment, with regard to a distance between the first output line 1018-1 and the second output line 1018-2 and a distance between the second output line 1018-2 and the third output line 1018-3, the respective directions in the second position are made larger than the respective directions in the first position. Specifically, the space S1B is made larger than the space S1A and the space S3B is made larger than the space S3A. Moreover, the wiring capacity of the third output line 1018-3 can also be reduced by a method similar to that for the second output line 1018-2. This reduces the parasitic capacity of each of the second output line 1018-2 and the third output line 1018-3, which are located in the center. Thus, it is possible to accelerate the statically determinate state of each of a reset level signal and a pixel signal, and it is thus possible to increase the readout speed of a pixel signal.

Thirteenth Exemplary Embodiment

Figure 27A:
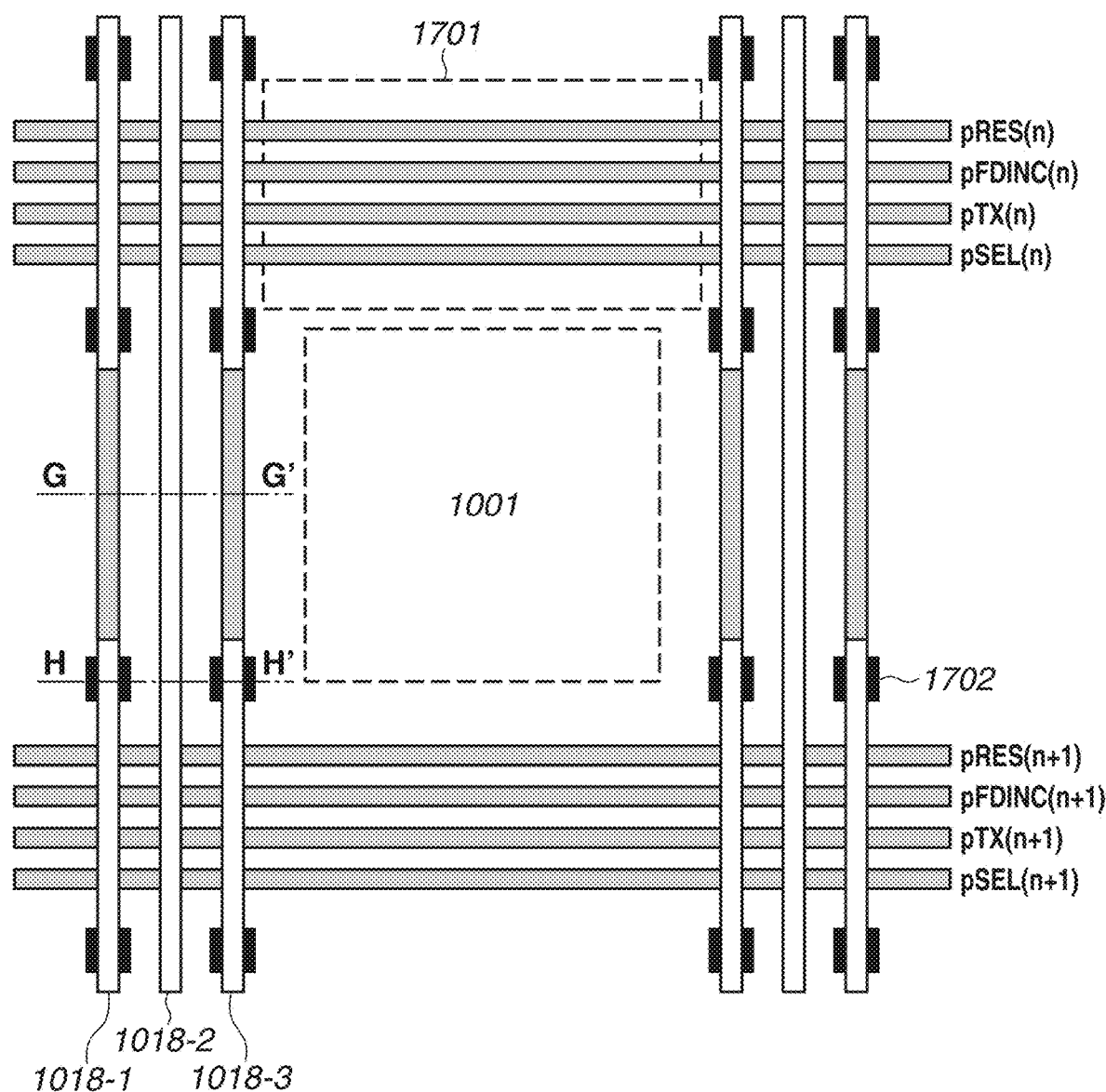
FIGS. 27A, 27B, and 27C are schematic diagrams illustrating a configuration of a semiconductor device.

FIG. 27A is a plan view of the unit pixel 1201 in the present exemplary embodiment. Elements which are the same as or correspond to the elements illustrated in FIG. 22 are assigned the respective same reference numerals. Moreover, while, in the plan view, each region is represented by a rectangle for simplicity, the rectangle does not express the shape of each portion but indicates that each portion is at least located at that region. In a pixel transistor region 1701, there are arranged, for example, a reset portion 1013, an amplification portion 1014, and a row selection portion 1015.

Figure 27B:
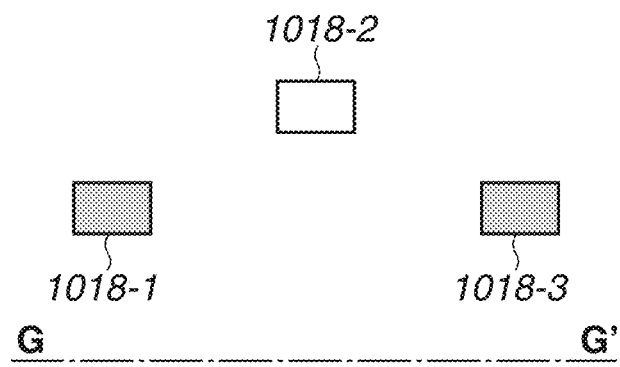
Figure 27C:
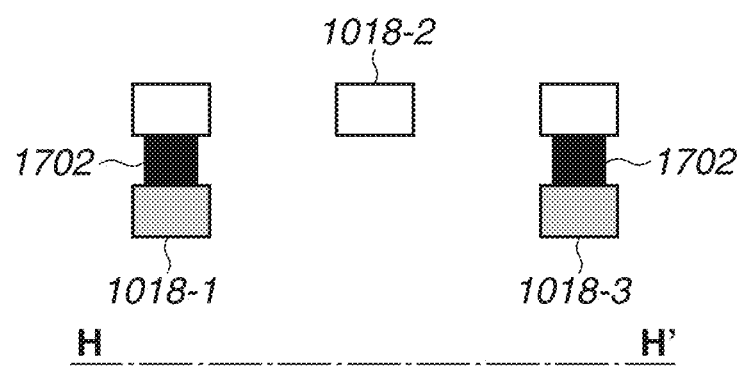

FIG. 27B is a sectional view taken along a line G-G' in FIG. 27A. Moreover, FIG. 27C is a sectional view taken along a line H-H' in FIG. 27A. Furthermore, for ease of explanation, wirings other than the output lines 1018 are omitted from illustration. In a G-G' cross section, the first output line 1018-1 and the third output line 1018-3 are configured with the same wiring layer, but are configured with a wiring layer different from that of the second output line 1018-2. In an H-H' cross section, the first output line 1018-1 and the third output line 1018-3 are switched into the same wiring layer as that of the second output line 1018-2 via connection portions 1702.

In the present exemplary embodiment, the wiring capacity of the second output line 1018-2, which is located in the center out of the first output line 1018-1, the second output line 1018-2, and the third output line 1018-3, is reduced. Specifically, wiring layers for the first output line 1018-1 and the third output line 1018-3, which are located at the outer sides, are switched. This enables reducing the parasitic capacity of the second output line 1018-2 and accelerating the statically determinate state of each of a reset signal and a pixel signal. This thus enables increasing the readout speed of a pixel signal.

Fourteenth Exemplary Embodiment

Figure 28A:
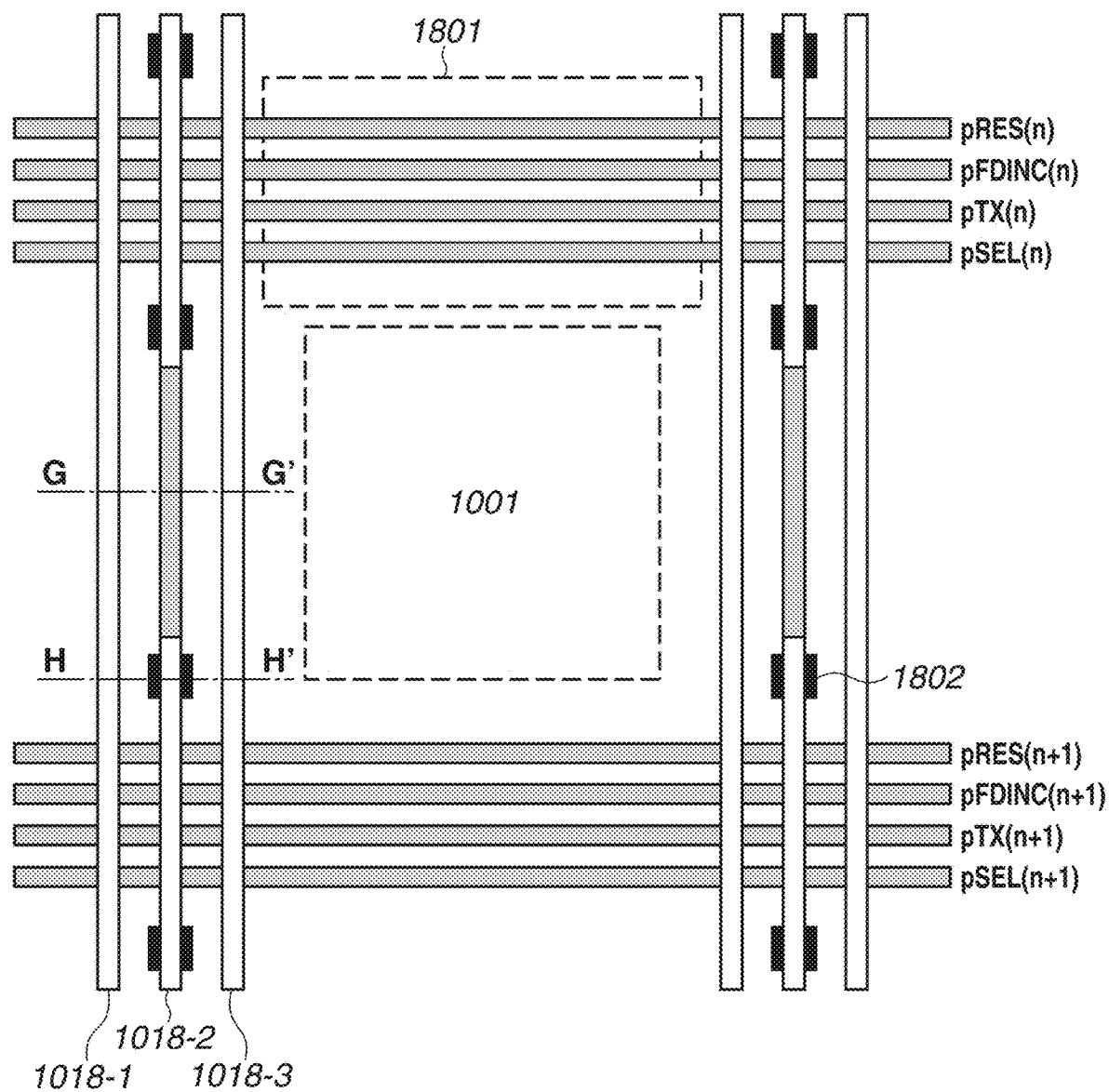
FIGS. 28A, 28B, and 28C are schematic diagrams illustrating a configuration of a semiconductor device.

FIG. 28A is a plan view of the unit pixel 1201 in the present exemplary embodiment. Elements which are the same as or correspond to the elements illustrated in FIG. 22 are assigned the respective same reference numerals. Moreover, while, in the plan view, each region is represented by a rectangle for simplicity, the rectangle does not express the shape of each portion but indicates that each portion is at least located at that region. In a pixel transistor region 1801, there are arranged, for example, a reset portion 1013, an amplification portion 1014, and a row selection portion 1015.

Figure 28B:
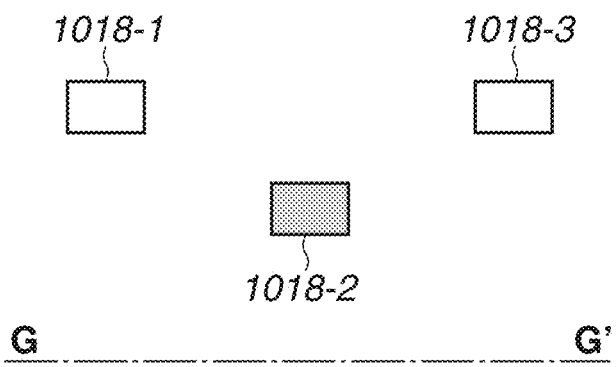
Figure 28C:
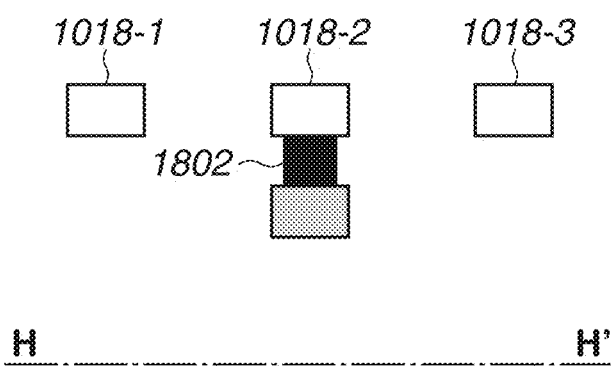

FIG. 28B is a sectional view taken along a line G-G' in FIG. 28A. Moreover, FIG. 28C is a sectional view taken along a line H-H' in FIG. 28A. Furthermore, for ease of explanation, wirings other than the output lines 1018 are omitted from illustration. In a G-G' cross section, the first output line 1018-1 and the third output line 1018-3 are arranged in the same wiring layer, but are arranged in a wiring layer different from that of the second output line 1018-2. In an H-H' cross section, the second output line 1018-2 is switched into the same wiring layer as that of the first output line 1018-1 and the third output line 1018-3 via a connection portion 1802.

In the present exemplary embodiment, to reduce the wiring capacity of the second output line 1018-2, which is located in the center out of the first output line 1018-1, the second output line 1018-2, and the third output line 1018-3, wiring layers for the second output line 1018-2, which is located in the center, are switched. This enables reducing the parasitic capacity of the second output line 1018-2 and accelerating the statically determinate state of each of a reset signal and a pixel signal. This thus enables increasing the readout speed of a pixel signal.

The semiconductor device in each of the above-described tenth to fourteenth exemplary embodiments can be applied to the semiconductor device APR illustrated in FIG. 20A. Moreover, each of the above-described semiconductor devices can also be applied to the semiconductor device 930 illustrated in FIG. 20B.

The present invention is not limited to the above-described exemplary embodiments, but can be modified in various manners. For example, an example in which a partial configuration of any exemplary embodiment is added to another exemplary embodiment or an example in which a partial configuration of any exemplary embodiment is replaced by a partial configuration of another exemplary embodiment is also an exemplary embodiment of the present invention. Furthermore, the contents of disclosure in the present specification include not only contents described in the present specification but also all of the items which are understandable from the present specification and the drawings accompanying the present specification. Moreover, the contents of disclosure in the present specification include a complementary set of concepts described in the present specification. Thus, if, in the present specification, there is a description indicating that, for example, "A is B", even when a description indicating that "A is not B" is omitted, the present specification can be said to disclose a description indicating that "A is not B". This is because, in a case where there is a description indicating that "A is B", taking into consideration a case where "A is not B" is a premise.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2020-028143 filed Feb. 21, 2020, No. 2020-060985 filed Mar. 30, 2020, and No. 2020-214010 filed Dec. 23, 2020, which are hereby incorporated by reference herein in their entirety.

What is claimed is:
1. A semiconductor device comprising:
a plurality of unit pixels that is arranged in a plurality of rows and a plurality of columns and each of which includes a photoelectric conversion portion; and a plurality of output lines that is connected to the unit pixels in one column and transfers outputs of the unit pixels, wherein the plurality of output lines includes at least a first output line, a second output line having a portion adjacent to the first output line, and a third output line having a portion adjacent to the second output line, wherein each of the first output line, the second output line, and the third output line includes a portion which extends along a first direction, wherein the first output line, the second output line, and the third output line pass through a first position and a second position different from the first position, and wherein each of at least two of a distance between the first output line and the second output line, a distance between the second output line and the third output line, and a distance between the first output line and the third output line is longer in the second position than in the first position.

2. The semiconductor device according to claim 1, wherein each of the plurality of output lines has a damascene structure on a semiconductor layer, wherein the plurality of output lines includes a first output line and a second output line adjacent to each other, wherein a distance between a first end and a second end of the first output line is larger than 33 mm, wherein the first output line includes, along a direction in which the first output line extends, a first portion, a second portion, and a third portion located between the first portion and the second portion, wherein each of a width of the first portion and a width of the second portion is smaller than 180 nm, and wherein a width of the third portion is larger than each of the width of the first portion and the width of the second portion.

3. The semiconductor device according to claim 2, wherein each of a difference between the width of the third portion and the width of the first portion and a difference between the width of the third portion and the width of the second portion is larger than 50 nm.

4. The semiconductor device according to claim 2, wherein a difference between the width of the third portion and the width of the first portion is smaller than the width of the first portion, and a difference between the width of the third portion and the width of the second portion is smaller than the width of the second portion.

5. The semiconductor device according to claim 2, wherein the width of the third portion is larger than 110 nm.

6. The semiconductor device according to claim 2, wherein a distance between the third portion and the second output line is larger than each of the width of the first portion and the width of the second portion.

7. The semiconductor device according to claim 2, wherein each of a distance between the first portion and the second output line and a distance between the second portion and the second output line is smaller than the width of the third portion.

8. The semiconductor device according to claim 2, wherein a length of the second portion along the direction is larger than each of the width of the first portion and the width of the second portion.

9. The semiconductor device according to claim 2, wherein the first portion is located between the first end and the third portion along the direction, wherein the second portion is located between the second end and the third portion along the direction, wherein the first wiring includes, along the direction, a fourth portion located between the first end and the first portion, a fifth portion located between the fourth portion and the first portion, a sixth portion located between the second end and the second portion, and a seventh portion located between the sixth portion and the second portion, and wherein each of a width of the fifth portion and a width of the seventh portion is larger than each of the width of the first portion, the width of the second portion, a width of the fourth portion, and a width of the sixth portion.

10. The semiconductor device according to claim 2, wherein the semiconductor layer includes a plurality of photoelectric conversion portions.

11. The semiconductor device according to claim 1, wherein each of the plurality of output lines has a damascene structure on a semiconductor layer, wherein the plurality of output lines includes a first output line and a second output line adjacent to each other, wherein the first output line includes, along a direction in which the first output line extends, a first portion, a second portion, and a third portion located between the first portion and the second portion, wherein a distance between an end of the first portion opposite the side having the third portion and an end of the second portion opposite the side having the third portion is larger than 33 mm, and wherein a width of the third portion is a maximum width of the first output line in a range from the first portion to the second portion and is smaller than 180 nm.

12. The semiconductor device according to claim 11, wherein each of a difference between the width of the third portion and the width of the first portion and a difference between the width of the third portion and a width of the second portion is larger than 50 nm.

13. The semiconductor device according to claim 11, wherein a difference between the width of the third portion and the width of the first portion is smaller than the width of the first portion, and a difference between the width of the third portion and a width of the second portion is smaller than the width of the second portion.

14. The semiconductor device according to claim 11, wherein the width of the third portion is larger than 110 nm.

15. The semiconductor device according to claim 11, wherein a distance between the third portion and the second output line is larger than each of the width of the first portion and a width of the second portion.

16. The semiconductor device according to claim 11, wherein each of a distance between the first portion and the second output line and a distance between the second portion and the second output line is smaller than the width of the third portion.

17. The semiconductor device according to claim 11, wherein a length of the second portion along the direction is larger than each of the width of the first portion and a width of the second portion.

18. The semiconductor device according to claim 11, wherein the first portion is located between a first end of the first wiring and the third portion along the direction, wherein the second portion is located between a second end of the first wiring and the third portion along the direction, wherein the first wiring includes, along the direction, a fourth portion located between the first end and the first portion, a fifth portion located between the fourth portion and the first portion, a sixth portion located between the second end and the second portion, and a seventh portion located between the sixth portion and the second portion, and wherein each of a width of the fifth portion and a width of the seventh portion is larger than each of the width of the first portion, a width of the second portion, a width of the fourth portion, and a width of the sixth portion.

19. The semiconductor device according to claim 11, wherein the semiconductor layer includes a plurality of photoelectric conversion portions.

20. The semiconductor device according to claim 1,
wherein the plurality of unit pixels includes a first pixel and a second pixel which are adjacent to each other in a direction different from the first direction, and a third pixel that is adjacent to the second pixel in the first direction,
wherein the first position is a position between respective photoelectric conversions of the first pixel and the second pixel, and
wherein the second position is a position between respective photoelectric conversions of the first pixel and the third pixel.

21. The semiconductor device according to claim 1,
wherein the plurality of unit pixels includes a first pixel and a second pixel which are adjacent to each other in a direction different from the first direction, and a third pixel that is adjacent to the second pixel in the first direction,
wherein the first position is a position between respective photoelectric conversions of the first pixel and the third pixel, and
wherein the second position is a position between respective photoelectric conversions of the first pixel and the second pixel.

22. The semiconductor device according to claim 1,
wherein the plurality of unit pixels is provided on a semiconductor substrate and a wiring layer is provided above a second surface facing a first surface of the semiconductor substrate on which light is incident, and
wherein the wiring layer includes a metallic film at a position overlapping with each of the photoelectric conversions in plan view.

23. The semiconductor device according to claim 1, wherein a number of wiring layers in which the first output line extends is larger than a number of wiring layers in which the second output line extends.

24. The semiconductor device according to claim 1, wherein a number of wiring layers in which the second output line extends is larger than a number of wiring layers in which the first output line extends.

25. A semiconductor device comprising a plurality of wirings each having a damascene structure on a semiconductor layer,
wherein the plurality of wirings includes a first wiring and a second wiring adjacent to each other,
wherein a distance between a first end and a second end of the first wiring is larger than 33 mm,
wherein the first wiring includes, along a direction in which the first wiring extends, a first portion, a second portion, and a third portion located between the first portion and the second portion,
wherein each of a width of the first portion and a width of the second portion is smaller than 180 nm, and
wherein a width of the third portion is larger than each of the width of the first portion and the width of the second portion,
wherein the first portion is located between the first end and the third portion along the direction,
wherein the second portion is located between the second end and the third portion along the direction,
wherein the first wiring includes, along the direction, a fourth portion located between the first end and the first portion, a fifth portion located between the fourth portion and the first portion, a sixth portion located between the second end and the second portion, and a seventh portion located between the sixth portion and the second portion, and
wherein each of a width of the fifth portion and a width of the seventh portion is larger than each of the width of the first portion, the width of the second portion, a width of the fourth portion, and a width of the sixth portion.

26. A semiconductor device comprising a plurality of wirings each having a damascene structure on a semiconductor layer,
wherein the plurality of wirings includes a first wiring and a second wiring adjacent to each other,
wherein the first wiring includes, along a direction in which the first wiring extends, a first portion, a second portion, and a third portion located between the first portion and the second portion,
wherein a distance between an end of the first portion opposite the side having the third portion and an end of the second portion opposite the side having the third portion is larger than 33 mm,
wherein a width of the third portion is a maximum width of the first wiring in a range from the first portion to the second portion and is smaller than 180 nm,
wherein the first portion is located between a first end of the first wiring and the third portion along the direction,
wherein the second portion is located between a second end of the first wiring and the third portion along the direction,
wherein the first wiring includes, along the direction, a fourth portion located between the first end and the first portion, a fifth portion located between the fourth portion and the first portion, a sixth portion located between the second end and the second portion, and a seventh portion located between the sixth portion and the second portion, and
wherein each of a width of the fifth portion and a width of the seventh portion is larger than each of the width of the first portion, a width of the second portion, a width of the fourth portion, and a width of the sixth portion.

* * * * *